United States Patent
Sakashita et al.

(10) Patent No.: US 7,855,134 B2
(45) Date of Patent: Dec. 21, 2010

(54) SEMICONDUCTOR DEVICE AND MANUFACTURING METHOD OF THE SAME

(75) Inventors: Shinsuke Sakashita, Tokyo (JP); Takaaki Kawahara, Tokyo (JP); Jiro Yugami, Tokyo (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 12/354,434

(22) Filed: Jan. 15, 2009

(65) Prior Publication Data
US 2009/0218634 A1 Sep. 3, 2009

(30) Foreign Application Priority Data

Feb. 28, 2008 (JP) .............................. 2008-047462
Mar. 31, 2008 (JP) .............................. 2008-093306
Oct. 24, 2008 (JP) .............................. 2008-273763

(51) Int. Cl.
*H01L 21/3205* (2006.01)
*H01L 21/4763* (2006.01)

(52) U.S. Cl. ........................ 438/592; 438/176; 438/294; 257/407; 257/E21.195

(58) Field of Classification Search ........................ None
See application file for complete search history.

(56) References Cited

U.S. PATENT DOCUMENTS

| 7,265,428 | B2 | 9/2007 | Aoyama | |
|---|---|---|---|---|
| 2007/0105317 | A1* | 5/2007 | Nakajima | .................... 438/264 |
| 2007/0126062 | A1* | 6/2007 | Akiyama et al. | ............. 257/369 |
| 2007/0178634 | A1* | 8/2007 | Jung et al. | ................... 438/199 |

(Continued)

FOREIGN PATENT DOCUMENTS

JP 2005-294799 10/2005

(Continued)

OTHER PUBLICATIONS

Inoue, M., et al., "Fluorine Incorporation into HfSiON Dielectric for $V_{th}$ Control and its Impact on Reliability for Poly-Si Gate pFET", International Electron Devices Meeting Technical Digest, 2005, pp. 425-428, Washington DC, USA.

(Continued)

*Primary Examiner*—Jarrett J Stark
(74) *Attorney, Agent, or Firm*—McDermott Will & Emery LLP

(57) ABSTRACT

Provided is a highly reliable semiconductor device equipped with a plurality of semiconductor elements having desired properties, respectively; and a manufacturing method facilitating the manufacture of the semiconductor device. The semiconductor device is manufactured by forming a gate-electrode metal film having a thickness of from 3 to 30 nm over the entire upper surface of a gate insulating film; forming an n-side cap layer having a thickness of 10 nm or less over the entire upper surface of a portion of the gate-electrode metal film belonging to an nFET region by using a material different from that of the gate-electrode metal film; and carrying out heat treatment over the n-side cap layer to diffuse the material of the n-side cap layer into the gate-electrode metal film immediately below the n-side cap layer and react them to form an n-side gate-electrode metal film in a nFET region. A poly-Si layer is then deposited, followed by gate electrode processing.

20 Claims, 29 Drawing Sheets

U.S. PATENT DOCUMENTS

2007/0210351 A1 9/2007 Tsuchiya et al.
2008/0157205 A1* 7/2008 Sung et al. .................. 257/365
2008/0274598 A1* 11/2008 Ramin et al. ................ 438/231

FOREIGN PATENT DOCUMENTS

| JP | 2007-141889 | 6/2007 |
| JP | 2007-142153 | 6/2007 |
| JP | 2007-242894 | 9/2007 |

OTHER PUBLICATIONS

Hayashi, T., et al., "Cost Worthy and High Performance LSTP CMIS; Poly-Si/HfSiON nMIS and PolySi/TiN/HfSiON pMIS", International Electron Devices Meeting Technical Digest, 2006, pp. 247-250, San Francisco CA, USA.

Narayanan, V., et al., "Band-Edge High-Performance High /Metal Gate n-MOSFETs using Cap Layers Containing Group IIA and IIIB Elements with Gate-First Processing for 45 nm and Beyond", Symposium on VLSI Technology Digest of Technical Papers, 2006, pp. 224-225.

* cited by examiner

SEMICONDUCTOR DEVICE AND MANUFACTURING METHOD OF THE SAME

CROSS-REFERENCE TO RELATED APPLICATIONS

The disclosures of Japanese Patent Applications No. 2008-93306 filed on Mar. 31, 2008, No. 2008-47462 filed on Feb. 28, 2008, and No. 2008-273763 filed on Oct. 24, 2008 including the specification drawings and abstract are incorporated herein by reference in its entirety.

BACKGROUND OF THE INVENTION

The present invention relates to a semiconductor device and a manufacturing method thereof, more specifically, a semiconductor device having a plurality of gate electrode structures and a manufacturing method thereof.

In CMOS devices after 45-nm node ones, replacement of a structure having poly-Si as a gate electrode and SiON as a gate insulating film with a gate stack structure having a high-dielectric-constant insulating film (which will hereinafter be called "high-k film") as the gate insulating film has been started. This replacement occurs because compared with a $SiO_2$ film or the like, a high-k film functions as a thin film during electric operations, though it is physically thick, in other words, it has a small effective thickness so that it can contribute to the control of a gate leakage current.

In such a poly-Si/high-k film structure, however, a fermi level pinning phenomenon causes an increase in threshold voltage (Vth) at the time of device operation. This problem is particularly prominent in the threshold voltage of pMOSFET.

Injection of fluorine (F) ion into a Si substrate prior to the formation of a gate insulating film is proposed as a measure for reducing the threshold voltage (Vth) of pMOSFET (refer to M. Inoue, et al., *IDEM Tech. Dig.*, p. 425 (2005)). Injection of a large amount of F ion into the Si substrate is however necessary in order to achieve desired device characteristics. Injection of a large amount of F ion into the Si substrate deteriorates device characteristics because of damage caused by injection.

As another measure for reducing the threshold voltage (Vth) of nMOSFET, injection of nitrogen ($N_2$) ion into the Si substrate prior to the formation of the gate insulating film is proposed. Injection of a large amount of $N_2$ ion into the Si substrate also deteriorates device characteristics because of damage caused by injection.

Since a work function has a direct relation to the threshold voltage (Vth) of FET, use of a metal material having a desired work function for a gate electrode is proposed as a measure for reducing the threshold voltage (Vth). A first advantage of using a metal material for the bottom layer of the gate electrode resides in that since a metal gate electrode, different from a poly-Si gate electrode, does not generate a depletion layer, an increase in the effective thickness of a gate insulating film at the time of device operation due to depletion does not occur, making it possible to realize a high-performance device. A second advantage resides in that difficulty in controlling a threshold voltage due to fermi level pinning can be avoided.

In CMOS devices, use of a metal material having a work function suited for each of pMOSFET and nMOSFET is preferred so that Japanese Patent Laid-Open Nos. 2007-242894, 2007-141889, and 2005-294799 each proposes a method of controlling the material and crystal phase between n/p-MOS in a fully-silicided gate electrode using a Si film as the bottom layer of the gate electrode. Japanese Patent Laid-Open No. 2007-142153 proposes a method of controlling, in a metal gate of n/p-MOS, nitrogen diffusion between a metal film/metal nitride film using metal materials of the same kind, thereby controlling the work function of a metal gate electrode. These proposals however have a problem because they complicate the production flow and make the production process difficult.

In order to avoid such problems, development of a hybrid metal gate CMOS device equipped with pMOSFET having a poly-Si/metal/high-k structure and nMOSFET having a poly-Si/high-k structure is promoted (refer to T. Hayashi, et al., *IDEM Tech. Dig.*, p. 247 (2006)).

Further, formation of respective gate electrodes suited for pMOSFET and nMOSFET complicates the production process so that a method of capping a gate insulating film to form two kinds of gate insulating films is under investigation (refer to, for example, V. Narayanan et al. *VLSI Tech. Symp.*, p. 224 (2006).

SUMMARY OF THE INVENTION

As described above, in order to operate a CMOS device at a desired threshold voltage (Vth), it is preferred to use, as a gate electrode material, metal materials having respective work functions suited for pMOSFET and nMOSFET configuring the CMOS device. Formation of pMOSFET and nMOSFET by using at least two materials utterly different from each other in physical properties, respectively, is however presumed to complicate the production flow. Even if materials of the same kind are used as described in Japanese Patent Laid-Open Nos. 2007-242894, 2007-141889, 2005-294799, and 2007-142153, the production process also becomes difficult inevitably. Moreover, when different metal materials are used for pMOSFET and nMOSFET, respectively, gate electrodes obtained by simultaneous etching or the like of different materials on one chip (wafer) cannot easily have a satisfactory gate shape. There is therefore a danger of not obtaining desired device characteristics.

On the other hand, when a hybrid metal gate structure as described in T. Hayashi et al., *IDEM Tech. Dig.*, p. 247 (2006) is employed, a control range of a threshold voltage becomes narrow and an effective thickness of the gate insulating film increases because the nMOSFET has a poly-Si/high-k structure. This may lead to failure in obtaining desired device characteristics and become a problem to be overcome. In addition, the formation method of a hybrid metal gate electrode as described in this document needs, after deposition of a desired metal material over a channel region on one side, removal of a metal layer over a channel region on the other side by wet etching or the like. The etching step of this metal layer is performed immediately above the gate insulating film so that it may damage the gate insulating film. There is therefore a danger of reducing the reliability of the device.

In the method of capping the gate insulating film as described in V. Narayanan et. al, *VLSI Tech. Symp.*, p. 224 (2006), formation and removal steps of a capping layer are repeated on the gate insulating film so that there is a danger of deterioration in the gate insulating film and reduction in the reliability of the resulting device.

An object of the present invention is to provide a semiconductor device such as CMOS device which is equipped with a plurality of semiconductor elements having desired properties, respectively and at the same time, is highly reliable; and a manufacturing method capable of manufacturing the semiconductor device easily.

Another object of the present invention is to provide a method of manufacturing a semiconductor device capable of manufacturing it easily and precisely while using, as dual gate electrode materials, metal materials having respectively desired work functions suited for a plurality of semiconductor elements configuring a semiconductor device such as pFET and nFET configuring a CMOS device.

A further object of the present invention is to provide a method of manufacturing a semiconductor device capable of preventing reduction in the reliability of a gate insulating film and at the same time, widening the control range of a threshold voltage; and the semiconductor device.

A method of manufacturing a semiconductor device according to the invention is that of a semiconductor device having a first conductivity type semiconductor element and a second conductivity type semiconductor element different from each other in conductivity type and aligned with each other and comprises the steps of: forming, in a semiconductor substrate, an element isolation film for isolating a first conductivity type element region in which the first conductivity type semiconductor element is to be formed from a second conductivity type element region in which the second conductivity type semiconductor element is to be formed; forming a first metal film over the surface of a gate insulating film placed over the main surface of the semiconductor substrate; forming a first cap layer containing a material different from that of the first metal film over the upper surface of the first metal film formed in the first conductivity type element region; carrying out first heat treatment to cause a reaction between the first cap layer and the first metal film in the first conductivity type element region; and forming a dual gate electrode structure different in composition between the first conductivity type element region and the second conductivity type element region.

A method of manufacturing a semiconductor device according to the invention is that of a semiconductor device having a first conductivity type semiconductor element and a second conductivity type semiconductor element different from each other in conductivity type and aligned with each other and comprises the steps of: forming an insulating layer containing an insulating material over a semiconductor substrate in a first conductivity type element region in which the first conductivity type semiconductor element is to be formed and a second conductivity type element region in which the second conductivity type semiconductor element is to be formed; forming a first cap layer containing a first element between the semiconductor substrate and the insulating layer in the first conductivity type element region and the second conductivity type element region or over the insulating layer in the first conductivity type element region and the second conductivity type element region; forming an electrode conductive layer containing a conductive material over the first cap layer in the first conductivity type element region and the second conductivity type element region; forming a second cap layer containing a second element different from the first element over the electrode conductive layer in the first conductivity type element region; and heat treating the insulating layer and the electrode conductive layer together with the first cap layer and the second cap layer.

A method of manufacturing a semiconductor device according to the invention is that of a semiconductor device having a first conductivity type semiconductor element and a second conductivity type semiconductor element different from each other in conductivity type and aligned with each other and comprises the steps of: forming an insulating layer containing an insulating material over a semiconductor substrate in a first conductivity type element region in which the first conductivity type semiconductor element is to be formed and a second conductivity type element region in which the second conductivity type semiconductor element is to be formed; forming a first cap layer containing a first element between the semiconductor substrate and the insulating layer in the first conductivity type element region and the second conductivity type element region or over insulating layer in the first conductivity type element region and the second conductivity type element region; forming an electrode conductive layer containing a conductive material over the first cap layer in the first conductivity type element region and the second conductivity type element region; forming a diffusion preventing layer over the electrode conductive layer in the second conductivity type element region in order to suppress or prevent diffusion of a second element different from the first element; forming a second cap layer containing the second element over the diffusion preventing layer and the electrode conductive layer in the first conductivity type element region; and heat treating the insulating layer, the electrode conductive layer, and the diffusion preventing layer together with the first cap layer and the second cap layer.

A method of manufacturing a semiconductor device according to the invention is that of a semiconductor device having a first conductivity type semiconductor element and a second conductivity type semiconductor element different from each other in conductivity type and aligned with each other and comprises the steps of: forming an insulating layer containing an insulating material over a semiconductor substrate in a first conductivity type element region in which the first conductivity type semiconductor element is to be formed and a second conductivity type element region in which the second conductivity type semiconductor element is to be formed; forming a first cap layer containing a first element between the semiconductor substrate and the insulating layer in the first conductivity type element region and the second conductivity type element region or over the insulating layer of the first conductivity type element region and the second conductivity type element region; forming an electrode conductive layer containing a conductive material over the first cap layer in the first conductivity type element region and the second conductivity type element region to give a thickness of the electrode conductive layer in the second conductivity type element region greater than a thickness of the electrode conductive layer in the first conductivity type element region; forming a second cap layer containing a second element different from the first element over the electrode conductive layer in the first conductivity type element region and the second conductivity type element region; and heat treating the insulating layer and the electrode conductive layer together with the first cap layer and the second cap layer.

A semiconductor device according to the invention comprises a first conductivity type semiconductor element and a second conductivity type semiconductor element different from each other in conductivity type and aligned with each other, wherein the first conductivity type semiconductor element comprises: a first element-added insulating layer placed over a semiconductor substrate, having insulation properties, and containing a first element and a second element different therefrom; and an element-added conductive layer placed over the first element-added insulating layer, having conductivity, and containing the second element, and wherein the second conductivity type semiconductor element comprises: a second element-added insulating layer juxtaposed to the first element-added insulating layer over the semiconductor substrate over which the first element-added insulating layer is placed, having insulation properties, and containing the first element; and an electrode conductive layer placed over the second element-added insulating layer and having conductivity.

A semiconductor device according to the invention comprises a first conductivity type semiconductor element and a second conductivity type semiconductor element different from each other in conductivity type and aligned with each other, wherein the first conductivity type semiconductor element comprises: a first element-added insulating layer placed over a semiconductor substrate, having insulation properties, and containing a first element and a second element different therefrom; and a first element-added conductive layer placed over the first element-added insulating layer, having conductivity, and containing the second element, and wherein the second conductivity type semiconductor element comprises: a second element-added insulating layer juxtaposed to the first element-added insulating layer over the semiconductor substrate over which the first element-added insulating layer is placed, having insulation properties, and containing the first element; an electrode conductive layer placed over the second element-added insulating layer and having conductivity; a second element-added conductive layer placed over the electrode conductive layer, having conductivity, and containing the second element; and another second element-added conductive layer placed over the second element-added conductive layer, having conductivity, and containing the second element.

A semiconductor device according to the invention comprises a first conductivity type semiconductor element and a second conductivity type semiconductor element different from each other in conductivity type and aligned with each other, wherein the first conductivity type semiconductor element comprises: a first element-added insulating layer placed over a semiconductor substrate, having insulation properties, and containing a first element and a second element different therefrom; and a first element-added conductive layer placed over the first element-added insulating layer, having conductivity, and containing the second element, and wherein the second conductivity type semiconductor element comprises: a second element-added insulating layer juxtaposed to the first element-added insulating layer over the semiconductor substrate over which the first element-added insulating layer is placed, having insulation properties, and containing the first element; an electrode conductive layer placed over the second element-added insulating layer and having conductivity; and a second element-added conductive layer placed over the electrode conductive layer, having conductivity, and containing the second element.

A semiconductor device according to the invention comprises a first conductivity type semiconductor element and a second conductivity type semiconductor element different from each other in conductivity type and aligned with each other, wherein the first conductivity type semiconductor element comprises: a first element-added insulating layer placed over a semiconductor substrate, having insulation properties, and containing a first element and a second element different therefrom; and a first element-added conductive layer placed over the first element-added insulating layer, having conductivity, and containing the second element, and wherein the second conductivity type semiconductor element comprises: a second element-added insulating layer juxtaposed to the first element-added insulating layer over the semiconductor substrate over which the first element-added insulating layer is placed, having insulation properties, and containing the first element; an electrode conductive layer placed over the second element-added insulating layer and having conductivity; and an upper conductive layer placed over the electrode conductive layer, having conductivity, and containing a material different from the material of the electrode conductive layer.

According to the method of manufacturing a semiconductor device in one aspect of the invention, a semiconductor device permitting operation of a first conductivity type semiconductor element and a second conductivity type semiconductor element at desired threshold voltages, respectively can be formed easily by employing a dual gate electrode structure in which a gate electrode of the first conductivity type semiconductor element and a gate electrode of the second conductivity type semiconductor element are made of metal materials different in work function. In particular, since main materials used for the metal film of the gate electrode of the first conductivity type semiconductor element and the metal film of the gate electrode of the second conductivity type semiconductor element are the same, the gate electrodes can be processed more easily and more accurately even though the gate electrodes are minute. Moreover, the processing does not cause any damage to a gate insulating film during manufacturing steps so that a highly reliable semiconductor device can be manufactured. Thus, the method of manufacturing a semiconductor device according to the invention facilitates manufacture of a semiconductor device which is equipped with a first conductivity type semiconductor element and a second conductivity type semiconductor element having desired properties, respectively, and at the same time, is highly reliable.

According to the method of manufacturing a semiconductor device in another aspect of the invention, an insulating layer is formed over a semiconductor substrate in a first conductivity type element region and a second conductivity type element region and a first cap layer and an electrode conductive layer are formed successively between the insulating layer and the semiconductor substrate or over the insulating layer. Over the electrode conductive layer thus formed in the first conductivity type element region, a second cap layer is formed. Together with the first cap layer and the second cap layer thus formed, the insulating layer and the electrode conductive layer are heat treated. This heat treatment enables diffusion of the first element contained in the first cap layer into the insulating layer over or below the first cap layer. In addition, this heat treatment enables diffusion of the second element contained in the second cap layer into the electrode conductive layer below the second cap layer and into the insulating layer below the electrode conductive layer. This enables to form an insulating layer containing the first and the second elements in the first conductivity type element region and an insulating layer containing the first element in the second conductivity type element region. The threshold voltage of the first conductivity type semiconductor element and the threshold voltage of the second conductivity type semiconductor element can be controlled independently and the control range of the threshold voltage can be widened.

The second cap layer is formed over the electrode conductive layer and the second cap layer and the insulating layer have therebetween the electrode conductive layer so that deterioration of the insulating layer can be prevented when, after formation of the second cap layer both in the first conductivity type element region and the second conductivity type element region in order to form the second cap layer in the first conductivity type element region, the second cap layer is removed from the second conductivity type element region. This enables to prevent reduction in the reliability of the insulating layer due to deterioration thereof and thereby widen the control range of a threshold voltage while preventing reduction in the reliability of the insulating layer. For example, in the case of a MOS transistor in which a first conductivity type semiconductor element and a second conductivity type semiconductor element use an insulating layer as the gate insulating film thereof, reduction in the reliability of the gate insulating film can be prevented and at the same time, the control range of the threshold voltage can be widened. As a result, a highly reliable semiconductor device equipped with the first conductivity type semiconductor element and the second conductivity type semiconductor element having desired properties, respectively, can be manufactured easily.

According to the method of manufacturing a semiconductor device in a further aspect of the invention, an insulating layer is formed over a semiconductor substrate in a first conductivity type element region and a second conductivity type element region and a first cap layer and an electrode conductive layer are formed successively between the insulating layer and the semiconductor substrate or over the insulating layer. A diffusion preventing layer is formed over the electrode conductive layer in the second conductivity type element region and a second cap layer is formed over the diffusion preventing layer and the electrode conductive layer in the first conductivity type element region. Together with the first cap layer and the second cap layer thus formed, the insulating layer, the electrode conductive layer, and the diffusion preventing layer are heat treated.

This heat treatment enables to diffuse the first element contained in the first cap layer into the insulating layer above or below the first cap layer. In the first conductivity type element region, a second element contained in the second cap layer can be diffused into the electrode conductive layer below the second cap layer and diffused further into the insulating layer below the electrode conductive layer. In the second conductive type element region, the second cap layer is formed over the diffusion preventing layer so that diffusion of the second element into the electrode conductive layer and the insulating layer can be suppressed or prevented by the diffusion preventing layer. This enables to form the insulating layer containing the first and second elements in the first conductivity type element region and form the insulating layer containing the first element in the second conductivity type semiconductor region so that the threshold voltage of the first conductivity type semiconductor element and the threshold voltage of the second conductivity type semiconductor element can be controlled, respectively. The control range of the threshold voltage can therefore be widened.

The second cap layer is formed over the electrode conductive layer and the second cap layer and the insulating layer have therebetween the electrode conductive layer so that deterioration of the insulating layer can be prevented when, after formation of the second cap layer both in the first conductivity type element region and the second conductivity type element region in order to form the second cap layer in the first conductivity type element region, the second cap layer is removed from the second conductivity type element region. This enables to prevent reduction in the reliability of the insulating layer due to deterioration thereof and thereby widen the control range of a threshold voltage while preventing reduction in the reliability of the insulating layer. For example, in the case of a MOS transistor in which a first conductivity type semiconductor element and a second conductivity type semiconductor element use an insulating layer as the gate insulating film thereof, reduction in the reliability of the gate insulating film can be prevented and at the same time, the control range of the threshold voltage can be widened. As a result, a highly reliable semiconductor device equipped with the first conductivity type semiconductor element and the second conductivity type semiconductor element having desired properties, respectively, can be manufactured easily.

According to the method of manufacturing a semiconductor device in a still further aspect of the invention, an insulating layer is formed over a semiconductor substrate in a first conductivity type element region and a second conductivity type element region and a first cap layer and an electrode conductive layer are formed successively between the insulating layer and the semiconductor substrate or over the insulating layer. The electrode conductive layer is designed to be thicker in the second conductivity type element region than in the first conductivity type element region. A second cap layer is formed over the electrode conductive layer both in the first conductivity type element region and the second conductivity type element region. Together with the first cap layer and the second cap layer thus formed, the insulating layer and the electrode conductive layer are heat treated. This heat treatment enables diffusion of the first element contained in the first cap layer into the insulating layer above or below the first cap layer. It also enables to diffuse the second element contained in the second cap layer into the electrode conductive layer below the second cap layer and further diffuse it into the insulating layer below the electrode conductive layer.

The electrode conductive layer is thicker in the second conductivity type element region than in the first conductivity type element region so that diffusion of the second element into the electrode conductive layer and the insulating layer can be suppressed compared with the diffusion in the first conductivity type element region. For example, it is possible to diffuse the second element into the insulating layer in the second conductivity type element region but not to diffuse it into the insulating layer in the first conductivity type element region. By this, the insulating layer containing the first and second elements can be formed in the first conductivity type element region, while the insulating layer containing the first element can be formed in the second conductivity type element region. The threshold voltage of the first conductivity type semiconductor element and the threshold voltage of the second conductivity type semiconductor element can be controlled, respectively, whereby the control range of the threshold voltage can be widened.

The second cap layer is formed over the electrode conductive layer and the second cap layer and the insulating layer have therebetween the electrode conductive layer so that deterioration of the insulating layer during formation of the second cap layer can be prevented. This enables to prevent reduction in the reliability of the insulating layer due to deterioration thereof and thereby widen the control range of a threshold voltage while preventing reduction in the reliability of the insulating layer. For example, in the case of a MOS transistor in which a first conductivity type element and a second conductivity type element use an insulating layer as the gate insulating film thereof, reduction in the reliability of the gate insulating film can be prevented and at the same time, the control range of the threshold voltage can be widened. As a result, a highly reliable semiconductor device equipped with a first conductivity type semiconductor element and a second conductivity type semiconductor element having desired properties, respectively, can be manufactured easily.

According to the semiconductor device in one aspect of the invention, a first conductivity type semiconductor element contains first and second elements in a first element-added insulating layer thereof and contains the second element in an element-added conductive layer over the first element-added insulating layer. A second conductivity type semiconductor element contains the first element in a second element-added insulating layer thereof and is equipped with an electrode conductive layer over the second element-added insulating layer. Such a structure enables to realize the first conductivity type semiconductor element and the second conductivity type semiconductor element having threshold voltages suited therefor respectively. Since the first and second element-added insulating layers can be formed without etching on an insulating layer which is to be the first and second element-added insulating layers, deterioration in the manufacturing procedure can be prevented and reduction in reliability can therefore be prevented. As a result, a highly reliable semiconductor device equipped with a first conductivity type semiconductor element and a second conductivity type semiconductor element having desired properties, respectively, can be realized.

According to the semiconductor device in another aspect of the invention, a first conductivity type semiconductor element contains first and second elements in a first element-added insulating layer thereof and contains the second element in a first element-added conductive layer over the first element-added insulating layer. A second conductivity type semiconductor element contains the first element in a second element-added insulating layer thereof, is equipped with an electrode conductive layer over the second element-added insulating layer, and contains the second element in a second element-added conductive layer over the electrode conductive layer and another second element-added conductive layer. Such a structure enables to realize the first conductivity type semiconductor element and the second conductivity type semiconductor element having threshold voltages suited therefor respectively. Since the first and second element-added insulating layers can be formed without etching on an insulating layer which is to be the first and second element-added insulating layers, deterioration in the manufacturing procedure can be prevented and reduction in reliability can therefore be prevented. As a result, a highly reliable semiconductor device equipped with a first conductivity type semiconductor element and a second conductivity type semiconductor element having desired properties, respectively, can be realized.

According to the semiconductor device in a further aspect of the invention, a first conductivity type semiconductor element contains first and second elements in a first element-added insulating layer thereof and contains the second element in an element-added conductive layer over the first element-added insulating layer. A second conductivity type semiconductor element contains the first element in a second element-added insulating layer thereof, is equipped with an electrode conductive layer over the second element-added insulating layer, and contains the second element in a second element-added conductive layer over the electrode conductive layer and another second element-added conductive layer. Such a structure enables to realize the first conductivity type semiconductor element and the second conductivity type semiconductor element having threshold voltages suited therefor respectively. Since the first and second element-added insulating layers can be formed without etching on an insulating layer which is to be the first and second element-added insulating layers, deterioration in the manufacturing procedure can be prevented and reduction in reliability can therefore be prevented. As a result, a highly reliable semiconductor device equipped with a first conductivity type semiconductor element and a second conductivity type semiconductor element having desired properties, respectively, can be realized.

According to the semiconductor device in a still further aspect of the invention, a first conductivity type semiconductor element contains first and second elements in a first element-added insulating layer thereof and contains the second element in a first element-added conductive layer over the first element-added insulating layer. A second conductivity type semiconductor element contains the first element in a second element-added insulating layer thereof, is equipped with an electrode conductive layer over the second element-added insulating layer, and has an upper conductive layer containing a material different from that of the electrode conductive layer over the electrode conductive layer. Such a structure enables to realize the first conductivity type semiconductor element and the second conductivity type semiconductor element having threshold voltages suited therefor respectively. Since the first and second element-added insulating layers can be formed without etching on an insulating layer which is to be the first and second element-added insulating layers, deterioration in the manufacturing procedure can be prevented and reduction in reliability can therefore be prevented. As a result, a highly reliable semiconductor device equipped with a first conductivity type semiconductor element and a second conductivity type semiconductor element having desired properties, respectively, can be realized.

DETAILED DESCRIPTION OF THE PREFERRED EMBODIMENTS

Figure 1:
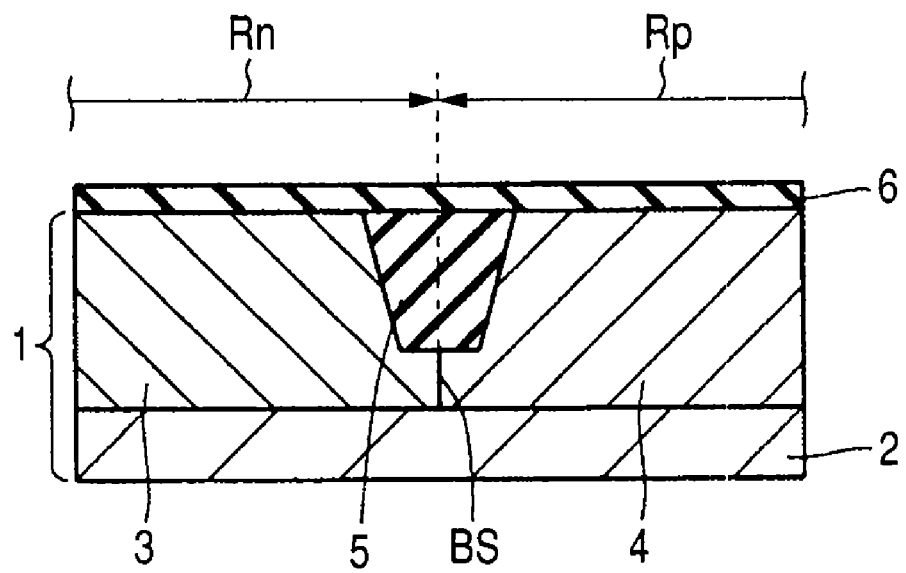
FIG. 1 is a cross-sectional view illustrating the state of each manufacturing step in a method of manufacturing a semiconductor device according to a first embodiment of the invention.

A plurality of embodiments for practicing the invention will next be described. In each embodiment, a portion corresponding to that described in the preceding embodiment may be identified by a like reference numeral or symbol and overlapping description may be omitted. When only a part of the constitution is described, the other part of the constitution is similar to that described in the preceding embodiment.

First Embodiment

Figure 2:
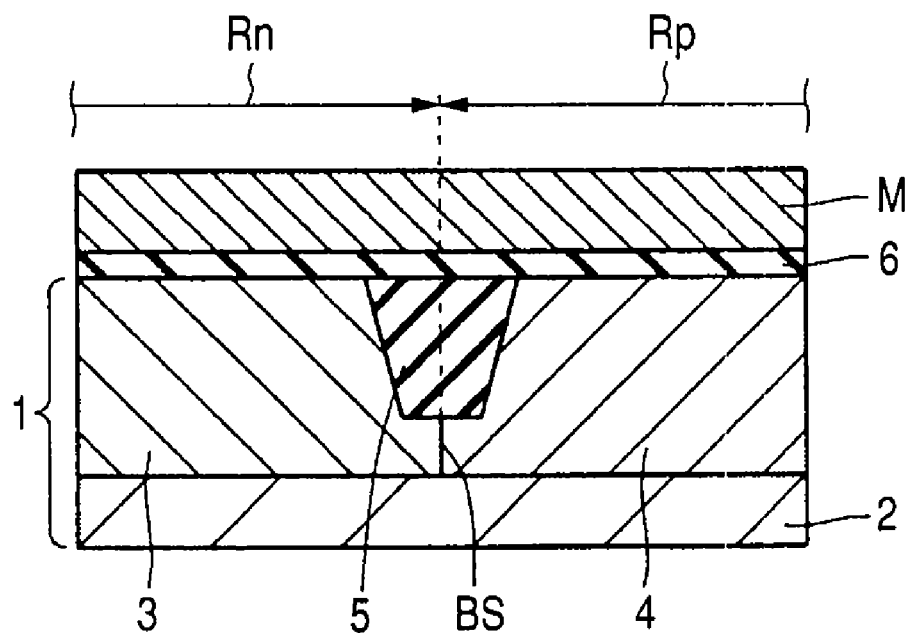
FIG. 2 is a cross-sectional view illustrating the state of each manufacturing step in the method of manufacturing a semiconductor device according to the first embodiment of the invention.
Figure 3:
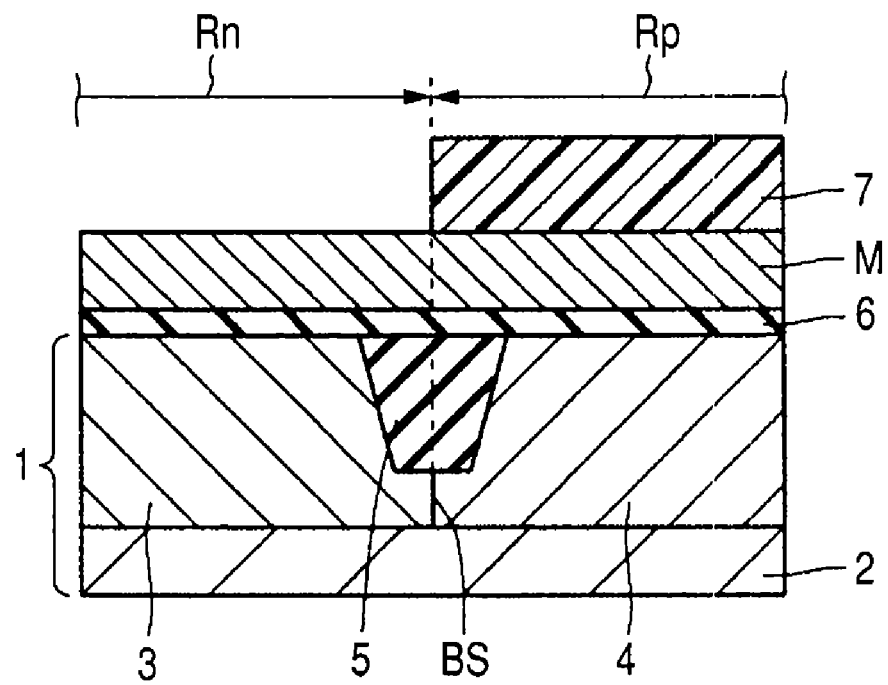
FIG. 3 is a cross-sectional view illustrating the state of each manufacturing step in the method of manufacturing a semiconductor device according to the first embodiment of the invention.
Figure 4:
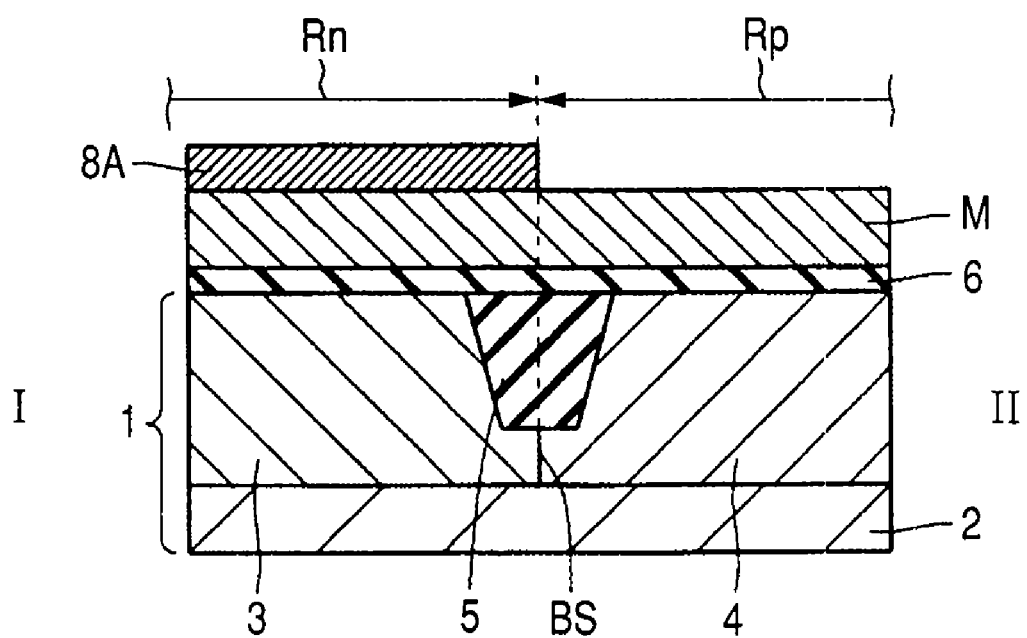
FIG. 4 is a cross-sectional view illustrating the state of each manufacturing step in the method of manufacturing a semiconductor device according to the first embodiment of the invention.
Figure 5:
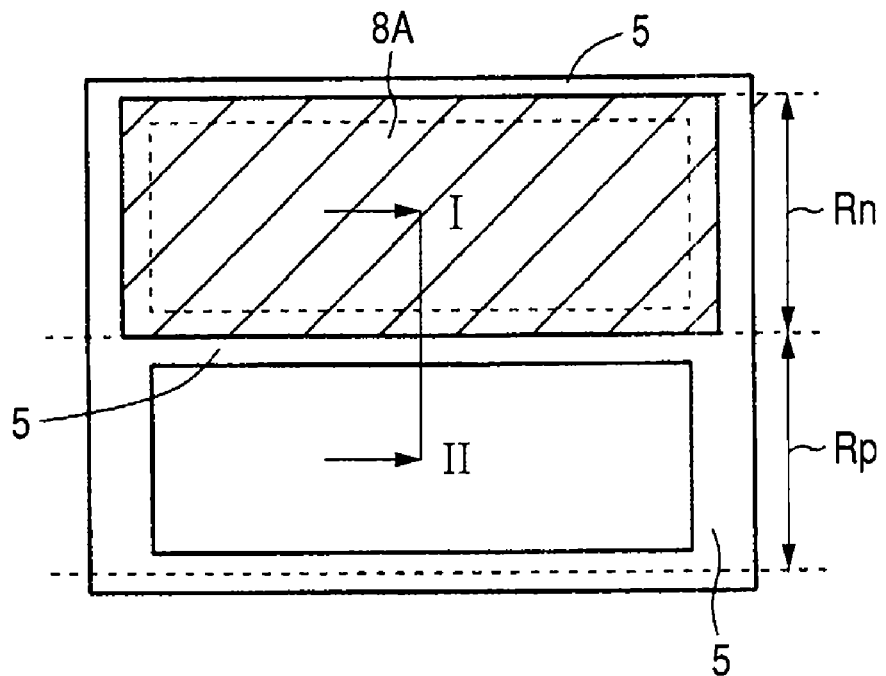
FIG. 5 is a top view schematically illustrating the formation region of an n-side cap layer 8A in the semiconductor device relating to the first embodiment of the invention.

FIGS. 1 to 4 and FIGS. 6 to 9 are each a cross-sectional view illustrating the state of each manufacturing step in a manufacturing method according to a first embodiment of the present invention. The semiconductor device in this embodiment has a complementary MOS (Complementary Metal-Oxide Semiconductor; abbreviation: CMOS) structure, more specifically, it is a CMOS transistor. FIG. 5 is a top view schematically illustrating the formation region of an n-side cap layer 8A, which will be described later, in the semiconductor device of the first embodiment. FIG. 4 is a cross-sectional view taken along a line I-II of FIG. 5. The CMOS transistor is more specifically a CMOS field effect transistor (abbreviation: FET). The CMOSFET has an n-type MOS transistor which is an n-channel MOS transistor and a p-type MOS transistor which is a p-channel MOS transistor. These transistors are aligned with each other. The n-type MOS transistor is, more specifically, an nMOSFET (which may hereinafter be called "nFET"), while the p-type MOS transistor is, more specifically, a pMOSFET (which may hereinafter be called "pFET"). Thus, in the CMOSFET, an nMOSFET and a pMOSFET different in conductivity type are aligned with each other. The nMOSFET corresponds to a first conductivity type semiconductor element and the pMOSFET corresponds to a second conductivity type semiconductor element.

First, as illustrated in FIG. 1, a p well 3 and an n well 4 extending toward the inside of a p type semiconductor layer 2 from the main surface of a silicon (Si) substrate 1 which is a semiconductor substrate, and an insulating film 5 serving as an element isolation film (which may hereinafter be called "element isolation insulating film") are formed successively. The element isolation insulating film 5 is, as illustrated in FIG. 5, an insulating film for partitioning an nMOSFET region (which may hereinafter be called "nFET region") Rn in which an nMOSFET is to be formed from a pMOSFET region (which may hereinafter be called "pFET region") Rp in which pMOSFET is to be formed. The element isolation insulating film 5 has, immediately below the bottom surface thereof, a boundary surface BS between the p well 3 and the n well 4. The boundary surface BS corresponds to a boundary between the nFET region Rn and the pFET region Rp. Thus, the nFET region Rn and the pFET region Rp are separated from each other by the element isolation insulating film 5. The nFET region Rn corresponds to a first conductivity type element region, while the pFET region Rp corresponds to a second conductivity type element region. A step of forming the element isolation insulating film 5 extending from the main surface of the semiconductor substrate 1 to the inside of the p type semiconductor layer 2 corresponds to a step of forming an element isolation film in a semiconductor substrate.

After the formation of the p well 3, the n well 4, and the element isolation insulating film 5, a hafnium silicon oxynitride (HfSiON) film, for example, is formed as a gate insulating film 6 configuring a high-k film over the entire upper surface of the main surface of the Si substrate 1. The material of the gate insulating film 6 is not limited to it, but a silicon oxynitride film (SiON) or an oxide film, oxynitride film, or oxynitride silicide film of hafnium (Hf), lanthanum (La) or aluminum (Al) may be used instead as the material of the gate insulating film 6.

As illustrated in FIG. 2, a gate-electrode metal film M corresponding to a first metal film is formed by sputtering over the entire upper surface of the gate insulating film 6. The thickness of the gate-electrode metal film M is empirically adjusted to fall within a range of from 3 to 30 nm because when it is too small, the thickness of the film M cannot be controlled easily and when it is too large, the n-side cap layer 8A, which will be described later, cannot be diffused sufficiently. For the gate-electrode metal film M, usable is any of materials (first materials) containing at least one element selected from the group comprised of titanium (Ti), tantalum (Ta), Hf, and tungsten (W), and nitrides (such as TiN), carbides (such as Tac), silicides (such as HfSi), nitride silicides (such as TaSiN) or carbonitrides (such as TaCN) of the first materials.

By photolithography with a photoresist mask formed by applying a resist over the upper surface of the gate-electrode metal film M, a resist pattern 7 is formed, as illustrated in FIG. 3, over an entire upper surface portion of the gate-electrode metal film M belonging to the pFET region Rp.

With the resist pattern 7 as a mask, the n-side cap layer (corresponding to a first cap layer) 8A is formed over the entire upper surface of the gate-electrode metal film M formed in the nFET region Rn as illustrated in FIGS. 4 and 5, meaning in this embodiment that the n-side cap layer 8A is formed over the entire upper surface of only a portion of the gate-electrode metal film M belonging to the nFET region Rn. The resist pattern 7 is then removed because it becomes unnecessary. The thickness of the n-side cap layer 8A is adjusted empirically to 10 nm or less. In addition, the n-side cap layer 8A is made of a material different from the gate-electrode metal film M. The material of the n-side cap layer 8A is preferably any of metal materials (second materials) containing at least one element selected from the group comprised of Hf, Ta, La, magnesium (Mg), ytterbium (Yb), and indium (In), and oxides, nitrides, carbides, silicides, nitride silicides, or carbonitrides of the second materials.

Figure 6:
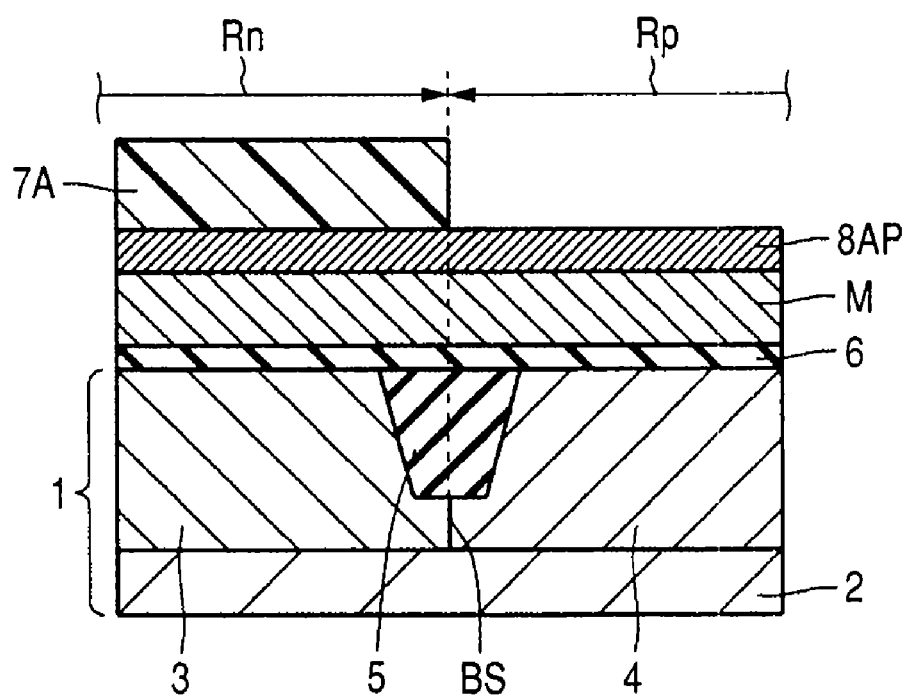
FIG. 6 is a cross-sectional view illustrating the state of each manufacturing step in the method of manufacturing a semiconductor device according to the first embodiment of the invention.

Alternatively, the n-side cap layer 8A may be formed by the method illustrated in FIG. 6. Described specifically, a cap layer 8AP is formed over the entire upper surface of the gate-electrode metal film M. Then, a resist pattern 7A is formed over the entire upper surface of a portion of the cap layer 8AP belonging to the nFET region Rn. With the resist pattern 7A as a mask, wet etching or dry etching is performed to completely remove the portion of the cap layer 8AP belonging to the pFET region Rp. By the above step, the n-side cap layer 8A is formed over the entire upper surface of the portion of the gate-electrode metal film M belonging to the nFET region Rn. The resist pattern 7A is then removed, because it becomes unnecessary.

Figure 7:
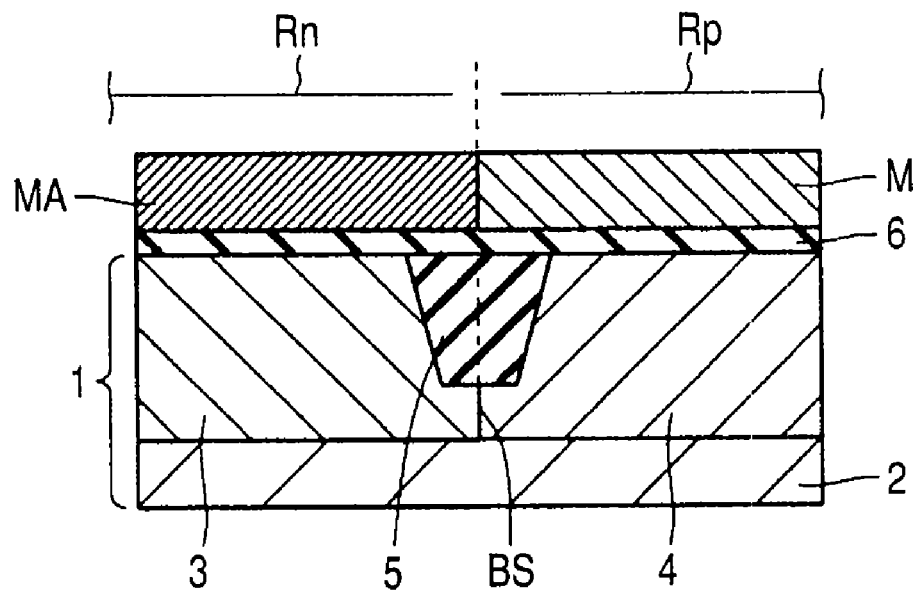
FIG. 7 is a cross-sectional view illustrating the state of each manufacturing step in the method of manufacturing a semiconductor device according to the first embodiment of the invention.

After the formation of the n-side cap layer 8A, heat treatment is performed to cause a reaction between the n-side cap layer 8A and the gate-electrode metal film M in the nFET region Rn (that is, a portion of the gate-electrode metal film M located immediately below the n-side cap layer 8A) to diffuse the n-side cap layer 8A into the gate-electrode metal film M located below the n-side cap layer 8A to form, as illustrated in FIG. 7, an n-side gate-electrode metal film MA in the nFET region Rn. A gate electrode layer which will be a bottom layer contiguous to the upper surface of the gate insulating film 6 is the gate-electrode metal film M in the pFET region Rp, while it is the n-side gate-electrode metal film MA in the nFET region Rn. The heat treatment temperature for causing diffusion (reaction) is determined depending on the material of the cap layer A. This heat treatment for diffusing the n-side cap layer 8A into the gate-electrode metal film M in the nFET region Rn, thereby causing a reaction therebetween corresponds to first heat treatment.

Figure 8:
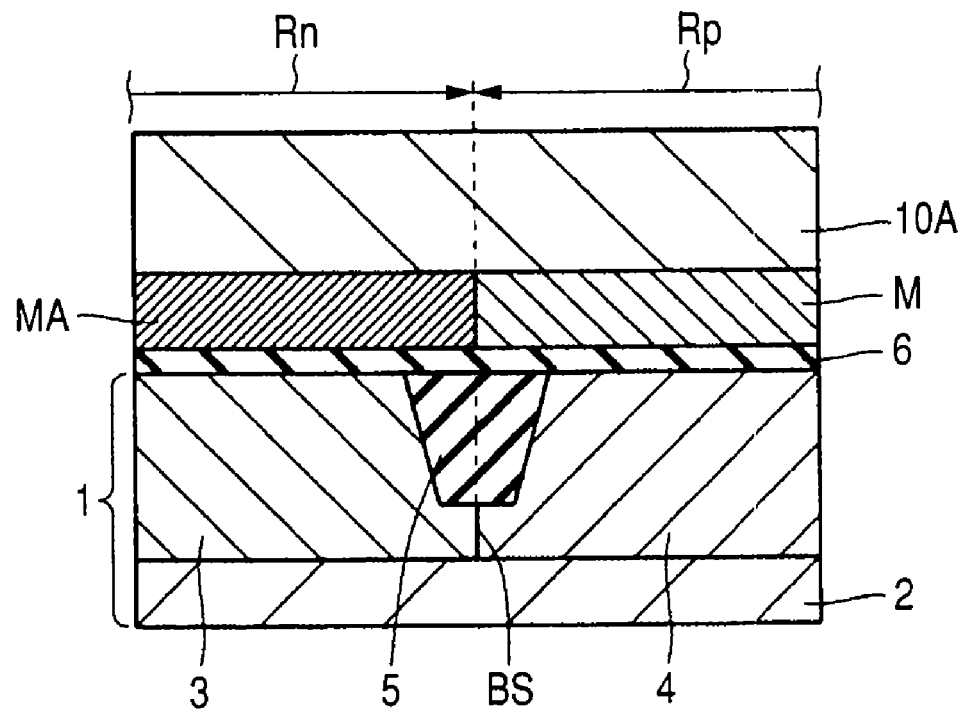
FIG. 8 is a cross-sectional view illustrating the state of each manufacturing step in the method of manufacturing a semiconductor device according to the first embodiment of the invention.

As illustrated in FIG. 8, a polycrystalline silicon layer (which may hereinafter be called "poly-Si layer") 10A is deposited to give a thickness within a range of from 30 to 120 nm over the entire upper surface of the gate electrode layer serving as the bottom layer. An advantage of forming the poly-Si layer 10A is that the conventional CMOS formation process can be applied as is to the subsequent steps. Alternatively, each gate electrode of the pFET and the nFET may be formed only of the gate-electrode metal film M and the n-side gate-electrode metal film MA without forming the poly-Si layer 10A.

Figure 9:
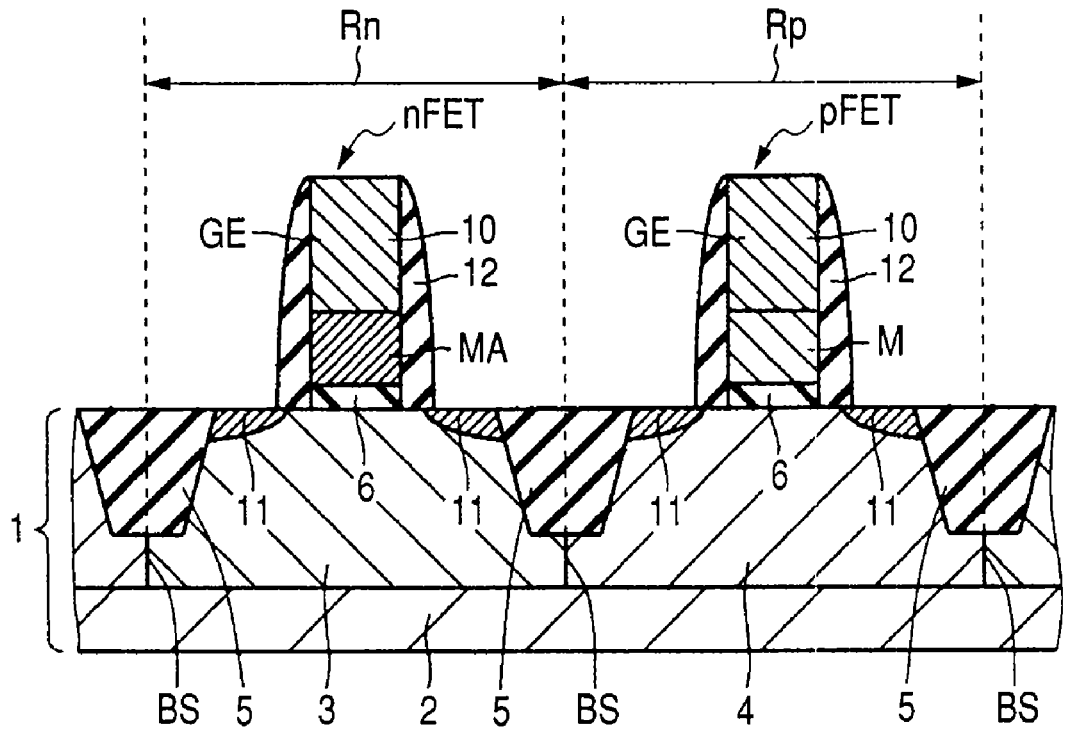
FIG. 9 is a cross-sectional view illustrating the state of each manufacturing step in the method of manufacturing a semiconductor device according to the first embodiment of the invention.

Then, processing is performed to form the gate electrode of each of the pFET and the nFET by dry etching or the like. Since the gate electrodes of the nFET and the pFET are made of the same main material, these gate electrodes can be processed readily. As illustrated in FIG. 9, a dual gate electrode structure is formed, in which a gate electrode GE of the nFET has a stack structure of the n-side gate-electrode metal film MA and the poly-Si layer 10 and a gate electrode GE of the pFET has a stack structure of the gate-electrode metal film M and the poly-Si layer 10. Thus, the processing step for the formation of the respective gate electrodes of the pFET and the nFET corresponds to a step of forming a dual gate electrode structure having a composition different between the nFET region Rn and the pFET region Rp.

The ordinary process flows for CMOS formation are conducted successively to complete the formation of the CMOS. In this process flow for CMOS formation, a source/drain region 11 and sidewall spacer 12 illustrated in FIG. 9 are formed.

As described above, according to this embodiment, a CMOS permitting operation of the nFET and the pFET at desired threshold voltages, respectively, can be formed easily with accuracy by having a dual gate electrode structure in which the gate electrode GE of the nFET has the n-side gate-electrode metal film MA and the gate electrode GE of the pFET has the gate-electrode metal film M, thus having work functions different from each other. In particular, the nFET and the pFET use the same main material for the gate electrode GE thereof, which facilitates the processing of gate electrodes by dry etching or the like. This enables to improve the processing accuracy of a minute gate electrode. In addition, a step of removing a gate electrode from one channel region which step is employed in the conventional hybrid metal gate electrode structure is not required so that the gate insulating film 6 is free from damage, making it possible to achieve a highly reliable device. The method of manufacturing a semiconductor device according to the present embodiment can thus easily manufacture a highly reliable semiconductor device permitting the nFET and the pFET to have desired properties, respectively.

Second Embodiment

Figure 10:
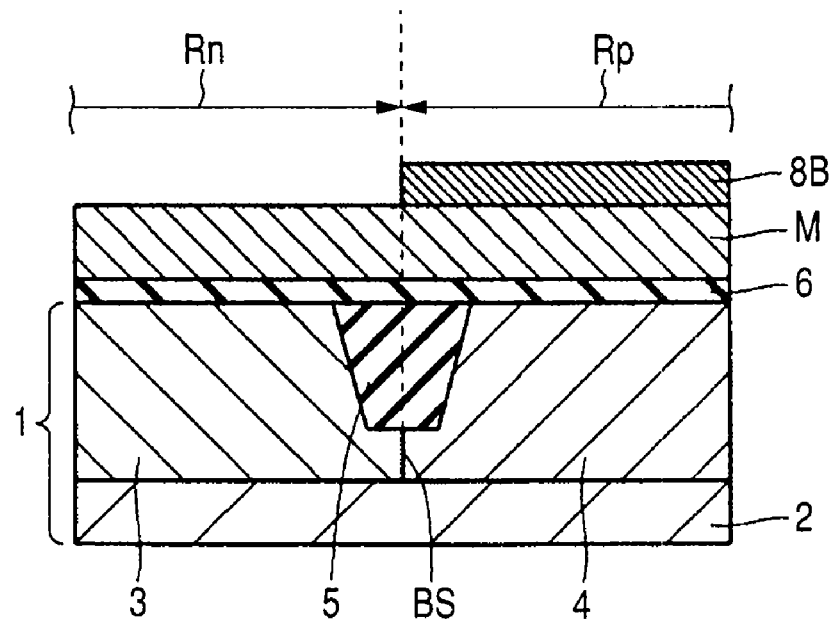
FIG. 10 is a cross-sectional view illustrating the state of each manufacturing step in a method of manufacturing a semiconductor device according to a second embodiment of the invention.
Figure 11:
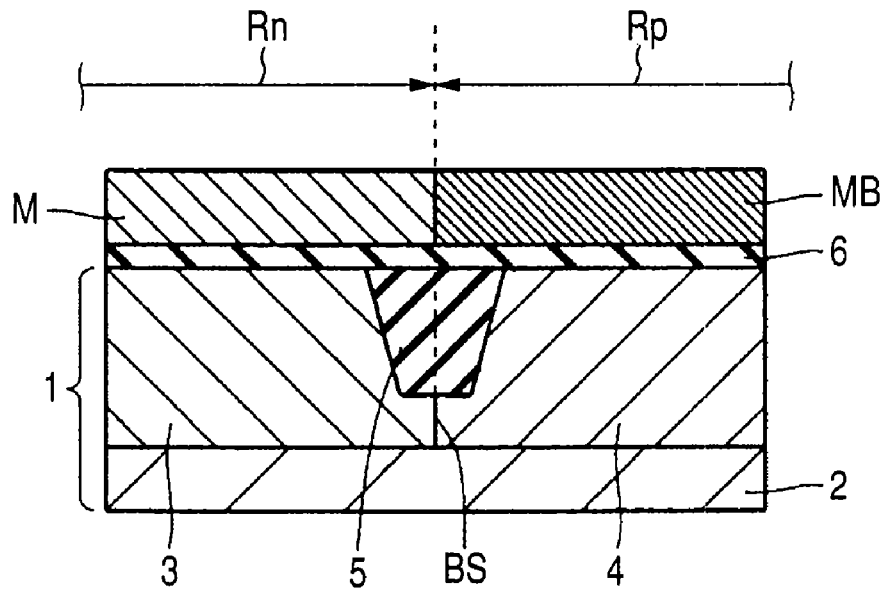
FIG. 11 is a cross-sectional view illustrating the state of each manufacturing step in the method of manufacturing a semiconductor device according to the second embodiment of the invention.
Figure 12:
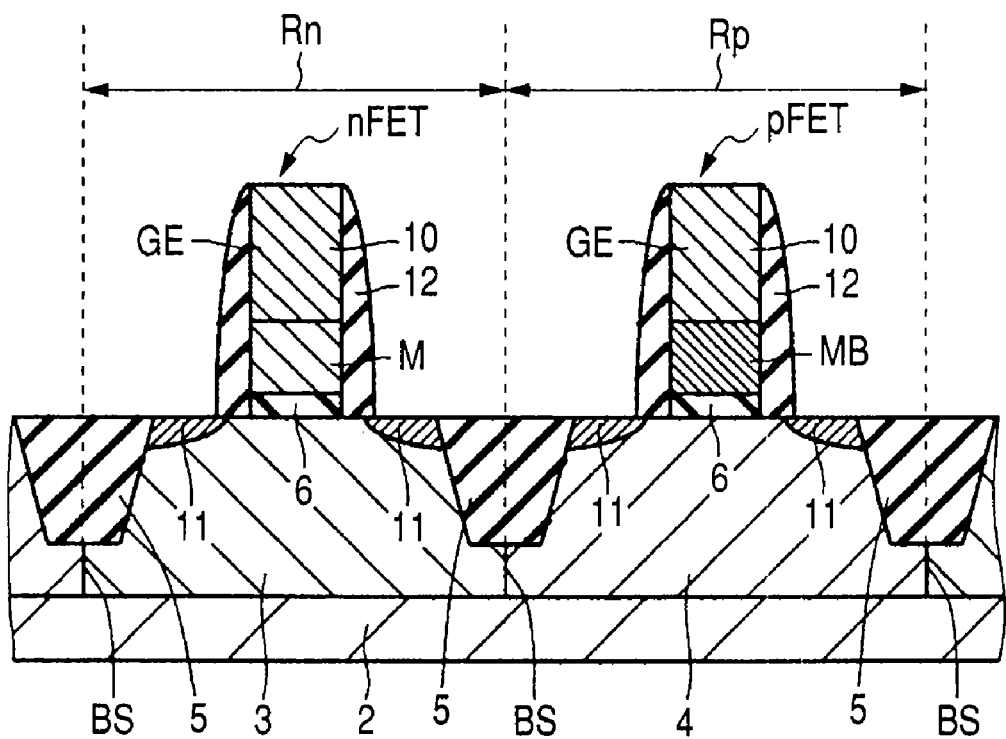
FIG. 12 is a cross-sectional view illustrating the state of each manufacturing step in the method of manufacturing a semiconductor device according to the second embodiment of the invention.

FIGS. 10 to 12 are cross-sectional views illustrating the state of each manufacturing step of a method of manufacturing a semiconductor device according to a second embodiment of the invention. In the present embodiment, after formation of a gate-electrode metal film M in accordance with a similar flow to that employed in the first embodiment, a p-side cap layer 8B is formed over the upper surface of the gate-electrode metal film M formed in the pFET region Rp as illustrated in the cross-sectional view of FIG. 10, meaning in the present embodiment that the p-side cap layer 8B is formed only over a portion of the upper surface of the gate-electrode metal film M belonging to the pFET region Rp, while employing the method using a photoresist mask (refer to FIG. 3) or by the method using wet etching or dry etching (refer to FIG. 6). The thickness of the p-side cap layer (corresponding to a first cap layer) 8B is adjusted empirically to 10 nm or less. The p-side cap layer 8B is made of a material different from that of the gate-electrode metal film M. As the p-side cap layer 8B, it is desired to use any of metal materials (third materials) containing at least one element selected from the group comprised of platinum (Pt), iridium (Ir), nickel (Ni), aluminum (Al) and ruthenium (Ru), and oxides, nitrides, carbides, silicides, nitride silicides, or carbonitrides of the third materials.

Then, heat treatment is performed to cause a reaction between the p-side cap layer 8B and the gate-electrode metal film M in the pFET region Rp (that is, a portion of the gate-electrode metal film M located immediately below the p-side cap layer 8B) to diffuse the p-side cap layer 8B into the gate-electrode metal film M located below the p-side cap layer 8B, whereby a p-side gate-electrode metal film MB is formed in the pFET region Rp as illustrated in FIG. 11. The heat treatment temperature for diffusion is determined, depending on the material used for the p-side cap layer 8B. This heat treatment for diffusing the p-side cap layer 8B into the gate-electrode metal film M in the pFET region Rp and causing a reaction therebetween corresponds to first heat treatment.

Then, as in the first embodiment, a poly-Si layer is deposited to give a thickness within a range of from 30 to 120 nm and each gate electrode of the pFET and the nFET is processed by dry etching or the like. Also in this embodiment, use of the same main material for the gate electrodes of the nFET and the pFET facilitates processing of the gate electrodes. As a result, as illustrated in FIG. 12, a dual gate electrode structure, in which the gate electrode of the nFET has a stack structure of the gate-electrode metal film M and the poly-Si layer 10 and the gate electrode of the pFET has a stack structure of the p-side gate-electrode metal film MB and the poly-Si layer 10, is formed.

As in the first embodiment, ordinary process flows for CMOS formation are conducted successively to complete the CMOS.

Also this embodiment does not require formation of the poly-Si layer 10.

As described above, according to this embodiment, a CMOS permitting operation of the nFET and the pFET thereof at desired threshold voltages, respectively can be formed easily with accuracy by having a dual gate electrode structure in which the gate electrode GE of the nFET has the gate-electrode metal film M and the gate electrode GE of the pFET has the p-side gate-electrode metal film MB, thus having work functions different from each other. In particular, use of the same main material for the respective gate electrodes GE of the nFET and the pFET facilitates gate electrode processing such as dry etching. This enables to improve the processing accuracy of a minute gate electrode. In addition, a step of removing a gate electrode from one channel region which step is employed in the conventional hybrid metal gate electrode structure is not required so that the gate insulating film 6 becomes free of damage, making it possible to achieve a highly reliable device. The method of manufacturing a semiconductor device according to the present embodiment can thus easily manufacture a highly reliable semiconductor device permitting the nFET and the pFET to have desired properties, respectively.

Third Embodiment

FIGS. 13 to 17 are cross-sectional views illustrating the state of each manufacturing step in a method of manufacturing a semiconductor device according to a third embodiment of the invention. This embodiment is characterized by that an n-side gate-electrode metal film MA is formed in an nFET region Rn and a p-side gate-electrode metal film MC is formed in a pFET region Rp and these metal films are formed over one chip. The p-side gate-electrode metal film MC corresponds to the p-side gate-electrode metal film MB in the second embodiment and is formed in a similar manner to that of the p-side gate-electrode metal film MB in the second embodiment.

Figure 13:
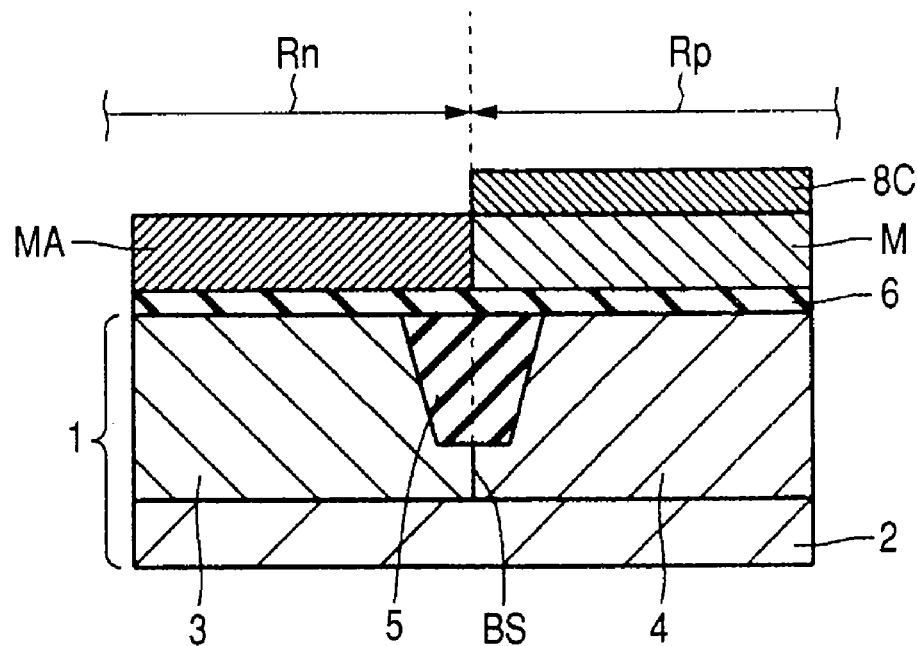
FIG. 13 is a cross-sectional view illustrating the state of each manufacturing step in a method of manufacturing a semiconductor device according to a third embodiment of the invention.
Figure 14:
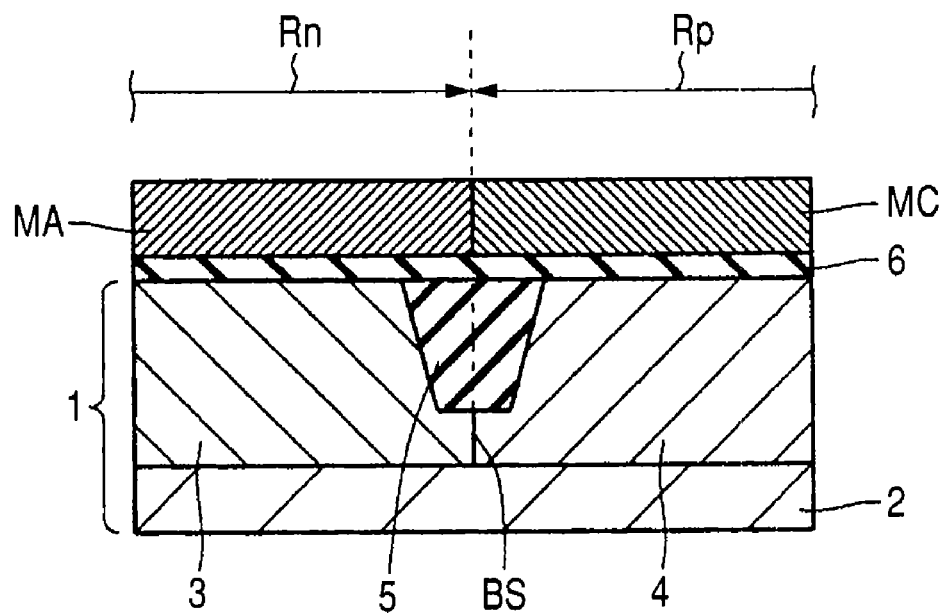
FIG. 14 is a cross-sectional view illustrating the state of each manufacturing step in the method of manufacturing a semiconductor device according to the third embodiment of the invention.

First, one of the methods for forming the n-side gate-electrode metal film MA and the p-side gate-electrode metal film MC over one chip is described. Described specifically, the n-side gate-electrode metal film MA is formed in the nFET region Rn by a similar method to that described in FIGS. 1 to 7 of the first embodiment. Then, as illustrated in FIG. 13, a second p-side cap layer (corresponding to the second cap layer) 8C is formed only over the entire upper surface of a portion of the gate-electrode metal film M in the pFET region Rp by using a similar method to that already described in the first embodiment (refer to FIG. 3 or 6). Then, heat treatment is performed at a specific temperature determined depending on the material of the second p-side cap layer 8C and the second p-side cap layer 8C is diffused into the gate-electrode metal film M in the pFET region Rp, whereby a p-side gate-electrode metal film MC is formed in the pFET region Rp as illustrated in FIG. 14.

The second p-side cap layer 8C corresponds to the p-side cap layer 8B of the second embodiment and it is formed in a similar manner to the p-side cap layer 8B of the second embodiment except that it is formed after the n-side gate-electrode metal film MA is formed in the nFET region Rn. The second p-side cap layer 8C is made of a material different from the material of the gate-electrode metal film M and the n-side cap layer 8A corresponding to the first cap layer. As the material of the second p-side cap layer 8C, it is desired to use any of metal materials (third materials) containing at least one element selected from the group of platinum (Pt), iridium (Ir), nickel (Ni), aluminum (Al) and ruthenium (Ru), and oxides, nitrides, carbides, silicides, nitride silicides, or carbonitrides of the third materials. The heat treatment for diffusing the second p-side cap layer 8C in the gate-electrode metal film M in the pFET region Rp and causing a reaction therebetween corresponds to second heat treatment.

Figure 15:
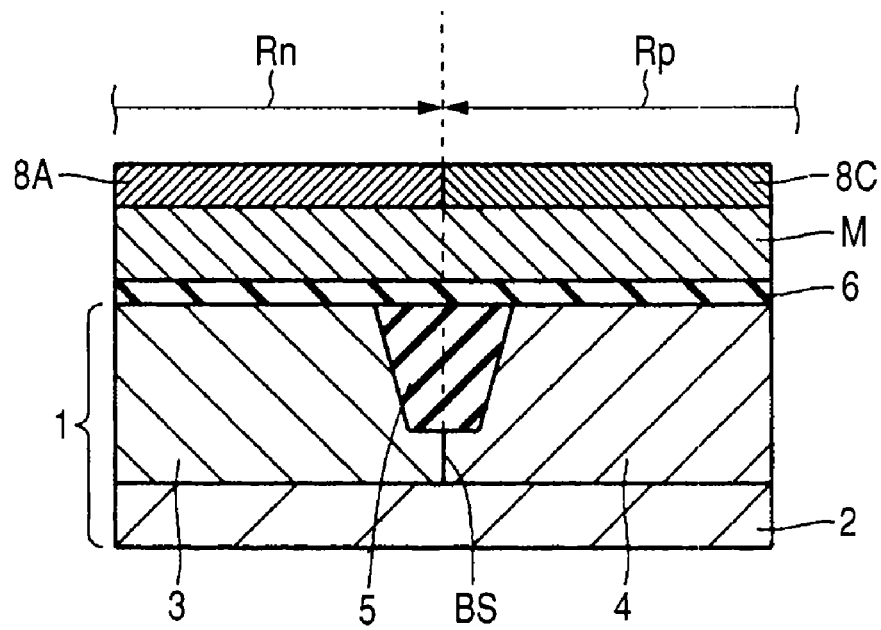
FIG. 15 is a cross-sectional view illustrating the state of each manufacturing step in the method of manufacturing a semiconductor device according to the third embodiment of the invention.

Another method for forming the n-side gate-electrode metal film MA and the p-side gate-electrode metal film MC on one chip will next be described. As illustrated in FIG. 15, after formation of the structure of the first embodiment illustrated in FIG. 2, the n-side cap layer 8A is formed only over the entire upper surface of portion of the gate-electrode metal film M in the nFET region Rn, while the second p-side cap layer 8C having a work function different from that of the n-side cap layer 8A is formed only over the entire upper surface of a portion of the gate-electrode metal film M in the pFET region Rp. Heat treatment is performed at the same temperature, whereby diffusion of the n-side cap layer 8A into the gate-electrode metal film M in the nFET region Rn and diffusion of the second p-side cap layer 8C into the gate-electrode metal film M in the pFET region Rp are performed simultaneously. The heat treatment temperature at this time is determined, depending on the materials selected for the n-side cap layer 8A and the second p-side cap layer 8C. As a result, the structure illustrated in FIG. 14 can be obtained similarly.

Figure 16:
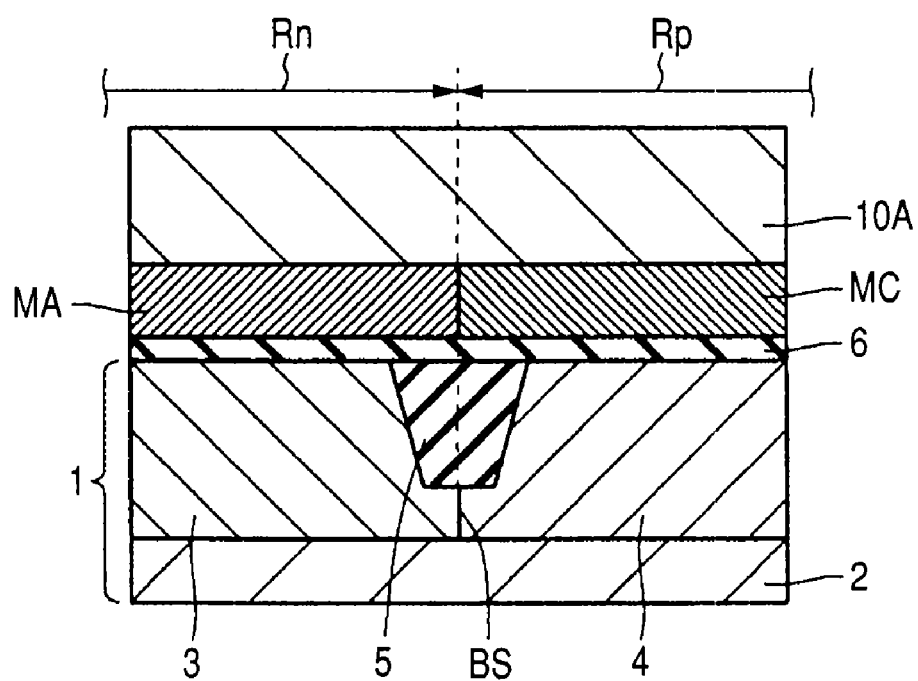
FIG. 16 is a cross-sectional view illustrating the state of each manufacturing step in the method of manufacturing a semiconductor device according to the third embodiment of the invention.
Figure 17:
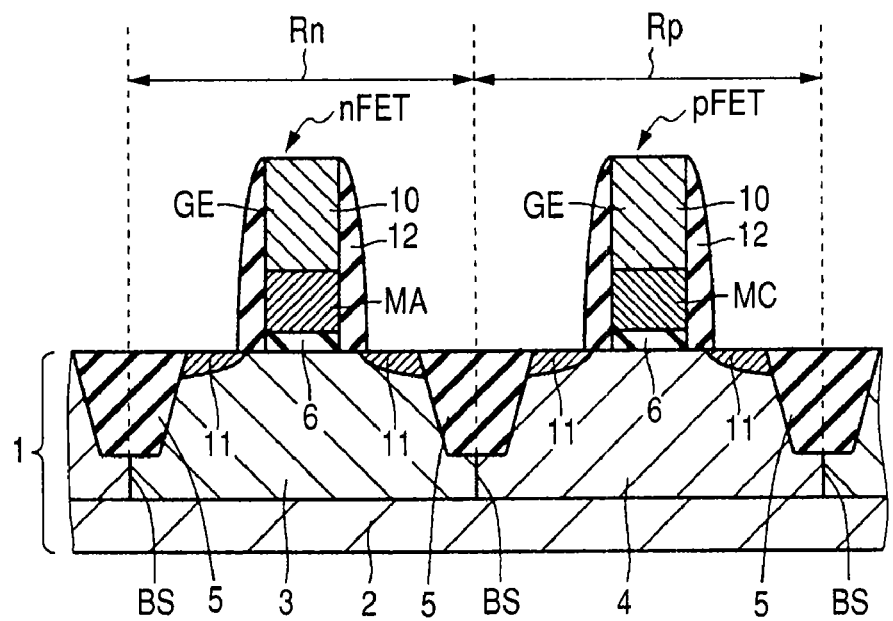
FIG. 17 is a cross-sectional view illustrating the state of each manufacturing step in the method of manufacturing a semiconductor device according to the third embodiment of the invention.

As illustrated in FIG. 16, a poly-Si layer 10A is then deposited over the entire upper surface of the n-side gate-electrode metal film MA and the p-side gate-electrode metal film MC. Steps subsequent thereto are similar to those of the first embodiment or the second embodiment. As a result, a dual gate electrode structure in which the gate electrode GE of the nFET has the n-side gate-electrode metal film MA and the gate electrode GE of the pFET has the p-side gate-electrode metal film MC is achieved as illustrated in FIG. 17.

As in the first or second embodiment, ordinary process flows for CMOS formation are conducted successively to complete the CMOS.

As described above, according to this embodiment, a CMOS permitting the nFET and the pFET to operate at desired threshold voltages, respectively can be formed easily with accuracy by having a dual gate electrode structure in which the gate electrode GE of the nFET has the n-side gate-electrode metal film MA and the gate electrode GE of the pFET has the p-side gate-electrode metal film MC, thus having work functions different from each other. In particular, since main materials used for the gate electrodes are the same between the nFET and the pFET, the gate electrodes can be processed more easily by etching or the like. This enables improvement in the processing accuracy of a minute gate electrode. In addition, a step of removing the gate electrode from one channel region which is employed in the conventional hybrid metal gate electrode structure is not required so that the gate insulating film 6 becomes free of damage, making it possible to achieve a highly reliable device. The manufacturing method of the semiconductor device according to the present embodiment can thus easily manufacture a highly reliable semiconductor device permitting the nFET and the pFET to have desired properties, respectively.

Fourth Embodiment

FIGS. 18 to 23 are cross-sectional views illustrating the state of each manufacturing step in a method of manufacturing a semiconductor device according to a fourth embodiment of the invention. This embodiment proposes a manufacturing method of a CMOS in the case where in the structure of FIG. 2 relating to each of the first to third embodiments, the thickness of the gate-electrode metal film M is adjusted to relatively thin, from about 3 to 10 nm in order to facilitate diffusion of the above-described cap layer. In the example shown below, the technical characteristic of this embodiment is applied to the first embodiment. It is needless to say that the technical characteristic of the present embodiment may be applied to the second or third embodiment.

Figure 18:
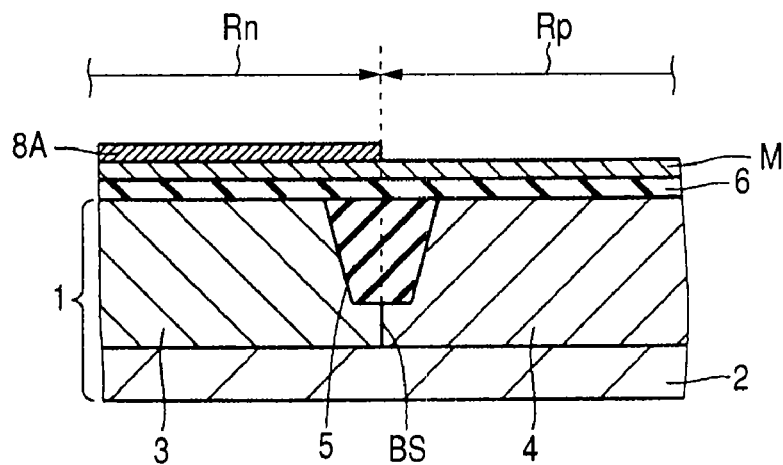
FIG. 18 is a cross-sectional view illustrating the state of each manufacturing step in a method of manufacturing a semiconductor device according to a fourth embodiment of the invention.
Figure 19:
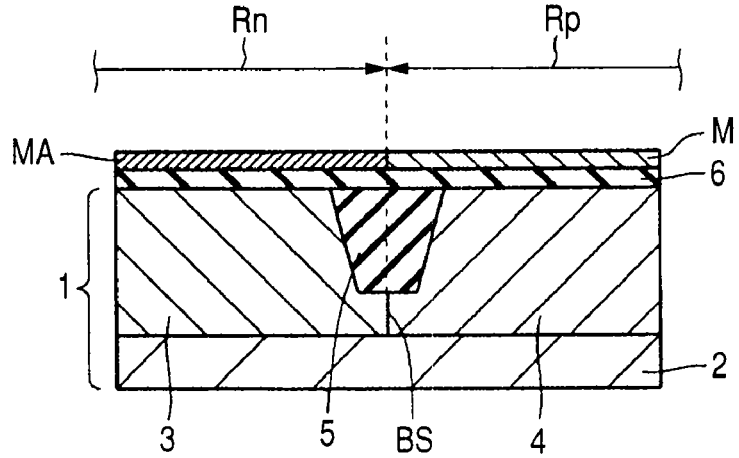
FIG. 19 is a cross-sectional view illustrating the state of each manufacturing step in the method of manufacturing a semiconductor device according to the fourth embodiment of the invention.
Figure 20:
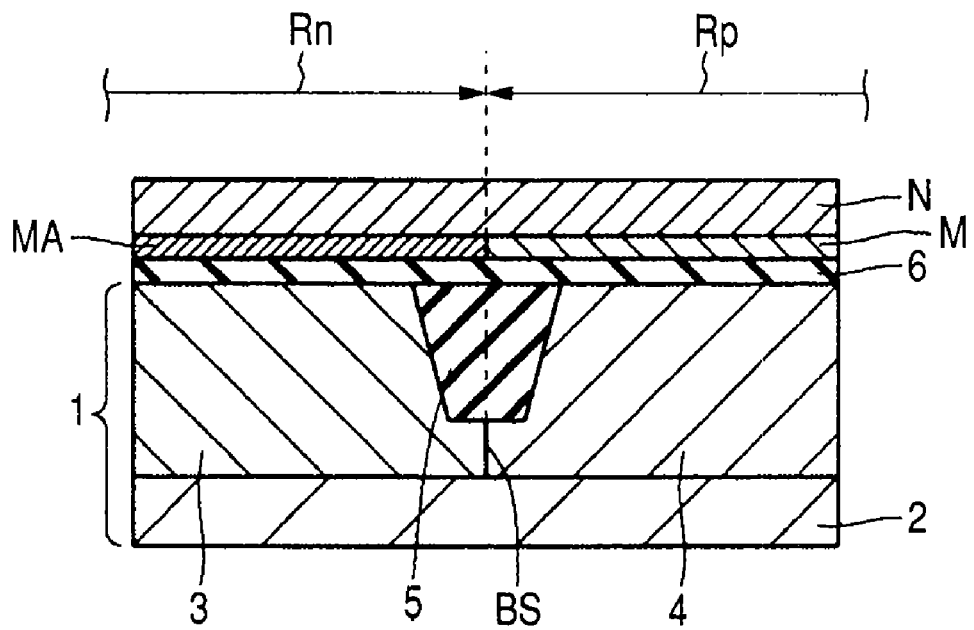
FIG. 20 is a cross-sectional view illustrating the state of each manufacturing step in the method of manufacturing a semiconductor device according to the fourth embodiment of the invention.

As illustrated in FIG. 18, an n-side cap layer 8A is formed only over the upper surface of the gate-electrode metal film M in the nFET region Rn by the method already described in the first embodiment. Heat treatment is then performed on the n-side cap layer 8A to diffuse it in a portion of the gate-electrode metal film M immediately below the cap layer to form an n-side gate-electrode metal film MA in the nFET region Rn as illustrated in FIG. 19. Then, as illustrated in FIG. 20, a second gate-electrode metal film (corresponding to a second metal film) N is formed over the entire upper surface of the n-side gate-electrode metal film MA and the gate-electrode metal film M to obtain a stack structure of these gate-electrode metal films. In this case, the thickness of the second gate-electrode metal film N is adjusted to fall within a range of from 5 to 30 nm from the empirical standpoint.

Figure 21:
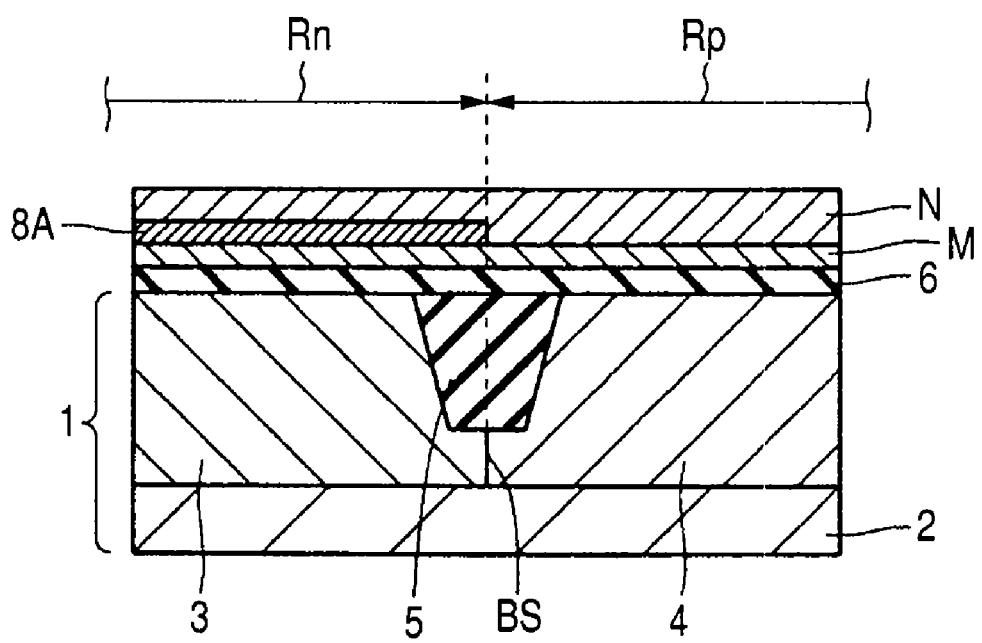
FIG. 21 is a cross-sectional view illustrating the state of each manufacturing step in the method of manufacturing a semiconductor device according to the fourth embodiment of the invention.

Alternatively, a manufacturing method described below is used to obtain the stack structure of the above-described gate-electrode metal films. Described specifically, as illustrated in FIG. 21, a second gate-electrode metal film (corresponding to a second metal film) having a thickness within a range of from 5 to 30 nm is formed over the entire upper surface of the gate-electrode metal film M so as to cover the n-side cap layer 8A. The structure illustrated in FIG. 21 is heat treated through the second gate-electrode metal film N to cause diffusion/reaction of the n-side cap layer 8A in the gate-electrode metal film M immediately therebelow to form the n-side gate-electrode metal film MA in the nFET region Rn as illustrated in FIG. 20.

Although the material of the second gate-electrode metal film N is desirably similar to that of the gate-electrode metal film M, it is not limited thereto. For example, any of metal materials (fourth materials) containing at least one element selected from the group comprised of Ti, Ta, Hf and W, and nitrides, carbides, silicides, nitride silicides, or carbonitrides of the fourth materials can be used as the material of the second gate-electrode metal film N.

Figure 22:
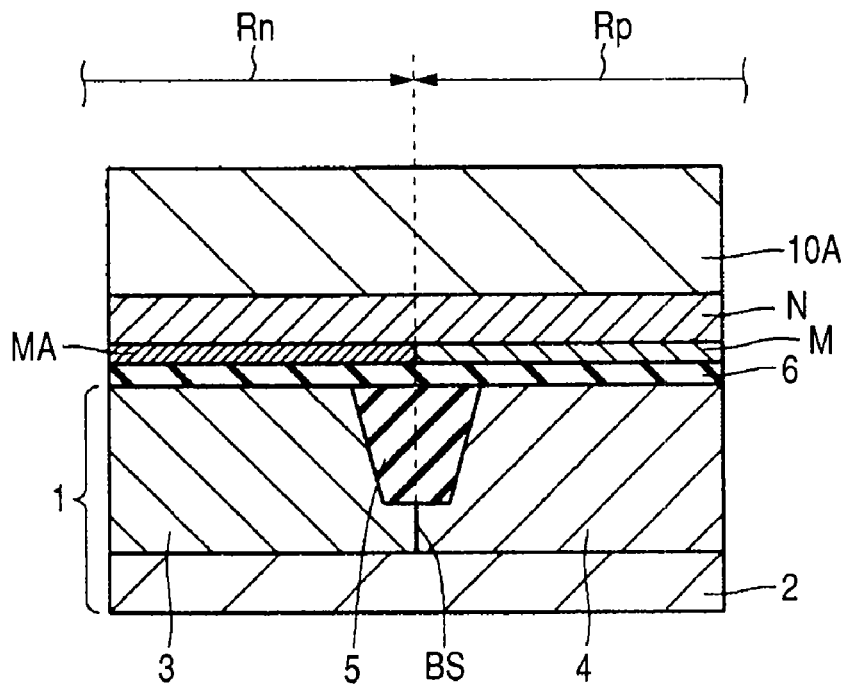
FIG. 22 is a cross-sectional view illustrating the state of each manufacturing step in the method of manufacturing a semiconductor device according to the fourth embodiment of the invention.
Figure 23:
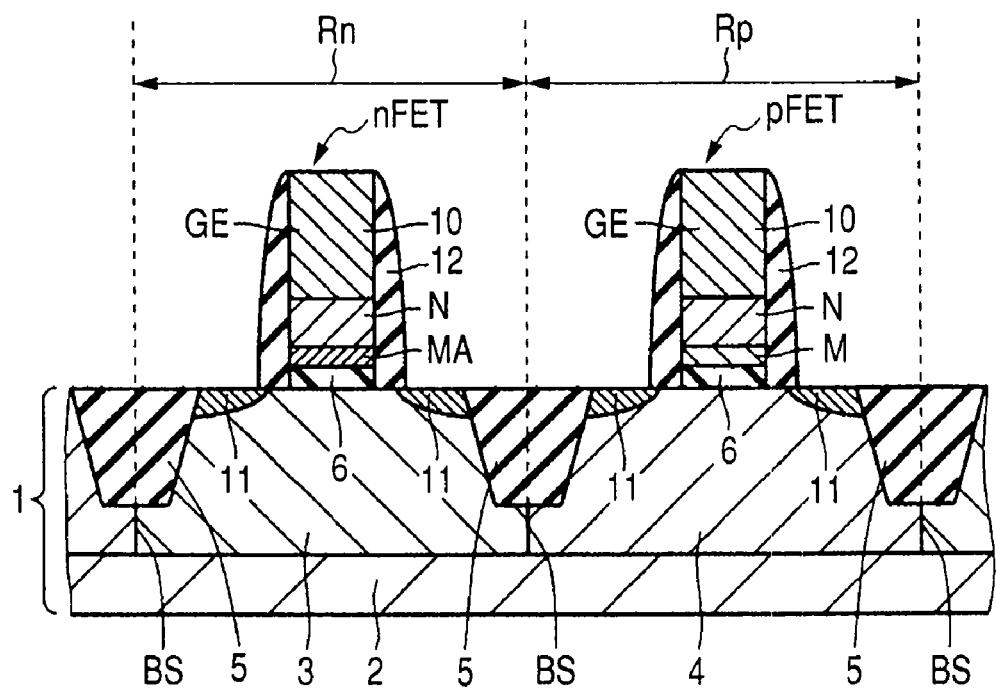
FIG. 23 is a cross-sectional view illustrating the state of each manufacturing step in the method of manufacturing a semiconductor device according to the fourth embodiment of the invention.

After formation of the second gate-electrode metal film N, a poly-Si layer 10A is stacked (a modification example does not need the formation of the poly-Si layer 10A) as illustrated in FIG. 22, followed by the gate electrode processing as described already in the first embodiment to obtain a structure as illustrated in FIG. 23. The thus-obtained structure illustrated in FIG. 23 is a dual gate electrode structure in which the gate electrode of the nFET has a stack of the n-side gate-electrode metal film MA and the second gate-electrode metal film N, and the poly-Si layer 10, while the gate electrode of the pFET has a stack of the gate-electrode metal film M and the second gate-electrode metal film N, and the poly-Si layer 10.

Ordinary process flows for CMOS formation similar to those employed above are conducted successively to complete the CMOS.

Figure 24:
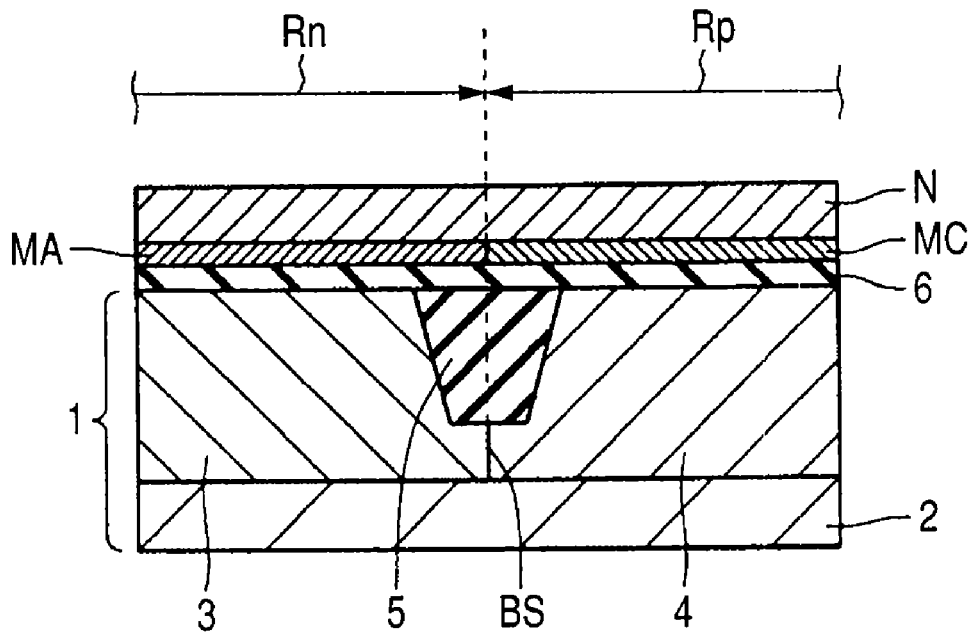
FIG. 24 is a cross-sectional view illustrating the state of each manufacturing step in the method of manufacturing a semiconductor device according to the fourth embodiment of the invention.
Figure 25:
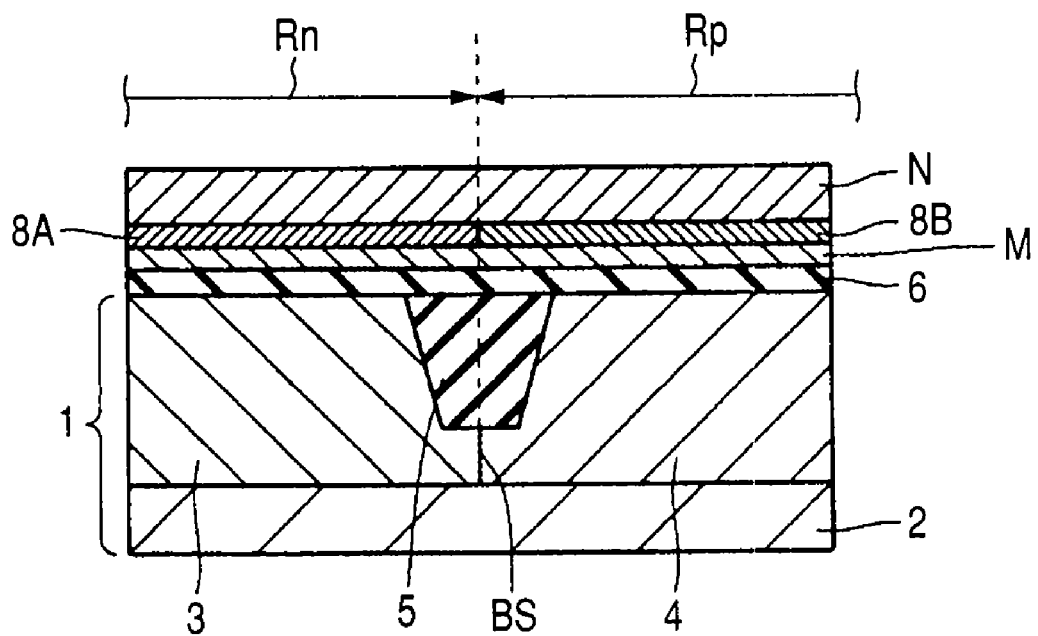
FIG. 25 is a cross-sectional view illustrating the state of each manufacturing step in the method of manufacturing a semiconductor device according to the fourth embodiment of the invention.

FIG. 24 is a cross-sectional view illustrating the state of a manufacturing step when the present embodiment is applied to the method of the third embodiment illustrated in FIGS. 13 and 14, that is, a method of forming, after formation of the n-side gate-electrode metal film MA, the second p-side cap layer 8C and diffusing it to form the p-side gate-electrode metal film MC. FIG. 25 is a cross-sectional view illustrating the state of a manufacturing step when the present embodiment is applied to the method of the third embodiment illustrated in FIG. 15, that is, the method of diffusing both the n-side cap layer 8A and the second p-side cap layer 8C to form the n-side gate-electrode metal film MA and the p-side gate-electrode metal film MC.

When the present embodiment is applied to the method of the third embodiment illustrated in FIGS. 13 and 14, an n-side gate-electrode metal film MA and a p-side gate-electrode metal film MC are formed as illustrated in FIG. 14, followed by the formation of a second gate-electrode metal film N over the entire upper surfaces of the n-side gate-electrode metal film MA and the p-side gate-electrode metal film MC as illustrated in FIG. 24.

When the present embodiment is applied to the method of the third embodiment illustrated in FIG. 15, after formation of the n-side cap layer 8A and the second p-side cap layer 8C as illustrated in FIG. 15 but prior to diffusion of the n-side cap layer 8A and the second p-side cap layer 8C, a second gate-electrode metal film N is formed over the entire upper surfaces of the n-side cap layer 8A and the second p-side cap layer 8C as illustrated in FIG. 25.

As described above, the present embodiment can provide the following advantages. First, even when the gate-electrode metal film M is relatively thin, the second gate-electrode metal film N made of a material same or different therefrom is stacked so that the height of the gate electrode GE can be stabilized by controlling the thickness of the second gate-electrode metal film N or the poly-Si layer 10. Secondly, since the metal film of the gate electrode GE can be thickened by stacking the second gate-electrode metal film N made of a material same or different from the gate-electrode metal film M, Si diffusion from the poly-Si layer 10, which is the top layer of the gate electrode, can be suppressed and fluctuations in the work function can be prevented.

Fifth Embodiment

Figure 26:
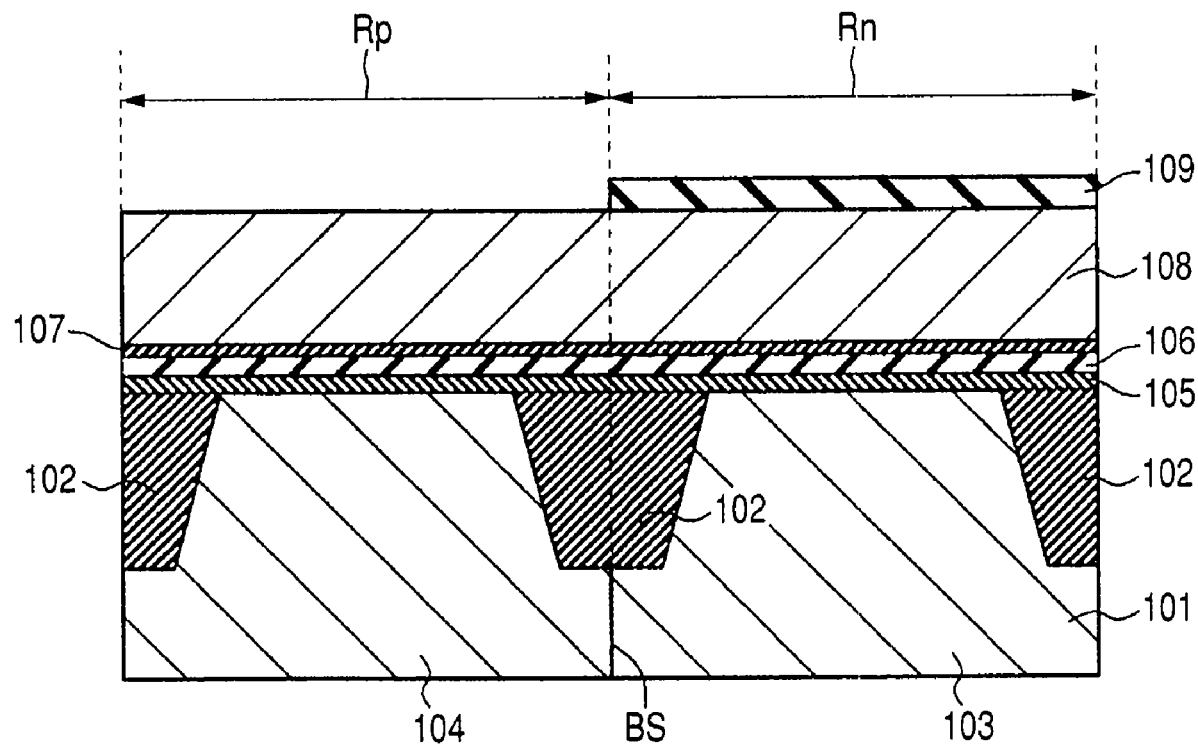
FIG. 26 is a cross-sectional view illustrating the state of each manufacturing step in a method of manufacturing a semiconductor device according to a fifth embodiment of the invention.
Figure 27:
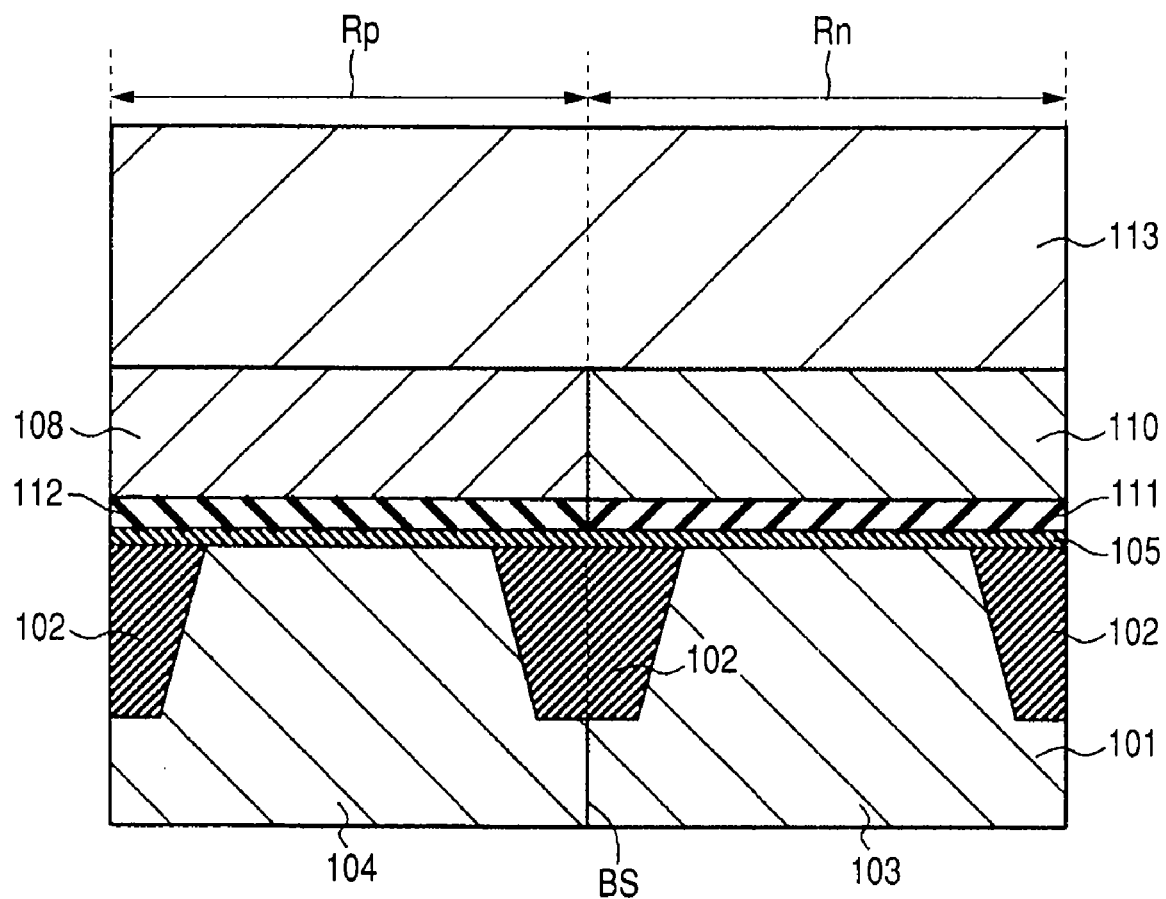
FIG. 27 is a cross-sectional view illustrating the state of each manufacturing step in the method of manufacturing a semiconductor device according to the fifth embodiment of the invention.
Figure 28:
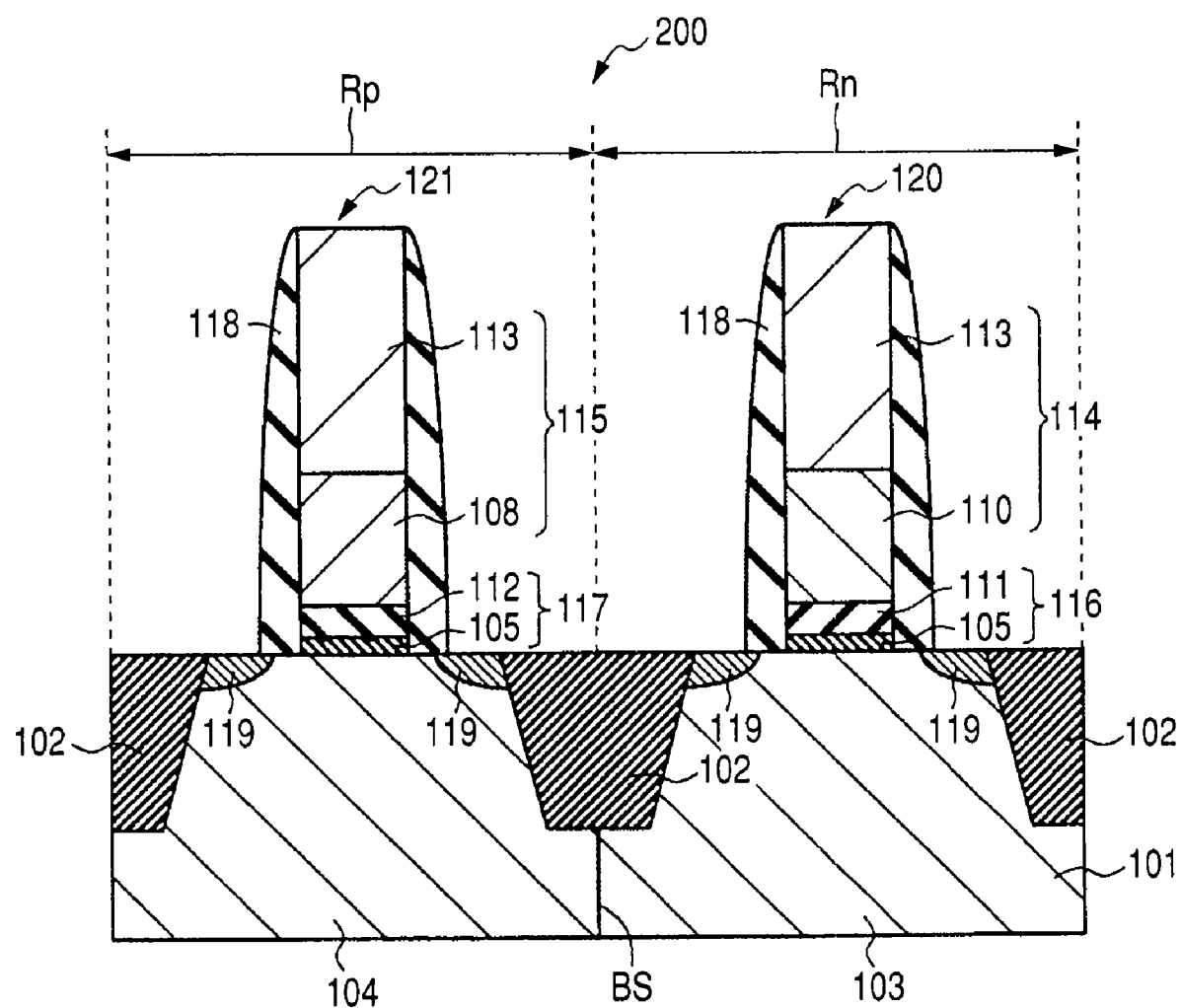
FIG. 28 is a cross-sectional view illustrating the state of each manufacturing step in the method of manufacturing a semiconductor device according to the fifth embodiment of the invention.

FIGS. 26 to 28 are cross-sectional views illustrating the state of each manufacturing step in a method of manufacturing a semiconductor device according to a fifth embodiment of the invention. Also in this embodiment, a complementary MOSFET (Complementary Metal-Oxide Semiconductor Field Effect Transistor; abbreviation: CMOSFET) 200 is manufactured as a semiconductor device. The CMOSFET 200 has both an n type MOS transistor which is an n channel MOS transistor and a p type MOS transistor which is a p channel MOS transistor. The n type MOS transistor is more specifically an nMOSFET 120, while the p type MOS transistor is more specifically a pMOSFET 121. In this embodiment, the nMOSFET 120 corresponds to a first conductivity type semiconductor element and the pMOSFET 121 corresponds to a second conductivity type semiconductor element. FIGS. 26 to 28 omit therefrom the p type semiconductor layer 2 illustrated above in FIGS. 1 to 25 to facilitate understanding.

FIG. 26 is a cross-sectional view illustrating the state after completion of the formation of a second insulating-film cap layer 109. As illustrated in FIG. 26, an element isolation film 102, a p well 103, and an n well 104 extending from the surface of a silicon (Si) substrate 101 which is a semiconductor substrate toward the inside of the Si substrate 101 are formed successively in accordance of the production flow of a conventional CMOS. The element isolation film 102 is an insulating film for partitioning an nMOSFET region Rn which is a first conductivity type element region from a pMOSFET region Rp which is a second conductivity type element region and is interposed between the p well 103 formed in the nMOSFET region Rn and the n well 104 formed in the pMOSFET region Rp. A boundary surface BS between the p well 103 and the n well 104 is formed immediately below the bottom surface of the element isolation film 102. This boundary surface BS corresponds to a boundary between the nMOSFET region Rn and the pMOSFET region Rp.

Then, an interface layer 105 is formed over the entire upper surface of the Si substrate 101 from the surface side on which the element isolation film 102, the p well 103, and the n well 104 are formed. The interface layer 105 is formed to prevent an interfacial reaction between the Si substrate 101 and a gate-insulating-film insulating layer 106 which will be described later and it is made of, for example, an insulation material. The interface layer 105 is made of, for example, a silicon oxide film ($SiO_2$) or a silicon oxynitride film (SiON) and is formed by oxidation or oxidation and nitridation of the Si substrate 101.

As the gate-insulating-film insulating layer (which may hereinafter be called "insulating layer", simply) 106, for example, a hafnium silicon oxynitride (HfSiON) layer is formed over the entire upper surface of the interface layer 105. The material of the gate-insulating-film insulating layer 106 is not limited to HfSiON and an insulating material can be used. Specific examples of the material include high-dielectric-constant materials such as oxides, oxynitrides, or oxynitride silicides of hafnium (Hf) or zirconium (Zr), in short, high-k materials. The material of the insulating layer 106 is not limited to high-k materials and insulating materials other than high-k materials, such as SiON, are also usable.

An aluminum (Al) oxide film with a thickness of, for example, 0.5 nm is then stacked as a first insulating-film cap layer 107 over the insulating layer 106. The first insulating-film cap layer 107 has a thickness selected from a range of 0.1 nm or greater but not greater than 2 nm. The first insulating-film cap layer 107 is formed over the entire upper surface of the insulating layer 106, more specifically, both in the nMOSFET region Rn and the pMOSFET region Rp.

As a material of the first insulating-film cap layer 107, materials containing Al as an element are usable. The first insulating-film cap layer 107 corresponds to a first element layer and Al corresponds to a first element. The material of the first insulating-film cap layer 107 is not limited to the Al-containing material, but is preferably the Al-containing material. When a material having also a property as a gate insulating film, for example, an Al oxide film, is selected as the material of the first insulating-film cap layer 107 as in the present embodiment, the first insulating-film cap layer 107 may be formed below the insulating layer 106, though different from the present embodiment. In this case, the first insulating-film cap layer 107 is formed over the Si substrate 101 prior to the formation of the insulating layer 106.

After the formation of the first insulating-film cap layer 107, it may be heat treated in an oxygen atmosphere or a nitrogen atmosphere, depending on the using purpose. A gate-electrode metal film 108 is then formed over the entire upper surface of the first insulating-film cap layer 107 by sputtering or the like. The thickness of the gate-electrode metal film 108 is adjusted empirically to fall within a range of from 2 to 30 nm, because the thickness of the gate-electrode metal film 108 cannot be controlled easily when it is set at too small thickness, while when it is set at too large thickness, the material of a second insulating-film cap layer 109 which will be described later cannot be diffused sufficiently. In the present embodiment, a titanium nitride (TiN) film with a thickness of 10 nm is formed as the gate-electrode metal film 108.

The gate-electrode metal film 108 is made of a conductive material and corresponds to an electrode conductive layer. In addition, the gate-electrode metal film 108 corresponds to a first metal film and corresponds to the gate-electrode metal film M in the above-described first to fourth embodiments. The conductive material configuring the gate-electrode metal film 108 is, for example, TiN. The conductive material configuring the gate-electrode metal film 108 is not limited to TiN, but a material containing at least one element selected from the group comprised of titanium (Ti), tantalum (Ta), Hf, and tungsten (W) (which will hereinafter be called "first material") can be used. Specific examples include first materials composed of one or more elements selected from Ti, Ta, Hf, and W, and nitrides of the first materials, carbides of the first materials, silicides of the first materials, nitride silicides of the first materials, and carbonitrides of the first materials. One or more materials selected from these materials can be used.

As the second insulating-film cap layer 109, for example, a lanthanum (La) oxide film is deposited over the entire upper surface of the gate-electrode metal film 108. The thickness of the second insulating-film cap layer 109 is selected from a range of 0.1 nm or greater but not greater than 10 nm, more specifically, from a range of 0.5 nm or greater but not greater than 2 nm. Then, a photoresist mask is formed over the entire upper surface of a portion of the resulting second insulating-film cap layer 109 belonging to the nMOSFET region Rn. With this photoresist mask as a mask, all the portion of the second insulating-film cap layer 109 belonging to the pMOSFET region Rp is removed by wet etching or dry etching. By this step, the second insulating-film cap layer 109 is formed over the entire surface of only a portion of the gate-electrode metal film 108 belonging to the nMOSFET region Rn. The photoresist mask is then removed because it becomes unnecessary.

For the second insulating-film cap layer 109, a La-containing material such as La oxide is used. The second insulating-film cap layer 109 corresponds to a second element layer and La corresponds to a second element. The second insulating-film cap layer 109 functions as a first cap layer. For example, it also functions as the n-side cap layer 8A in the first embodiment.

In the present embodiment, the first element contained in the first cap layer 7 is Al as described above so that the first element contained in the first insulating-film cap layer 107 is different from the second element contained in the second insulating-film cap layer 109. The second element is not limited to La and at least one of the Group II and Group III elements of the periodic table can be used. The Group II elements in the periodic table (which may hereinafter be called "Group II elements", simply) are previously Group IIA elements and may also be called "alkaline earth metal elements". Group III elements in the periodic tale (which may hereinafter be called "Group III elements", simply) are previously Group IIIA elements and may also be called "rare earth elements".

The material of the second insulating-film cap layer 109 is not limited to the La-containing materials and examples include materials containing at least one rare earth element such as La, dysprosium (Dy), ytterbium (Yb), or erbium (Er) and materials containing at least one alkaline earth metal element such as magnesium (Mg) or strontium (Sr). Specific examples include materials made of a rare earth element, and oxide materials thereof, and materials made of an alkaline earth metal element and oxide materials thereof. One or more materials selected from these materials may also be used as the material for the second insulating-film cap layer 109.

FIG. 27 is a cross-sectional view illustrating a state after completion of the formation of a polycrystalline silicon layer 113 over the gate-electrode metal film 108 and an element-added metal layer 100. After formation of the second insulating-film cap layer 109 as illustrated in FIG. 26, the Si substrate 101 having each layer formed thereover is heat treated, whereby the insulating layer 106 and the gate-electrode metal film 108 are heat treated together with the first and the second insulating-film cap layers 107 and 109. This heat treatment causes a reaction between the second insulating-film cap layer 109 and the gate-electrode metal film 108 and diffusion of the material of the second insulating-film cap layer 109 into the gate-electrode metal film 108 belonging to the nMOSFET region Rn, that is, the gate-electrode metal film 108 located immediately below the second insulating-film cap layer 109, whereby an element-added metal layer 110 containing the material of the second insulating-film cap layer 109, more specifically, the second element contained in the second insulating-film cap layer 109 is formed in the nMOSFET region Rn as illustrated in FIG. 27. In the present embodiment, La, which is the second element contained in the second insulating-film cap layer 109, is diffused into the gate-electrode metal film 108 and the element-added metal layer 110 containing La is formed. The element-added metal layer 110 corresponds to an element-added conductive layer. The heat treatment of the first and second insulating-film cap layers 107 and 109, the insulating layer 106, and the gate-electrode metal film 108 corresponds to the first heat treatment.

The material of the second insulating-film cap layer 109 is also diffused into the insulating layer 106 located below the second insulating-film cap layer 109, that is, into the insulating layer 106 belonging to the nMOSFET region Rn. The material of the first insulating-film cap layer 107 is diffused into the insulating layer 106 located immediately below the first insulating-film cap layer 107, that is, into the insulating layer 106 belonging to the nMOSFET region Rn and the pMOSFET region Rp. The insulating layer 106 belonging to the nMOSFET region Rn becomes a first element-added insulating layer 111 as a result of the addition of the materials of the first and second insulating-film cap layers 107 and 109, more specifically, the first element contained in the first insulating-film cap layer 107 and the second element contained in the second insulating-film cap layer 109. In the present embodiment, since the insulating layer 106 is a HfSiON layer, a HfSiON layer added with Al, that is, the first element contained in the first insulating-film cap layer 107 and La, that is, the second element contained in the second insulating-film cap layer 109 is formed as the first element-added insulating layer 111.

The element-added metal layer 110 and the first element-added insulating layer 111 can have a desired composition by controlling the thickness of the gate-electrode metal film 108, the thickness of the second insulating-film cap layer 109, time to carry out heat treatment, and heat treatment conditions such as heat treatment temperature and heat treatment time.

The insulating layer 106 belonging to the pMOSFET region Rp becomes a second element-added insulating layer 112 as a result of addition of the material of the first insulating-film cap layer 107, specifically, the first element contained in the first insulating-film cap layer 107. In the present embodiment, the insulating layer 106 is an HfSiON layer so that a HfSiON layer added with Al, that is, the first element contained in the first insulating-film cap layer 107 is formed as the second element-added insulating layer 112.

The gate-electrode metal film 108 belonging to the pMOSFET region Rp does not have, thereover, the second insulating-film cap layer 109 so that diffusion of the material of the second insulating-film cap layer 109 into the gate-electrode metal film 108 does not occur in the pMOSFET region Rp and the gate-electrode metal film 108 remains as is. This gate-electrode metal film 108, which has remained, corresponds to an electrode conductive layer.

In the present embodiment, the first and second insulating-film cap layers 107 and 109 disappear by the heat treatment similar to that for the n-side cap layer 8A, the p-side cap layer 8B, and the second p-side cap layer 8C in the first to fourth embodiments. Described specifically, in the present embodiment, the first and second insulating-film cap layers 107 and 109 are made of a material added in an amount to be diffused. The entirety of the material configuring each of the first and second insulating-film cap layers 107 and 109 is diffused by heat treatment and integrated with another layer. Thus, the first and second insulating-film cap layers 107 and 109 themselves disappear. By the disappearance of the first and second insulating-film cap layers 107 and 109, the element-added metal layer 110 is exposed in the nMOSFET region Rn and the element-added metal layer 110 is present immediately above the first element-added insulating layer 111. In the pMOSFET region Rp, on the other hand, the gate-electrode metal film 108 is formed immediately above the second element-added insulating layer 112.

As illustrated in FIG. 27, a polycrystalline (poly-Si) layer 113 having a thickness within a range of from 30 nm to 120 nm is deposited over the gate-electrode metal film 108 and element-added metal layer 110. An advantage of forming the poly-Si layer 113 in this step resides in that the conventional CMOSFET formation process can be applied as is to the subsequent steps.

FIG. 28 is a cross-sectional view illustrating the state after completion of the formation of the CMOSFET 200. After formation of the poly-Si layer 113 of FIG. 27, processing for the formation of each gate electrode of the nMOSFET 120 and the pMOSFET 121 is performed by, for example, dry etching. Described specifically, in order to leave a portion of the gate electrode and layers therebelow, the poly-Si layer 113, the element-added metal layer 110, and the gate-electrode metal film 108 which will be the gate electrode, and the first element-added insulating layer 111, the second element-added insulating layer 112, and the interface layer 105 therebelow are etched.

In the present embodiment, an n-side gate electrode 114 of the nMOSFET 120 is comprised of the poly-Si layer 113 and the element-added metal layer 110, while the n-side gate insulating film 116 is comprised of the interface layer 105 and the first element-added insulating layer 111. Accordingly, the nMOSFET 120 has a gate stack structure made of the poly-Si layer 113, the element-added metal layer 110, the first element-added insulating layer 111, the interface layer 105, and the p well 103.

A p-side gate electrode 115 of the pMOSFET 121 is comprised of the poly-Si layer 113 and the gate-electrode metal film 108, while the p-side gate insulating film 117 is comprised of the interface layer 105 and the second element-added insulating layer 112. Accordingly, the pMOSFET 121 has a gate stack structure made of the poly-Si layer 113, the gate-electrode metal film 108, the second element-added insulating layer 112, the interface layer 105, and the n well 104.

After formation of the n-side gate electrode 114 and the p-side gate electrode 115, the conventional process flows for CMOSFET formation are conducted successively to form the nMOSFET 120 and the pMOSFET 121, leading to the formation of the CMOSFET 200. Described specifically, in the nMOSFET region Rn, a sidewall spacer 118 made of, for example, $SiO_2$ is formed over both of the side walls of the n-side gate electrode 114 and the n-side gate insulating film. In the pMOSFET region Rp, a sidewall spacer 118 made of, for example, $SiO_2$ is formed over both of the side walls of the p-side gate electrode 115 and the p-side gate insulating film 117. The sidewall spacer 118 is formed by forming a $SiO_2$ film, for example, by chemical vapor deposition (abbreviation: CVD) and then etching back by anisotropic etching. Then, a source/drain region 119 is formed by ion implantation, whereby the CMOSFET 200 is formed.

In the CMOSFET 200 of the present embodiment thus formed, the effective work function of the n-side gate electrode 114 of the nMOSFET 120 is from 4.0 eV to 4.3 eV, while the effective work function of the p-side gate electrode 115 of the pMOSFET 121 is from 4.9 eV to 5.2 eV. The term "effective work function of a gate electrode" as used herein means a work function of a gate electrode at the interface with a gate insulating film and it is discriminated from the "work function" which the material configuring the gate electrode originally has. The effective work function of the gate electrode can be determined from a flat band voltage deducted from the C-V characteristics, that is, capacitance-gate voltage characteristics of a MOS type capacitor in the nMOSFET 120 and pMOSFET 121 thus obtained.

According to the present embodiment, the interface layer 105, the insulating layer 106, the first insulating-film cap layer 107, and the gate-electrode metal film 108 are formed successively over the Si substrate 101 in the nMOSFET region Rn and the pMOSFET region Rp. After formation of the gate-electrode metal film 108, the second insulating-film cap layer 109 is formed over the gate-electrode metal film 108 in the nMOSFET region Rn. Together with the first insulating-film cap layer 107 and the second insulating-film cap layer 109 thus formed, the insulating layer 106 and the gate-electrode metal film 108 are heat treated. This heat treatment enables diffusion of the first element, more specifically Al, contained in the first insulating-film cap layer 107 into the insulating layer 106 below the first insulating-film cap layer 107. In addition, it enables diffusion of the second element, more specifically La, contained in the second insulating-film cap layer 109 into the gate-electrode metal film 108 below the second insulating-film cap layer 109 and further, into the insulating layer 106 below the gate-electrode metal film 108.

As a result, the insulating layer 106 containing the first and second elements, more specifically, Al and La can be formed in the nMOSFET region Rn, while in the pMOSFET region Rp, the insulating layer 106 containing the first element, more specifically Al can be formed, whereby the threshold voltage of the nMOSFET 120 and the threshold voltage of the pMOSFET 121 can be controlled respectively. Thus, the control range of the threshold voltage can be widened.

Further in the present embodiment, the second insulating-film cap layer 109 is formed not over the surface of the insulating layer 106 but over the surface of the gate-electrode metal film 108 and the second insulating-film cap layer 109 and the insulating layer 106 have therebetween the gate-electrode metal film 108 so that etching of the second insulating-film cap layer 109 for leaving it only in the nMOSFET region Rn is performed over the surface of the gate-electrode metal film 108. In other words, removal of the second insulating-film cap layer 109 belonging to the pMOSFET region Rp by etching is performed not over the insulating layer 106 but over the surface of the gate-electrode metal film 108 in the present embodiment. Damage of the insulating layer 106 due to etching can therefore be prevented so that the deterioration of the insulating layer 106 can be prevented and deterioration of the n-side gate insulating film 116 and the p-side gate insulating film 117 can also be prevented.

Since the present embodiment does not require a step of peeling off a gate electrode on one side to separately form the n-side gate insulating film 116 which is a gate insulating film of the nMOSFET region Rn and the p-side gate insulating film 117 which is a gate insulating film of the pMOSFET region Rp, the gate insulating films 116 and 117 are free from deterioration.

Both reduction of the reliability of the insulating layer 106 due to the deterioration and reduction of the reliability of the n-side gate insulating film 116 and the p-side gate insulating film 117 can be prevented so that a highly reliable device can be obtained. In short, the present embodiment enables to prevent reduction of the liability of the insulating layer 106 and reduction of the reliability of the n-side gate insulating film 116 and the p-side gate insulating film 117, and at the same time, widen the control range of a threshold voltage.

In the present embodiment, the n-side gate electrode of the nMOSFET 120 is composed of the poly-Si layer 113 and the element-added metal layer 110 and the p-side gate electrode 115 of the pMOSFET 121 is composed of the poly-Si layer 113 and the gate-electrode metal film 108. Thus, the gate electrodes 114 and 115 of the nMOSFET 120 and the pMOSFET 121 have, as the upper layer thereof, the poly-Si layer 113 and use the same main material for their lower metal layers, which facilitates processing of the gate electrodes 114 and 115. Even if the n-side gate electrode and the p-side gate electrode 115 are obtained by simultaneous processing, the n-side and p-side gate electrodes 114 and 115 having desired shapes can therefore be formed.

According to the present embodiment, a highly reliable semiconductor device 200 equipped with the nMOSFET and the pMOSFET 121 have desired properties, respectively, can be manufactured easily.

In the present embodiment, the first insulating-film cap layer 107 is made of an Al-containing material such as an Al oxide and contains Al as the first element so that the p-side gate insulating film 117 in the pMOSFET region Rp contains Al. As a result, the threshold voltage can be controlled to that suited for the pMOSFET 121. Accordingly, the first insulating-film cap layer 107 is preferably made of an Al-containing material as in the present embodiment.

In the present embodiment, the second insulating-film cap layer 109 is made of a La-containing material such as La oxide. Described specifically, the second insulating-film cap layer 109 is made of a material containing a Group III element such as La and contains a Group III element as the second element so that the n-side gate insulating film 116 in the nMOSFET region Rn contains a rare earth element. As a result, the threshold voltage can be controlled to that suited for the nMOSFET 120. A similar effect can be achieved when a material containing a Group II element as the material of the second insulating-film cap layer 109 and the threshold voltage of the nMOSFET 120 can be controlled to that suited therefor. Accordingly, the second insulating-film cap layer 109 is preferably composed of a material containing at least one of Group III elements and Group II elements.

In the present embodiment, the first insulating-film cap layer 107 is made of an Al-containing material and the second insulating-film cap layer 109 is made of a La-containing material so that the n-side gate insulating film 116 in the nMOSFET region Rn contains both Al and La. The contents of Al and La in the n-side gate insulating film 116 can be controlled by the thicknesses of the first insulating-film cap layer 107 and the second insulating-film cap layer 109 and heat treatment conditions so that the threshold voltage of the nMOSFET 120 can be controlled to that particularly suited therefor.

In the present embodiment, the gate-electrode metal film 108 is made of any of first materials containing at least one element selected from the group comprised of titanium (Ti), tantalum (Ta), hafnium (Hf), and tungsten (W), and nitrides of the first materials, carbides of the first materials, silicides of the first materials, nitride silicides of the first materials, and carbonitrides of the first materials. In the gate-electrode metal film 108 made of the above-described material, the above-described material of the second insulating-film cap layer 109 can be diffused so that it is possible to prevent the diffusion of the material of the second insulating-film cap layer 109 from being disturbed by the gate-electrode metal film 108. As a result, the material of the second insulating-film cap layer 109 can be diffused completely in the insulating layer 106 of the nMOSFET region Rn so that the threshold voltage of the nMOSFET 120 can be controlled to that suited therefor.

In the present embodiment, the poly-Si layer 113 is formed over the gate-electrode metal film 108 and the element-added metal layer 110. This enables application of the conventional CMOSFET formation process to the subsequent steps as is so that the threshold voltage of each of the nMOSFET 120 and the pMOSFET 121 can be controlled to that suited therefor without making the manufacturing steps cumbersome.

In the present embodiment, the first insulating-film cap layer 107 has a thickness of 0.1 nm or greater but not greater than 2 nm. This enables diffusion of an adequate amount of the first element, that is, Al contained in the first insulating-film cap layer 107 into the insulating layer 106 in the nMOSFET region Rn and the pMOSFET region Rp, whereby the threshold voltage of each of the nMOSFET 120 and the pMOSFET 121 can be controlled to that suited therefor more reliably.

In the present embodiment, the second insulating-film cap layer 109 has a thickness of 0.1 nm or greater but not greater than 10 nm. This enables diffusion of an adequate amount of the second element, that is, La contained in the second insulating-film cap layer 109 into the insulating layer 106 in the nMOSFET region Rn, whereby the threshold voltage of the nMOSFET 120 can be controlled to that suited therefor more reliably.

In the nMOSFET 120 of the present embodiment thus formed, the first element-added insulating layer 111 configuring the n-side gate insulating film 116 contains Al which is the first element derived from the first insulating-film cap layer 107 and La which is the second element derived from the second insulating-film cap layer 109; and the element-added metal layer 110 over the first element-added insulating layer 111 contains La which is the second element derived from the second insulating-film cap layer 109. In the pMOSFET 121, the second element-added insulating layer 112 configuring the p-side gate insulating film 117 contains Al which is the first element derived from the first insulating-film cap layer 107 and has, over the second element-added insulating layer 112, the gate-electrode metal film 108 containing neither Al which is the first element nor La which is the second element.

Such a structure enables to achieve the nMOSFET 120 and the pMOSFET 121 equipped with the gate electrodes 114 and 115 having an effective work function suited for them, respectively. Described specifically, the effective work function of the n-side gate electrode 114 in the nMOSFET 120 can be adjusted to from 4.0 eV to 4.3 eV, while the effective work function of the p-side gate electrode 115 in the pMOSFET 121 can be adjusted to from 4.9 eV to 5.2 eV. Accordingly, the nMOSFET 120 and the pMOSFET 121 having suitably adjusted threshold voltages, respectively, can be achieved.

Since the first and second element-added insulating layers 111 and 112 can be formed without etching over the gate-insulating-film insulating layer 106 which will be the first and second element-added insulating layers 111 and 112, deterioration in the manufacturing procedure can be prevented and reduction in reliability can be prevented. The semiconductor device 200 which is equipped with the nMOSFET 120 and the pMOSFET 121 having desired properties, respectively, and at the same time, is highly reliable can be achieved.

In the present embodiment as described above, the first insulating-film cap layer 107 is formed over the insulating layer 106. When, as in the present embodiment, the material of the first insulating-film cap layer 107 has a property as a gate insulating film, for example, an Al oxide, it may be inserted between the Si substrate 101 and the insulating layer 106. In this case, the material of the first insulating-film cap layer 107 is diffused by heat treatment into the insulating layer 106 above the first insulating-film cap layer 107.

The heat treatment step for diffusing elements contained in the first and second insulating-film cap layers 107 and 109 may be integrated with another manufacturing step. Described specifically, the elements contained in the first and second insulating-film cap layers 107 and 109 may be diffused by making use of heat applied upon formation of the polycrystalline silicon layer 113 or diffused in a step after formation of the polycrystalline silicon layer 113, for example, an activation annealing step. The heat diffusion step can then be omitted. When heat treatment is conducted after formation of the polycrystalline silicon layer 113 prior to heat diffusion, however, the material of the second insulating-film cap layer 109 may be diffused excessively into the polycrystalline silicon layer 113 but not diffused into the gate electrode metal layer 8, though depending on the material of the second insulating-film cap layer 109. It is therefore preferred to carry out the heat treatment step prior to the formation of the polycrystalline silicon layer 113 as in the present embodiment.

Sixth Embodiment

Figure 29:
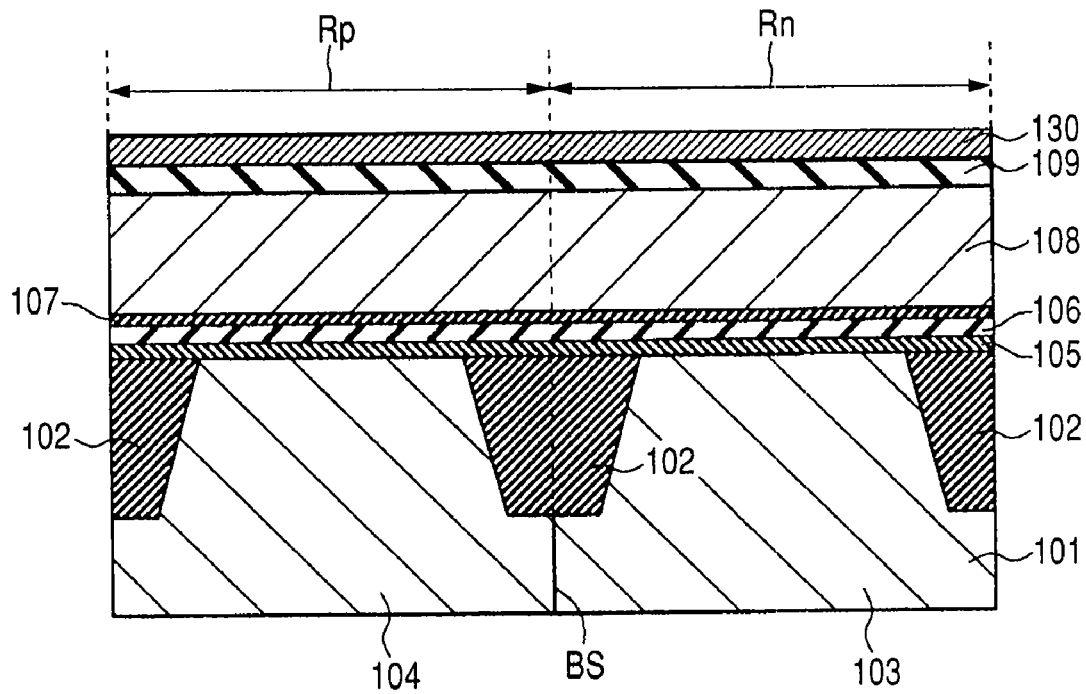
FIG. 29 is a cross-sectional view illustrating the state of each manufacturing step in a method of manufacturing a semiconductor device according to a sixth embodiment of the invention.

A method of manufacturing a semiconductor device according to a sixth embodiment of the invention will next be described. FIGS. 29 to 33 are cross-sectional views illustrating the state of each step in the method of manufacturing a semiconductor device according to the sixth embodiment of the invention. In the present embodiment, as in the fifth embodiment, a CMOSFET 210 is formed as the semiconductor device. FIG. 29 is a cross-sectional view illustrating the state of the semiconductor device after completion of the formation of a protective layer 130. FIGS. 29 to 33 omit therefrom the p type semiconductor layer 2 illustrated above in FIGS. 1 to 25 to facilitate understanding.

As in the above-described fifth embodiment, after successive formation of an interface layer 105, an insulating layer 106, a first insulating-film cap layer 107, and a gate-electrode metal film 108 over the entire surface of a Si substrate 101 from the surface side on which an element isolation film 102, a p well 103, and an n well 104 have been formed, a second insulating-film cap layer 109 is formed over the entire upper surface of the gate-electrode metal film 108. In the present embodiment, a material containing a rare earth element such as La oxide (which will hereinafter be called "rare earth material") is used as the material of the second insulating-film cap layer 109. When the second insulating-film cap layer 109 contains a rare earth material having a deliquescent property, there is a fear of deterioration of the second insulating-film cap layer due to contact with water or atmosphere.

In the present embodiment, in order to prevent deterioration of the second insulating-film cap layer 109, a titanium nitride (TiN) film is formed as a protective layer 130 over the entire upper surface of the second insulating-film cap layer 109 after deposition of the second insulating-film cap layer 109. In order to prevent deterioration of the second insulating-film cap layer 109 more completely, it is desired to form the protective layer 130 successively after deposition of the second insulating-film cap layer 109 by using, for example, atomic layer chemical vapor deposition (abbreviation: ALCVD) without exposing the second insulating-film cap layer to the atmosphere. However, the formation step of the protective layer is not limited to it.

The protective layer 130 may be made of a material same or different from that of the gate-electrode metal film 108. In the present embodiment, the protective layer 130 and the gate-electrode metal film 108 are made of the same material, more specifically, TiN. Specific examples of the material of the protective layer 130 include, in addition to TIN, first materials containing at least one element selected from Ti, Ta, Hf, and tungsten (W), nitrides of the first materials, carbides of the first materials, silicides of the first materials, nitride silicides of the first materials, and carbonitrides of the first materials. In addition, the material of the protective layer 130 may be silicon (Si) or an insulating material. One or more materials selected from the above materials are usable.

Figure 30:
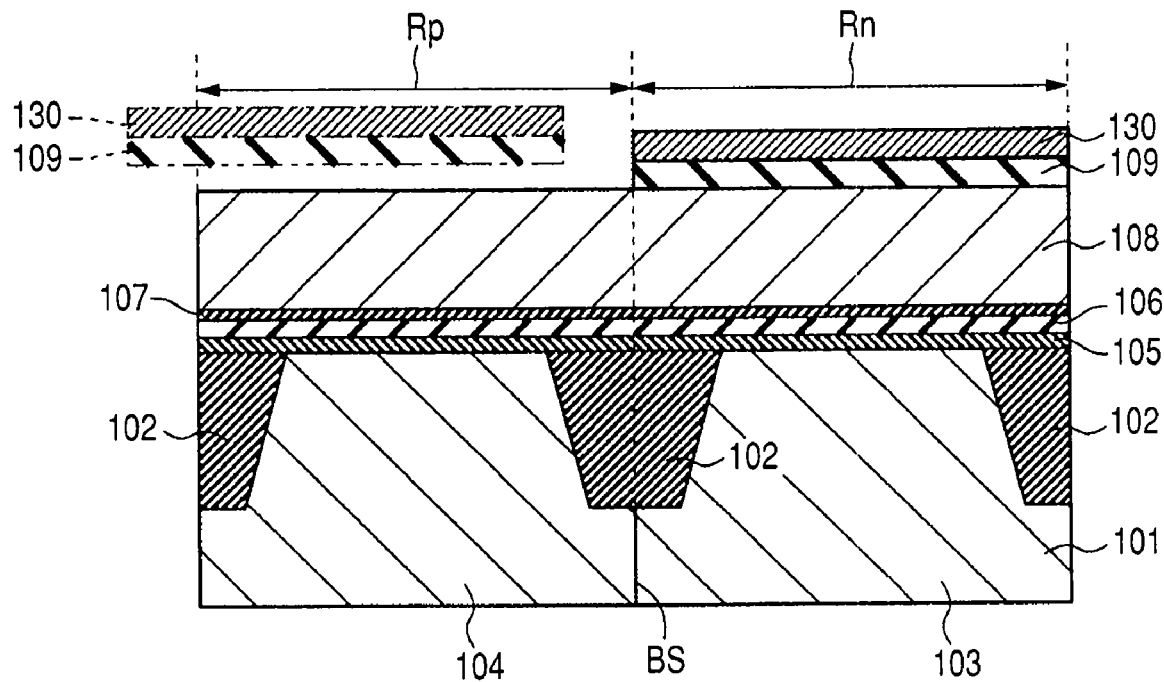
FIG. 30 is a cross-sectional view illustrating the state of each manufacturing step in the method of manufacturing a semiconductor device according to the sixth embodiment of the invention.

FIG. 30 is a cross-sectional view illustrating the state at the stage of removal of the protective layer 130 and the second insulating-film cap layer 109 from the pMOSFET region Rp. After formation of the protective layer 130, patterning is conducted to leave only the protective layer 130 of the nMOSFET region Rn by photolithography. With the remaining protective layer 130 in the nMOSFET region Rn as a mask, the second insulating-film cap layer 109 is removed from the pMOSFET region Rp by dry etching. The protective layer 130 and the second insulating-film cap layer 109 in the pMOSFET region Rp may be removed simultaneously by wet etching.

Figure 31:
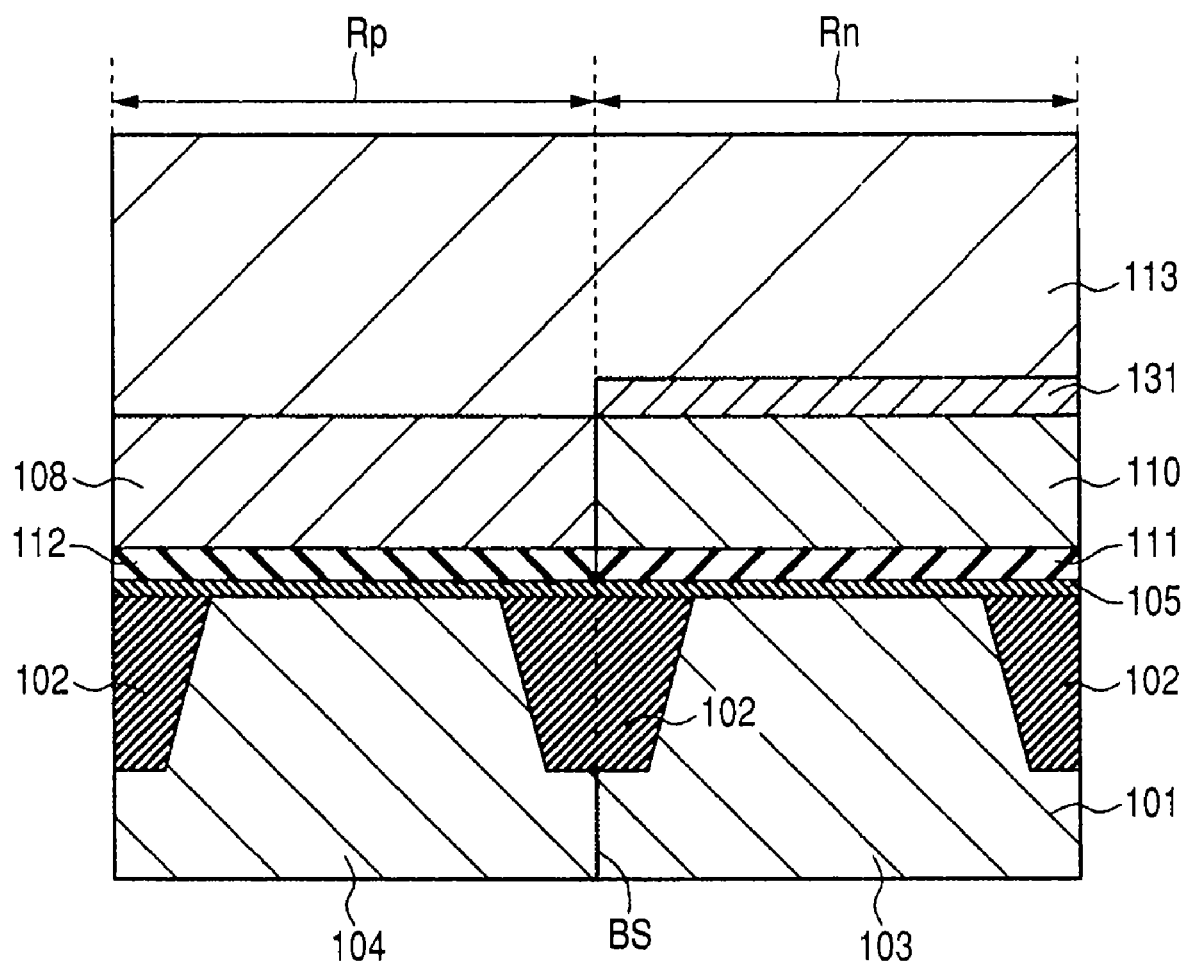
FIG. 31 is a cross-sectional view illustrating the state of each manufacturing step in the method of manufacturing a semiconductor device according to the sixth embodiment of the invention.

FIG. 31 is a cross-sectional view illustrating the state after completion of the formation of a poly-Si layer 113 over the gate-electrode metal film 108 and an element-added protective layer 131. After removal of the protective layer 130 and the second insulating-film cap layer 109 from the pMOSFET region Rp, heat treatment is conducted to react the second insulating-film cap layer 109 with the gate-electrode metal film 108 and diffuse the material of the second insulating-film cap layer 109 into the gate-electrode metal film 108 belonging to the nMOSFET region Rn, in other words, the gate-electrode metal film 108 located immediately below the second insulating-film cap layer 109. As a result, in the nMOSFET region Rn, an element-added metal layer 110 obtained by adding the material of the second insulating-film cap layer 109 to the gate-electrode metal film 108 is formed as illustrated in FIG. 31. In the present embodiment, the material of the second insulating-film cap layer 109, La, is diffused into the gate-electrode metal film 108 to form the La-added metal layer 110.

Further, the second insulating-film cap layer 109 reacts also with the protective layer 130. By the reaction, the material of the second insulating-film cap layer 109 is diffused into the protective layer 130 belonging to the nMOSFET region Rn. As illustrated in FIG. 31, an element-added protective layer 131, which is obtained by adding the material of the second insulating-film cap layer 109 to the protective layer 130, is formed in the nMOSFET region Rn. In the present embodiment, the material of the second insulating-film cap layer 109, La, is diffused into the protective layer 130 to form the La-added protective layer 131. In the present embodiment, the protective layer 130 and the gate-electrode metal film 108 are made of the same material, more specifically, a conductive material such as TiN so that the element-added protective layer 131 has conductivity and it corresponds to another element-added conductive layer.

Moreover, as in the fifth embodiment, the material of the second insulating-film cap layer 109 is also diffused into the insulating layer 106 located below the second insulating-film cap layer 109, that is, the insulating layer 106 belonging to the nMOSFET region Rn. On the other hand, the material of the first insulating-film cap layer 107 is diffused into the insulating layer 106 located immediately below the first insulating-film cap layer 107, that is, the insulating layer 106 belonging to the nMOSFET region Rn and the pMOSFET region Rp. By the above-described diffusion, the insulating layer 106 belonging to the nMOSFET region Rn becomes a first element-added insulating layer 111 by the addition the materials of the first and the second insulating-film cap layers 107 and 109. In the present embodiment, since the insulating layer 106 is made of HfSiON, a HfSiON layer added with Al, which is the material of the first insulating-film cap layer 107, and La, which is the material of the second insulating-film cap layer 109, is formed as the first element-added insulating layer 111.

The element-added protective layer 131, the element-added metal layer 110, and the first element-added insulating layer 111 can each have a desired composition by controlling the thickness of the gate-electrode metal film 108, the thickness of the second insulating-film cap layer 109, time to carry out heat treatment, and heat treatment conditions such as heat treatment temperature and heat treatment time.

As in the fifth embodiment, the insulating layer 106 belonging to the pMOSFET region Rp becomes a second element-added insulating layer 112 by the addition of the material of the first insulating-film cap layer 107. In the present embodiment, since the insulating layer 106 is a HfSiON layer, the second element-added insulating layer 112 is formed as a HfSiON layer containing Al, which is the material of the first insulating-film cap layer 107.

Also in the present embodiment, as in the fifth embodiment, the first and the second insulating-film cap layers 107 and 109 are made of a material added in an amount to be diffused so that they disappear by heat treatment. In the nMOSFET region Rn, the element-added protective layer 131 is formed immediately above the element-added metal layer 110 and the element-added metal layer 110 is formed immediately above the first element-added insulating layer 111. In the present embodiment, the protective layer 130 and the gate-electrode metal film 108 are made of the same material so that the element-added protective layer 131 and the element-added metal layer 110 are integrated into one and configure one layer. In the pMOSFET region Rp, as in the fifth embodiment, the gate-electrode metal film 108 is formed immediately above the second element-added insulating layer 112.

As illustrated in FIG. 31, a poly-Si layer 113 is deposited over the gate-electrode metal film 108 and the element-added protective layer 131 to give a thickness of from 30 to 120 nm. In the present embodiment, as in the fifth embodiment, a heat treatment step is performed desirably prior to the formation of the poly-Si layer 113.

Figure 32:
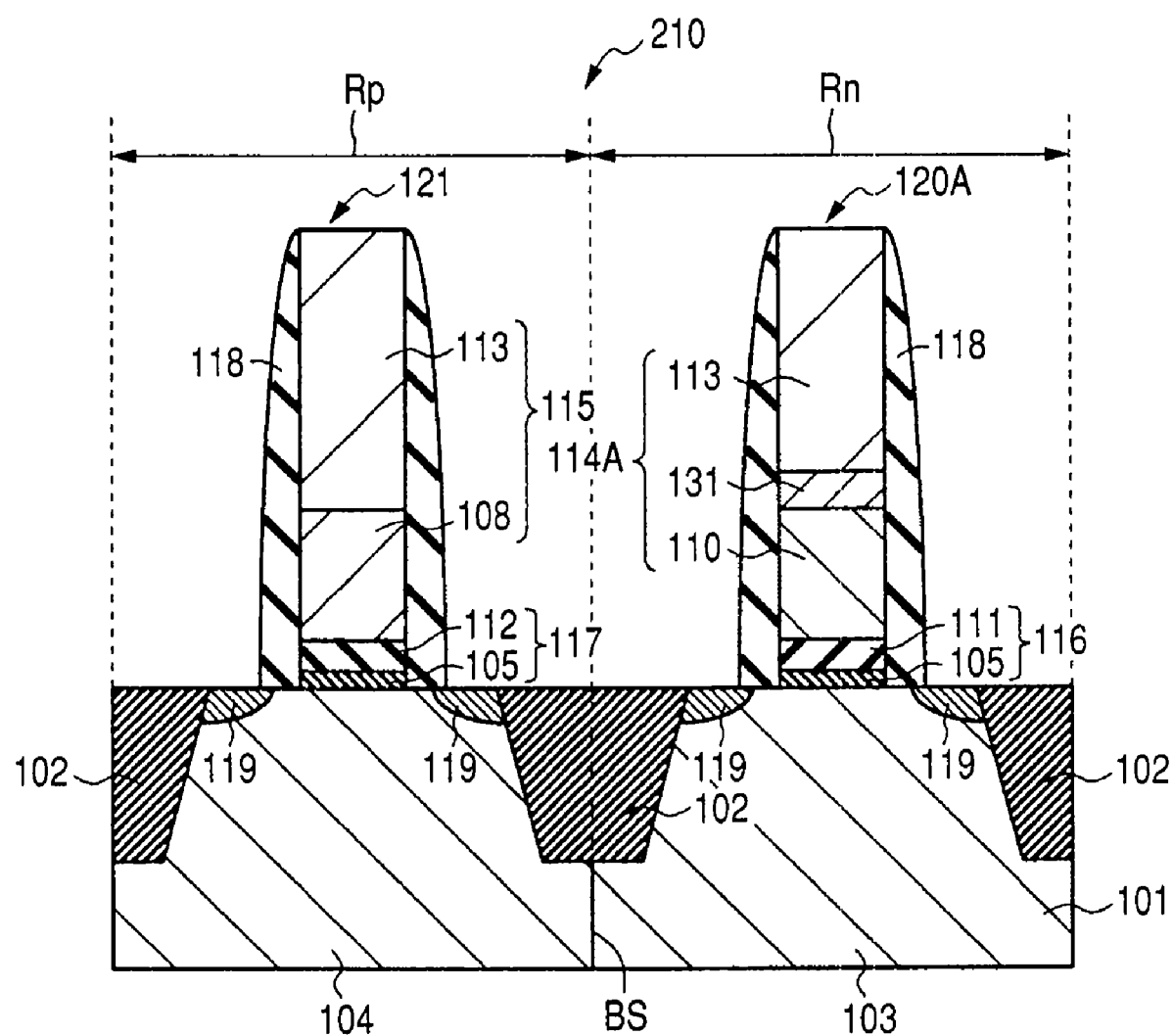
FIG. 32 is a cross-sectional view illustrating the state of each manufacturing step in the method of manufacturing a semiconductor device according to the sixth embodiment of the invention.

FIG. 32 is a cross-sectional view illustrating the state of the CMOSFET 210 after completion of its formation. After formation of the poly-Si layer 113 of FIG. 31, similar to the fifth embodiment, processing for the formation of each gate electrode of a nMOSFET 120A and a pMOSFET 121 is performed using dry etching or the like. Described specifically, in order to leave a portion of the gate electrode and layers therebelow, the poly-Si layer 113, the element-added protective layer 131, the element-added metal layer 110, and the gate-electrode metal film 108 which will be the gate electrode and the first element-added insulating layer 111, the second element-added insulating layer 112, and the interface layer 105 therebelow are etched.

In the present embodiment, an n-side gate electrode 114A of the nMOSFET 120A is composed of the poly-Si layer 113, the element-added protective layer 131, and the element-added metal layer 110, while an n-side gate insulating film 116 is composed of the interface layer 105 and the first element-added insulating layer 111. The nMOSFET 120A has therefore a gate stack structure having the poly-Si layer 113, the element-added protective layer 131, the element-added metal layer 110, the first element-added insulating layer 111, the interface layer 105, and the p well 103. The pMOSFET 121 has, on the other hand, a gate stack structure similar to that of the fifth embodiment and having the poly-Si layer 113, the gate-electrode metal film 108, the second element-added insulating layer 112, the interface layer 105, and the n well 104.

After formation of the n-side gate electrode 114A and the p-side gate electrode 115, the conventional process flows of CMOSFET formation are performed successively as in the fifth embodiment to form the nMOSFET 120A and the pMOSFET 121, thereby forming the CMOSFET 210. Described specifically, in the nMOSFET region Rn, sidewall spacers 118 made of, for example, SiO$_2$ are formed over each of the side walls of the n-side gate electrode 114A and the n-side gate insulating film 116. In the pMOSFET region Rp, sidewall spacers 118 made of, for example, SiO$_2$ are formed over each of the side walls of the p-side gate electrode 115 and the p-side gate insulating film 117. Ion implantation or the like is then performed to form a source/drain region 119, whereby the CMOSFET 210 is formed.

In the CMOSFET 210 of the present embodiment thus formed, the effective work function of the n-side gate electrode 114A of the nMOSFET 120A is from 4.0 eV to 4.3 eV and the effective work function of the p-side gate electrode 115 of the pMOSFET 121 is from 4.9 eV to 5.2 eV. The effective work function of the gate electrode can be determined from a flat band voltage deduced from the C-V characteristics, that is, capacitance-gate voltage characteristics of a MOS type capacitor in the nMOSFET 120A and pMOSFET 121 thus obtained.

In the present embodiment, the protective layer 130 formed over the second insulating-film cap layer 109 can prevent deterioration of the second insulating-film cap layer 109 which will otherwise occur by the lithography for removing only the second insulating-film cap layer 109 from the pMOSFET region Rp. The heat treatment conducted thereafter can therefore diffuse the material of the second insulating-film cap layer 109 into the gate-electrode metal film 108 and the insulating layer 106 more reliably, making it possible to control the threshold voltage of the nMOSFET 120A to a desired value more reliably.

In the nMOSFET 120A of the present embodiment thus obtained, the first element-added insulating layer 111 contains Al, which is the first element, and La, which is the second element; the element-added metal layer 110 on the first element-added insulating layer 111 contains La, which is the second element; and the element-added protective layer 131 on the element-added metal layer 110 contains La, which is the second element derived from the second insulating-film cap layer 109. In the pMOSFET 121, on the other hand, the second element-added insulating layer 112 contains Al, which is the first element, and the second element-added insulating layer 112 has thereon the gate-electrode metal film 108 containing neither Al, the first element, nor La, the second element.

Such a structure enables to achieve the nMOSFET 120A and the pMOSFET 121 equipped with the gate electrodes 114A and 115, respectively, having an effective work function suited therefor. More specifically, the effective work function of the n-side gate electrode 114A in the nMOSFET 120A can be adjusted to fall within a range of from 4.0 eV to 4.3 eV and the effective work function of the p-side gate electrode 115 can be adjusted to fall within a range of from 4.9 eV to 5.2 eV. Thus, the nMOSFET 120A and the pMOSFET 121 having threshold voltages suited therefor, respectively, can be achieved.

In the above-described embodiment, the protective layer 130 is made of TiN which is a metal material so that removal of the element-added protective layer 131 prior to the formation of the poly-Si layer 113 is not necessary. When the protective layer 130 is made of a conductive material such as metal or impurity-added silicon, removal of the element-added protective layer 131 prior to the formation of the poly-Si layer 113 is not necessary. When the protective layer 130 is made of an insulating material, on the other hand, the element-added protective layer 131 must be removed prior to the formation of the poly-Si layer 113. In this case, the n-side gate electrode of the nMOSFET is composed of the poly-Si layer 113 and the element-added metal layer 110 and the nMOSFET has a gate stack structure having the poly-Si layer 113, the element-added metal layer 110, the first element-added insulating layer 111, the interface layer 105, and the p well 103.

In the present embodiment, the protective layer 130 is made of a material permitting diffusion thereinto of the material of the second insulating-film cap layer 109, more specifically, a material similar to that of the gate-electrode metal film 108. The material is not limited to it and the protective layer 130 may be made of a material not permitting diffusion thereinto of the material of the second insulating-film cap layer 109 or a material permitting diffusion of it but with difficulty.

Figure 33:
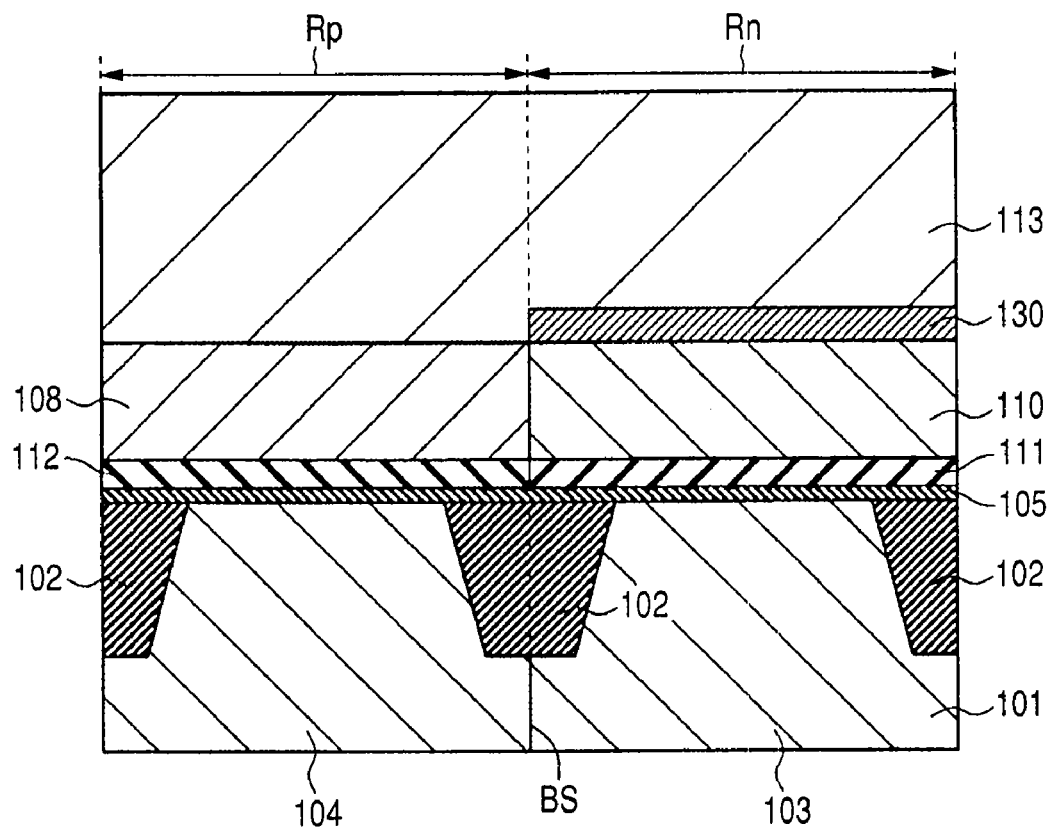
FIG. 33 is a cross-sectional view illustrating the state of each manufacturing step in the method of manufacturing a semiconductor device according to the sixth embodiment of the invention.

FIG. 33 is a cross-sectional view illustrating the state after completion of the formation of the poly-Si layer 113 over the gate-electrode metal film 108 and the protective layer 130. As illustrated in FIG. 29, when the protective layer 130 formed on the second insulating-film cap layer 109 is made of a material not permitting diffusion of the material of the second insulating-film cap layer 109 or a material permitting diffusion but with difficulty, the material of the second insulating-film cap layer 109 is not diffused into the protective layer 130 in the heat diffusion step, different from FIG. 31 in which the element-added protective layer 131 is formed by the diffusion of the material of the second insulating-film cap layer 109 into the protective layer 130 belonging to the nMOSFET region Rn. The protective layer 131 therefore remains as is. The material of the second insulating-film cap layer 109 is diffused, similar to FIG. 31, into the gate-electrode metal film 108 located immediately below the second insulating-film cap layer 109 and the element-added metal layer 110 is formed by adding the material of the second insulating-film cap layer 109 to the gate-electrode metal film 108. In FIG. 33, La which is a material of the second insulating-film cap layer 109 is diffused into the gate-electrode metal film 108 to form a La-added added metal layer 110.

When the protective layer 130 is made of a conductive material such as metal or impurity-added silicon, the poly-Si layer 113 is deposited, as in the fifth embodiment, over the protective layer 130 remaining in the nMOSFET region Rn and over the gate-electrode metal film 108 in the pMOSFET region Rp after heat diffusion. Then, processing for forming a gate electrode is performed to form, as the n-side gate electrode in the nMOSFET region Rn, a gate electrode composed of the poly-Si layer 113, the protective layer 130, and the element-added metal layer 110. The nMOSFET therefore has a gate stack structure having the poly-Si layer 113, the protective layer 130, the element-added metal layer 110, the first element-added insulating layer 111, the interface layer 105, and the p well 103. In this case, the protective layer 130 has conductivity, is made of a material different from that of the element-added metal layer 110, and corresponds to an upper conductive layer.

When the protective layer 130 is made of an insulating material, on the other hand, the element-added protective layer 131 is removed prior to the formation of the poly-Si layer 113. IN this case, the n-side gate electrode of the nMOSFET is composed of the poly-Si layer 113 and the element-added metal layer 110 and the nMOSFET has a gate stack structure having the poly-Si layer 113, the element-added metal layer 110, the first element-added insulating layer 111, the interface layer 105, and the p well 103.

Seventh Embodiment

Figure 34:
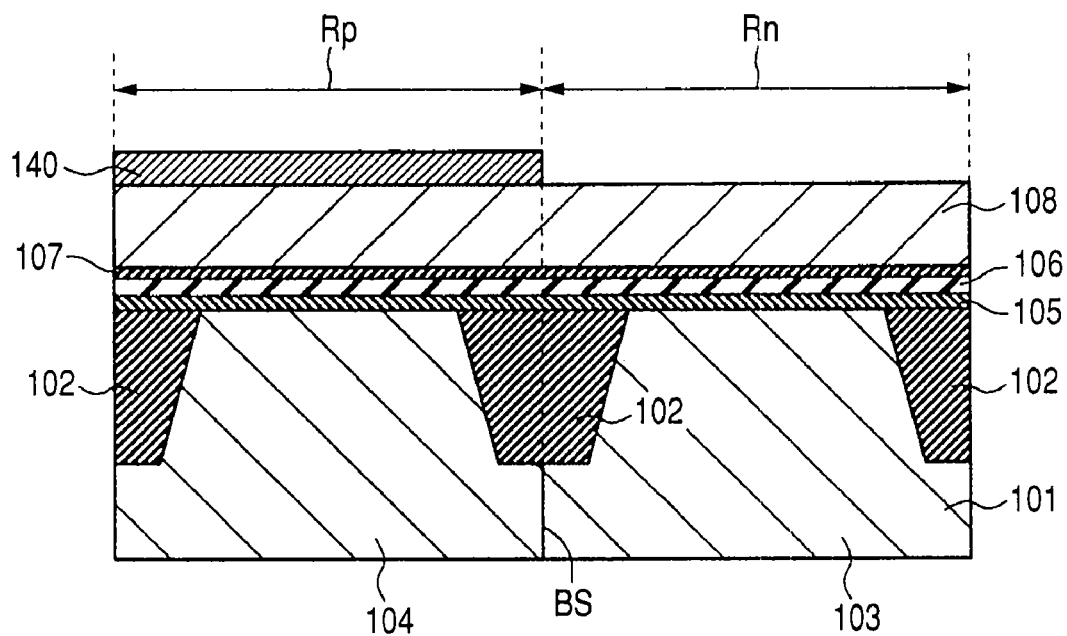
FIG. 34 is a cross-sectional view illustrating the state of each manufacturing step in a method of manufacturing a semiconductor device according to a seventh embodiment of the invention.

A method of manufacturing a semiconductor device according to a seventh embodiment of the invention will next be described. FIGS. 34 to 37 are cross-sectional views illustrating the state of each manufacturing step in the method of manufacturing a semiconductor device according to the seventh embodiment of the invention. Also in this embodiment, similar to the fifth embodiment, a CMOSFET 220 is manufactured as a semiconductor device. FIG. 34 is a cross-sectional view illustrating the state after completion of the formation of a diffusion preventing layer 140. FIGS. 34 to 37 omit therefrom the p-type semiconductor device 2 illustrated in FIGS. 1 to 25 to facilitate understanding.

In the present embodiment, similar to the fifth embodiment, an interface layer 105, an insulating layer 106, a first insulating-film cap layer 107, and a gate-electrode metal film 108 are formed successively over the entire surface of the Si substrate 101 from the surface side on which an element isolation film 102, a p well 103, and a p well 104 are formed. Then, a diffusion preventing layer is formed over the entire upper surface of the gate-electrode metal film 108. The diffusion preventing layer has a function of suppressing or preventing diffusion of the material of a second insulating-film cap layer 109, which will be deposited later, into the gate-electrode metal film 108. The diffusion preventing layer 140 is made of a material equal to that of the gate-electrode metal film 108 in the present embodiment. After formation of the diffusion preventing layer 140, the diffusion preventing layer 140 is etched from the nMOSFET region Rn while leaving the diffusion preventing layer 140 in the pMOSFET region Rp.

Figure 35:
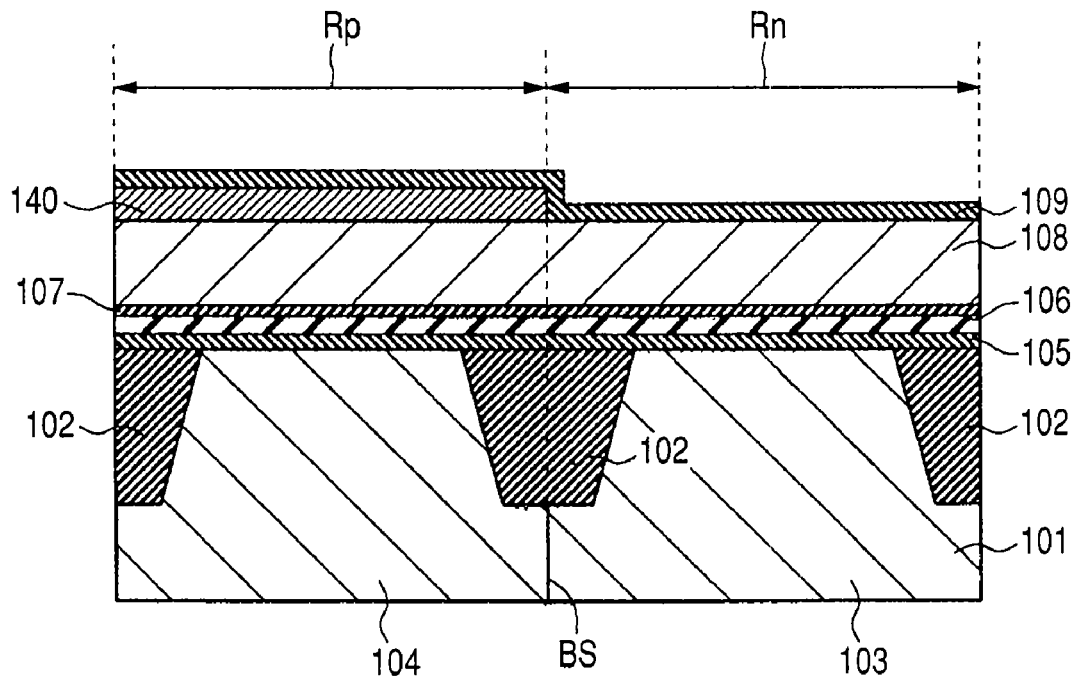
FIG. 35 is a cross-sectional view illustrating the state of each manufacturing step in the method of manufacturing a semiconductor device according to the seventh embodiment of the invention.

FIG. 35 is a cross-sectional view illustrating the state after completion of the second insulating-film cap layer 109. After removal of the diffusion preventing layer from the nMOSFET region Rn, the second insulating-film cap layer 109 is formed over the gate-electrode metal film in the nMOSFET region Rn and the diffusion preventing layer 140 in the pMOSFET region Rp. With regards to the relationship between the distance between the second insulating-film cap layer 109 and the first insulating-film cap layer 107 in the nMOSFET region Rn and the distance between the second insulating-film cap layer 109 and the first insulating-film cap layer 107 in the pMOSFET region Rp, that is, the relationship between the thickness of the gate-electrode metal film 108 in the nMOSFET region Rn and the total thickness of the diffusion preventing layer 140 and the gate-electrode metal film 108 in the pMOSFET region Rp, the thickness on the pMOSFET region Rp, that is, on the great-thickness side is adjusted to 20 nm and that on the nMOSFET region Rn, that is, on the small-thickness side is adjusted to 10 nm.

Figure 36:
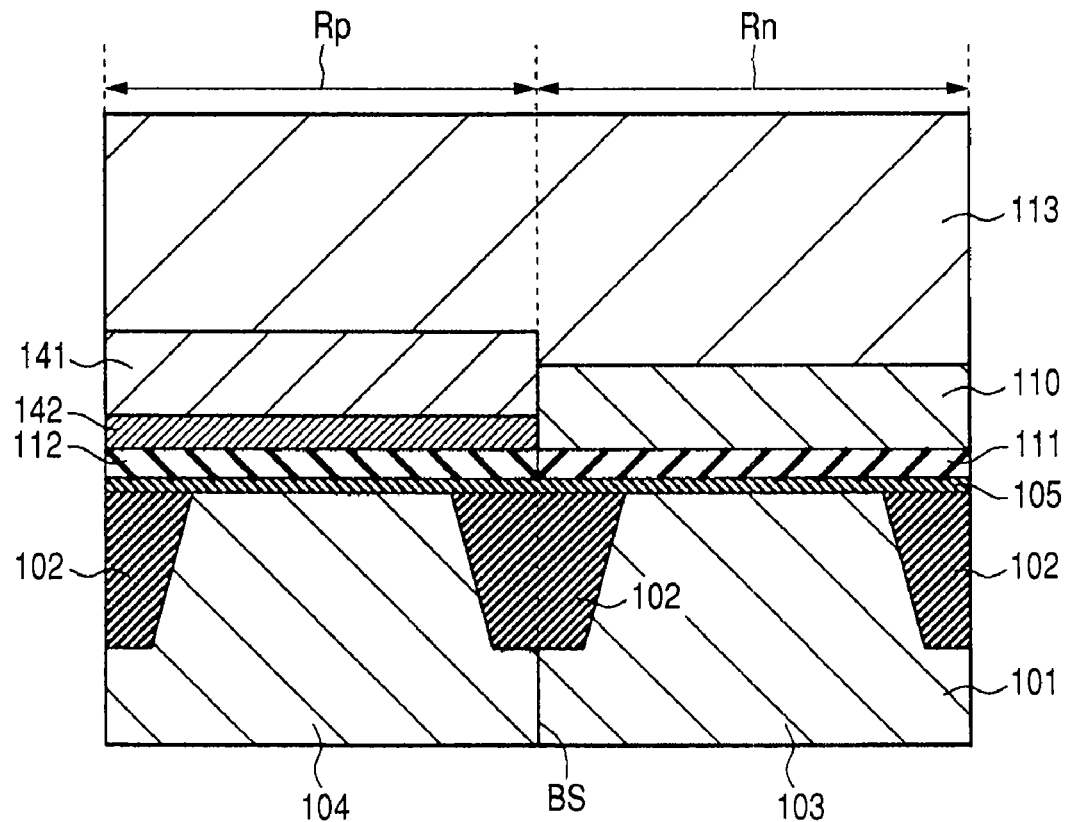
FIG. 36 is a cross-sectional view illustrating the state of each manufacturing step in the method of manufacturing a semiconductor device according to the seventh embodiment of the invention.

FIG. 36 is a cross-sectional view illustrating the state after completion of the formation of a poly-Si layer 113 over an element-added metal layer 110 and also over an element-free metal layer 142 and an element-added metal layer 141. After formation of the second insulating-film cap layer 109, the Si substrate 101 having each layer formed thereover is heat treated, thereby heat treating the insulating layer 106, the gate-electrode metal film 108, and the diffusion preventing layer 140 together with the first and second insulating-film cap layers 107 and 109. By this heat treatment, the second insulating-film cap layer 109 is reacted with the gate-electrode metal film 108 to diffuse the material of the second insulating-film cap layer 109 into the gate-electrode metal film 108 belonging to the nMOSFET region Rn. As a result of adding the material of the second insulating-film cap layer 109 to the gate-electrode metal film 108, the element-added metal layer 110 is formed in the nMOSFET region Rn as illustrated in FIG. 36. In the present embodiment, the La-added metal layer 110 is formed by the diffusion of La which is the material of the second insulating-film cap layer 109 into the gate-electrode metal film 108.

Further, the material of the second insulating-film cap layer 109 is, similar to the fifth embodiment, diffused into the insulating layer 106 located below the second insulating-film cap layer 109, that is, into the insulating layer 106 belonging to the nMOSFET region Rn. In addition, the material of the first insulating-film cap layer 107 is diffused into the insulating layer 106 located immediately below the first insulating-film cap layer 107, that is, the insulating layer 106 belonging to the nMOSFET region Rn and the pMOSFET region Rp. By the diffusion, the insulating layer 106 belonging to the nMOSFET region Rn becomes a first element-added insulating layer 111 as a result of the addition of the materials of the first and second insulating-film cap layers 107 and 109. In the present embodiment, since the insulating layer 106 is a HfSiON layer, a HfSiON layer containing Al and La, the material of the first insulating-film cap layer 107 and the material of the second insulating-film cap layer 109, respectively, is formed as the first element-added insulating layer 111.

In the pMOSFET region Rp, the material of the second insulating-film cap layer 109 is diffused into the diffusion preventing layer 140 belonging to the pMOSFET region Rp and moreover, the material of the second insulating-film cap layer 109 is diffused into a portion, on the side of the diffusion preventing layer 140, of the gate-electrode metal film 108 located immediately below the diffusion preventing layer 140. By the diffusion, La which is the material of the second insulating-film cap layer 109 is added to the diffusion preventing layer 140 and a portion of the gate-electrode metal film 108 to form the element-added metal layer 141 in the pMOSFET region Rp as illustrated in FIG. 36. On the other hand, the other portion of the gate-electrode metal film 108 which has remained free from the material of the second insulating-film cap layer 109 becomes the element-free metal layer 142, a layer not containing the material of the second insulating-film cap layer 109.

The element-free metal layer 142 corresponds to an electrode conductive layer. A portion of the element-added metal layer 141 obtained by adding the material of the second insulating-film cap layer 109 to a portion of the gate-electrode metal film 108 corresponds to a second element-added conductive layer. A portion obtained by adding the material of the second insulating-film cap layer 109 to the diffusion preventing layer 140 corresponds to another second element-added conductive layer. In the present embodiment, the diffusion preventing layer 140 and the gate-electrode metal film 108 are made of the same material so that the diffusion preventing layer 140 and a portion of the gate-electrode metal film 108 are integrated into the above-described element-added metal layer 141.

The insulating layer 106 belonging to the pMOSFET region Rp becomes a second element-added insulating layer as in the fifth embodiment 112 as a result of the addition of the material of the first insulating-film cap layer 107. In the present embodiment, since the insulating layer 106 is a HfSiON layer, a HfSiON layer containing Al, the material of the first insulating-film cap layer 107 is formed as the second element-added insulating layer 112.

Also in the present embodiment, as in the fifth embodiment, the first and second insulating-film cap layers 107 and 109 are each made of a material added in an amount to be diffused, they disappear by the heat treatment. In the nMOSFET region Rn, the element-added metal layer 110 is therefore exposed and the element-added metal layer 110 is placed immediately above the first element-added insulating layer 111 as in the fifth embodiment. In the pMOSFET region Rp, the element-free metal layer 142 is present immediately above the second element-added insulating layer 112. In the present embodiment, the diffusion preventing layer 140 and the gate-electrode metal film 108 are made of the same material so that in the pMOSFET region Rp, the diffusion preventing layer 140 and a portion of the gate-electrode metal film 108 are integrated into the above-described element-added metal layer 141.

As illustrated in FIG. 36, a poly-Si layer 113 is deposited to give a thickness within a range of from 30 to 120 nm over the element-added metal layer 110 and the element-added metal layer 141. In the present embodiment as in the fifth embodiment, a heat treatment step is preferably performed prior to the formation of the poly-Si layer 113.

Figure 37:
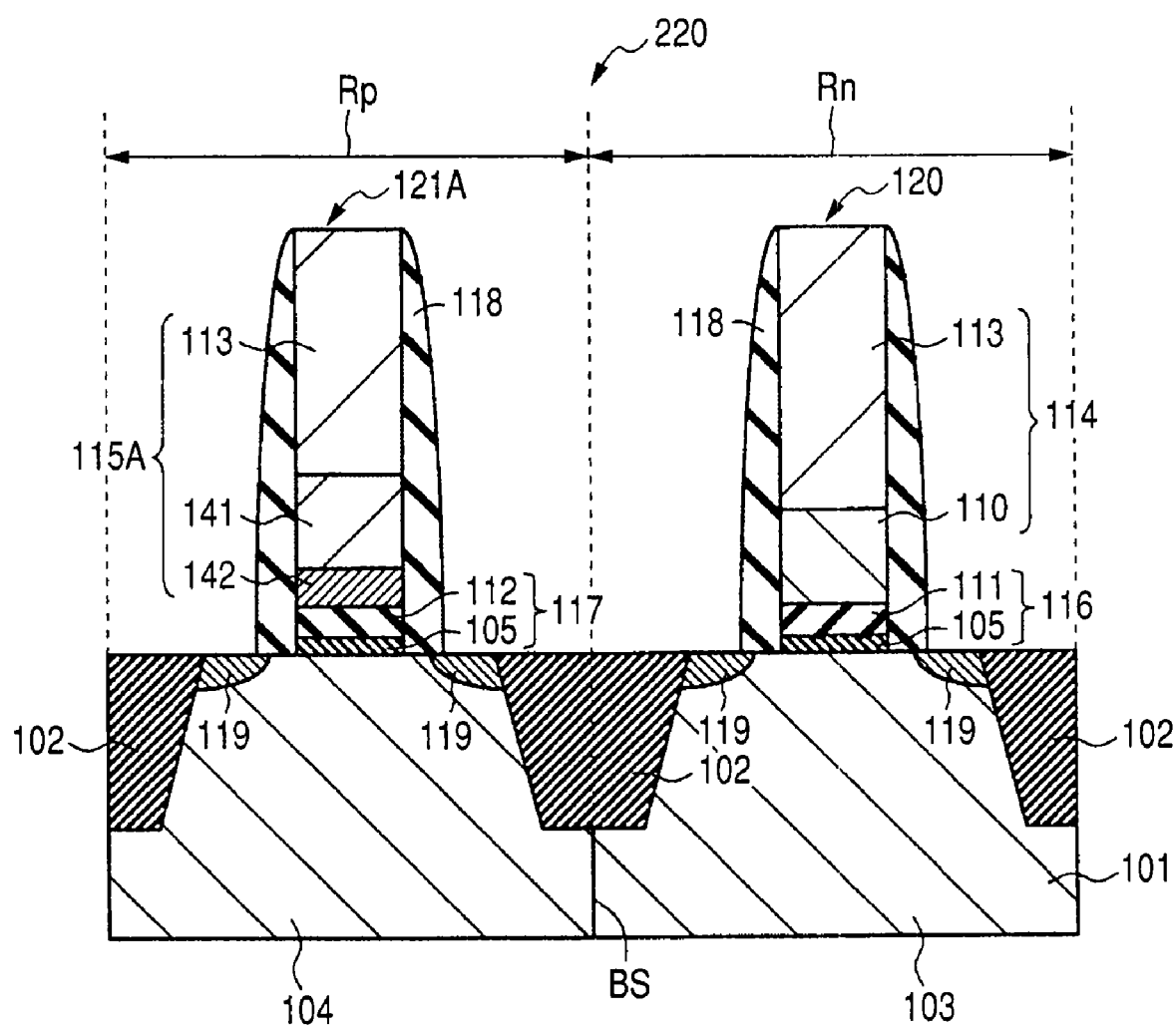
FIG. 37 is a cross-sectional view illustrating the state of each manufacturing step in the method of manufacturing a semiconductor device according to the seventh embodiment of the invention.

FIG. 37 is a cross-sectional view illustrating the state after completion of the formation of the CMOSFET 220. After formation of the poly-Si layer 113 in FIG. 36, processing is performed as in the fifth embodiment to form each gate electrode of an nMOSFET 120 and a pMOSFET 121A by dry etching or the like. Described specifically, in order to leave a portion of the gate electrode and layers therebelow, the poly-Si layer 113, the element-added metal layer 110, the element-added metal layer 141, and the element-free metal layer 142 which will be the gate electrode and the first element-added insulating layer 111, the second element-added insulating layer 112, and the interface layer 105 therebelow are etched.

In the present embodiment, the nMOSFET 120 has, as in the fifth embodiment illustrated in FIG. 28, a gate stack structure having the poly-Si layer 113, the element-added metal layer 110, the first element-added insulating layer 111, the interface layer 105, and the p well 103.

In the pMOSFET 121A, a p-side gate electrode 115A has the poly-Si layer 113, the element-added metal layer 141, and the element-free metal layer 142, while the p-side gate insulating film 117 has, similar to that of the fifth embodiment illustrated in FIG. 28, the interface layer 105 and the second element-added insulating layer 112. Accordingly, the pMOSFET 121A has a gate stack structure having the poly-Si layer 113, the element-added metal layer 141, the element-free metal layer 142, the second element-added insulating layer 112, the interface layer 105, and the n well 104.

After formation of the n-side gate electrode 114 and the p-side gate electrode 115A, the nMOSFET 120 and the pMOSFET 121A are formed by following the conventional process flows of CMOSFET formation successively, thereby forming the CMOSFET 220. Described specifically, in the nMOSFET region Rn, a sidewall spacer 118 made of, for example, $SiO_2$ is formed over both of the side walls of the n-side gate electrode 114 and the n-side gate insulating film 116. In the pMOSFET region Rp, a sidewall spacer 118 made of for example, $SiO_2$ is formed over both of the side walls of each of the p-side gate electrode 115A and the p-side gate insulating film 117. Ion implantation or the like is then performed to form a source/drain region 119, whereby the CMOSFET 220 is formed.

In the CMOSFET 220 of the present embodiment formed in such a manner, the effective work function of the n-side gate electrode 114 of the nMOSFET 120 is from 4.0 eV to 4.3 eV, while the effective work function of the p-side gate electrode 115A of the pMOSFET 121A is from 4.9 eV to 5.2 eV. The effective work function of the gate electrode can be determined from a flat band voltage deducted from the C-V characteristics, that is, capacitance-gate voltage characteristics of a MOS type capacitor in the nMOSFET 120 and the pMOSFET 121A thus obtained.

According to the present embodiment, the interface layer 105 and the insulating layer 106 are formed successively over the Si substrate 101 in the nMOSFET region Rn and the pMOSFET region Rp and over this insulating layer 106, the first insulating-film cap layer 107 and the gate-electrode metal film 108 are formed successively. The diffusion preventing layer 140 is formed over a portion of the gate-electrode metal film 108 in the pMOSFET region Rp and over this diffusion preventing layer 140 and the gate-electrode metal film 108 in the nMOSFET region Rn, the second insulating-film cap layer 109 is formed. Together with the first insulating-film cap layer 107 and the second insulating-film cap layer 109 thus formed, the insulating layer 106, the gate-electrode metal film 108, and the diffusion preventing layer 140 are heat treated. By this heat treatment, Al contained in the first insulating-film cap layer 107 can be diffused into the insulating layer 106 below the first insulating-film cap layer 107. In the nMOSFET region Rn, La contained in the second insulating-film cap layer 109 can be diffused into the gate-electrode metal film 108 below the second insulating-film cap layer 109 and also into the insulating layer 106 below the gate-electrode metal film 108.

In the pMOSFET region Rp, the second insulating-film cap layer 109 is formed over the diffusion preventing layer 140 so that diffusion of La into the gate-electrode metal film 108 and the insulating layer 106 can be suppressed or prevented by the diffusion preventing layer 140. This enables to form the insulating layer 106 containing Al and La in the nMOSFET region Rn and the insulating layer 106 containing Al in the pMOSFET region Rp so that the threshold voltage of the nMOSFET 120 and the threshold voltage of the pMOSFET 121A can be controlled. As a result, the control range of the threshold voltage can be widened.

The second insulating-film cap layer 109 is formed over the gate-electrode metal film 108 and the second insulating-film cap layer 109 and the insulating layer 106 have the gate-electrode metal film 108 therebetween so that when for the formation of the second insulating-film cap layer 109 in the nMOSFET region Rn, the second insulating-film cap layer 109 is formed both in the nMOSFET region Rn and the pMOSFET region Rp and then, the second insulating-film cap layer 109 is removed from the pMOSFET region Rp, deterioration of the insulating layer 106 can be prevented. This enables to prevent reduction in the reliability of the insulating layer 106 due to the deterioration and reduction in the reliability of the n-side gate insulating film 116 and the p-side gate insulating film 117. As a result, reduction in the reliability of the insulating layer 106 and in addition, reduction in the reliability of the n-side gate insulating film 116 and p-side gate insulating film 117 can be prevented and at the same time, the control range of the threshold voltage can be widened.

Thus, the present embodiment facilitates manufacture of the semiconductor device 220 which is equipped with the nMOSFET 120 and the pMOSFET 121A having desired properties, respectively and at the same time, is highly reliable.

In the nMOSFET 120 formed in such a manner, the first element-added insulating layer 111 contains Al and La, which are respectively the first element and second element, and the element-added metal layer 110 over the first element-added insulating layer 111 contains La, which is the second element. In the pMOSFET 121A, on the other hand, the second element-added insulating layer 112 contains Al, which is the first element; the second-element-added insulating layer 112 has, thereover, the element-free metal layer 142 containing neither Al, the first element, nor La, the second element; and the second element-added conductive layer over the element-free metal layer 142 and the element-added metal layer 141 which is another second element-added conductive layer contain La which is the second element.

In such a manner, the nMOSFET 120 and the pMOSFET 121A equipped with the gate electrodes 114 and 115A having effective work functions suited therefor, respectively, can be achieved. Described specifically, the effective work function of the n-side gate electrode 114 of the nMOSFET 120 can be adjusted to from 4.0 eV to 4.3 eV, while the effective work function of the p-side gate electrode 115A of the pMOSFET 121A can be adjusted to from 4.9 eV to 5.2 eV. Thus, the nMOSFET 120A and the pMOSFET 121A having threshold voltages suited therefor, respectively, can be achieved.

Further, the first and second element-added insulating layers 111 and 112 can be formed without etching over the gate-insulating-film insulating layer 106 which will be the first and second element-added insulating layers 111 and 112 so that deterioration during the manufacturing procedure can be prevented and reduction in the reliability can be prevented. It is therefore possible to achieve the semiconductor device 220 which is equipped with the nMOSFET 120 and the pMOSFET 121A having desired properties, respectively.

Eighth Embodiment

Figure 38:
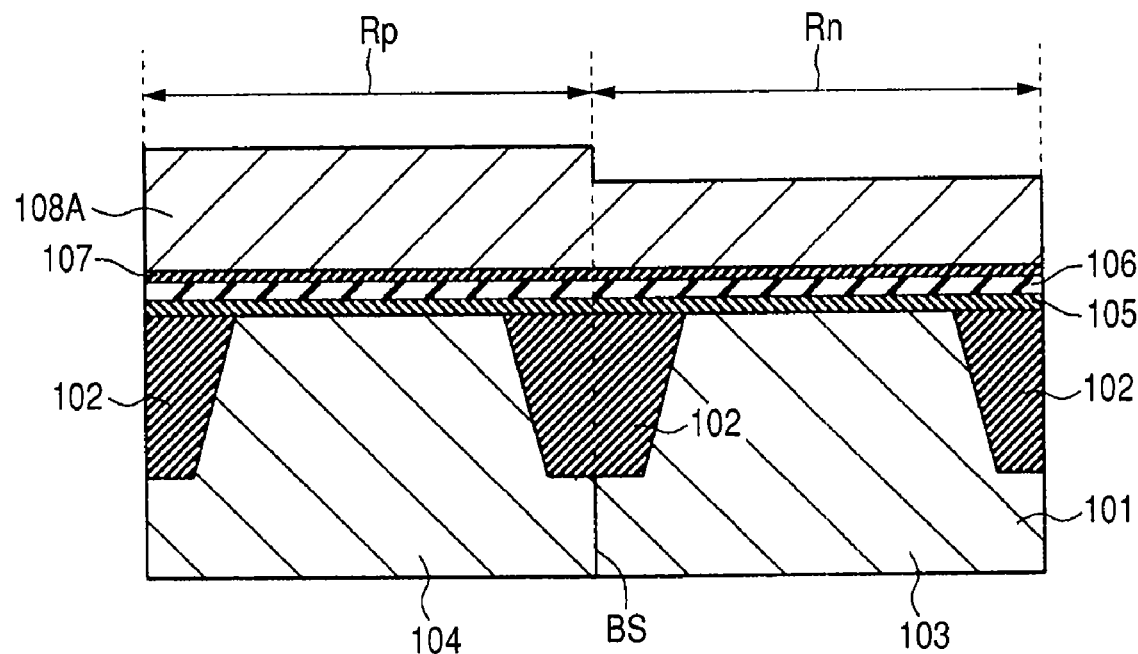
FIG. 38 is a cross-sectional view illustrating the state of each manufacturing step in a method of manufacturing a semiconductor device according to an eighth embodiment of the invention.

A method of manufacturing a semiconductor device according to an eighth embodiment of the present invention will next be described. FIGS. 38 to 41 are cross-sectional views illustrating the state of each manufacturing step in the method of manufacturing a semiconductor device according to the eighth embodiment of the invention. In the present embodiment as in the fifth embodiment, a CMOSFET 230 is manufactured as the semiconductor device. FIG. 38 is a cross-sectional view illustrating the state after removal of a portion of a first insulating-film cap layer 107 in the nMOSFET region Rn. FIGS. 38 to 41 omit therefrom the p type semiconductor layer 2 illustrated above in FIGS. 1 to 25 to facilitate understanding.

In the present embodiment, as in the fifth embodiment, an interface layer 105, an insulating layer 106, a first insulating-film cap layer, and a gate-electrode metal film 108A are formed successively over the entire surface of a Si substrate 101 from the surface side on which an element isolation film 102, a p well 103, and n well 104 have been formed. Then, a portion of the gate-electrode metal film 108A in the nMOSFET region Rn is removed by etch back or the like in the thickness direction.

Figure 39:
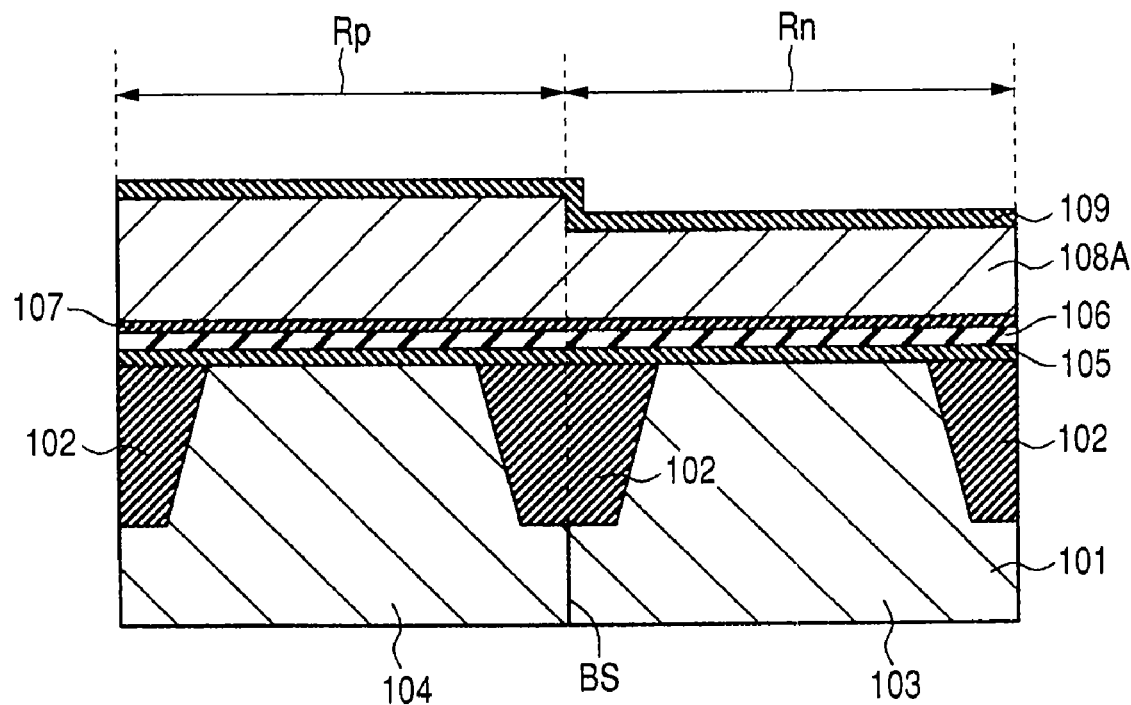
FIG. 39 is a cross-sectional view illustrating the state of each manufacturing step in the method of manufacturing a semiconductor device according to the eighth embodiment of the invention.

FIG. 39 is a cross-sectional view illustrating the state after completion of the formation of a second insulating-film cap layer 109. After removal of a portion of the gate-electrode metal film 108A in the nMOSFET region Rn, a second insulating-film cap layer 109 is formed over the gate-electrode metal film 108A in the nMOSFET region Rn and pMOSFET region Rp.

Figure 40:
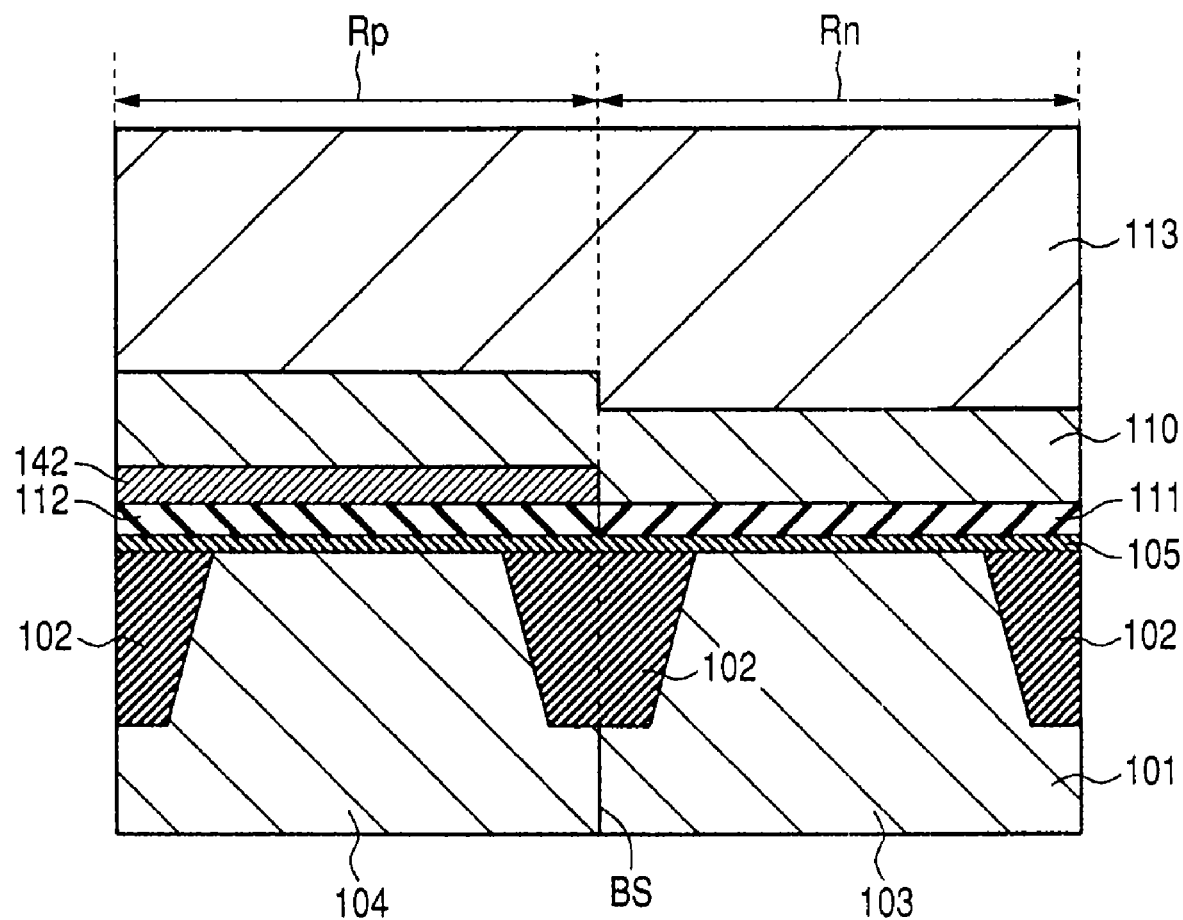
FIG. 40 is a cross-sectional view illustrating the state of each manufacturing step in the method of manufacturing a semiconductor device according to the eighth embodiment of the invention.

FIG. 40 is a cross-sectional view illustrating the state after completion of the formation of a poly-Si layer 113 over an element-added metal layer 110 in the nMOSFET region Rn and pMOSFET region Rp. After formation of the second insulating-film cap layer 109, heat treatment is performed to cause a reaction between the second insulating-film cap layer 109 and the gate-electrode metal film 108A to diffuse the material of the second insulating-film cap layer 109 into the gate-electrode metal film 108A belonging to the nMOSFET region Rn. As a result, an element-added metal layer 110 obtained by adding the material of the second insulating-film cap layer 109 to the gate-electrode metal film 108A is formed in the nMOSFET region Rn as illustrated in FIG. 40. In the present embodiment, La, the material of the second insulating-film cap layer 109 is diffused into the gate electrode metal film 108A to form the element-added metal layer 110 containing La as the element. The element-added metal layer 110 corresponds to a first element-added metal layer.

As in the fifth embodiment, the material of the second insulating-film cap layer 109 is diffused into the insulating layer 106 located below the second insulating-film cap layer 109, that is, the insulating layer 106 belonging to the nMOSFET region Rn. In addition, the material of the first insulating-film cap layer 107 is diffused into the insulating layer 106 located immediately below the first insulating-film cap layer 107, that is, the insulating layer 106 belonging to the nMOSFET region Rn and the pMOSFET region Rp. By the above-described diffusion, the insulating layer 106 belonging to the nMOSFET region becomes a first element-added insulating layer 111 as a result of the addition of the materials of the first and second insulating-film cap layers 107 and 109. In the present embodiment, the insulating layer 106 is a HfSiON layer so that a HfSiON layer containing Al and La, the materials of the first insulating-film cap layer 107 and the second insulating-film cap layer 109, respectively, is formed as the first element-added insulating layer 111.

In the pMOSFET region Rp, the material of the second insulating-film cap layer 109 is diffused into a portion, on the side of the second insulating-film cap layer 109, of the gate-electrode metal film 108A located immediately below the second insulating-film cap layer 109. By this diffusion, the element-added metal layer 110 obtained by adding La, the material of the second insulating-film cap layer 109, to a portion of the gate-electrode metal film 108A is formed in the pMOSFET region Rp as illustrated in FIG. 40. The other portion of the gate-electrode metal film 108 which has remained free from the material of the second insulating-film cap layer 109 becomes an element-free metal layer 142 which does not contain the material of the second insulating-film cap layer 109. The element-added metal layer 110 corresponds to a second element-added conductive layer and the element-free metal layer 142 corresponds to an electrode conductive layer.

The insulating layer 106 belonging to the pMOSFET region Rp becomes a second element-added insulating layer 112 by the addition of the material of the first insulating-film cap layer 107 as in the fifth embodiment. In the present embodiment, the insulating layer 106 is a HfSiON layer so that a HfSiON layer containing Al which is the material of the first insulating-film cap layer 107 is formed as the second element-added insulating layer 112.

Also in the present embodiment, as in the fifth embodiment, the first and the second insulating-film cap layers 107 and 109 are formed of the materials added in an amount to be diffused so that they disappear by the heat treatment. As a result, in the nMOSFET region Rn, the element-added metal layer 110 is exposed and the element-added metal layer 110 is formed immediately above the first element-added insulating layer 111. In the pMOSFET region Rp, the element-added metal layer 110 is exposed and the element-free metal layer 142 is formed immediately above the second element-added insulating layer 112.

As illustrated in FIG. 40, a poly-Si layer 113 is deposited over the element-added metal layer 110 in the nMOSFET region Rn and the pMOSFET region Rp to give a thickness within a range of from 30 nm to 120 nm. In the present embodiment, as in the fifth embodiment, a heat treatment step is preferably performed prior to the formation of the poly-Si layer 113.

Figure 41:
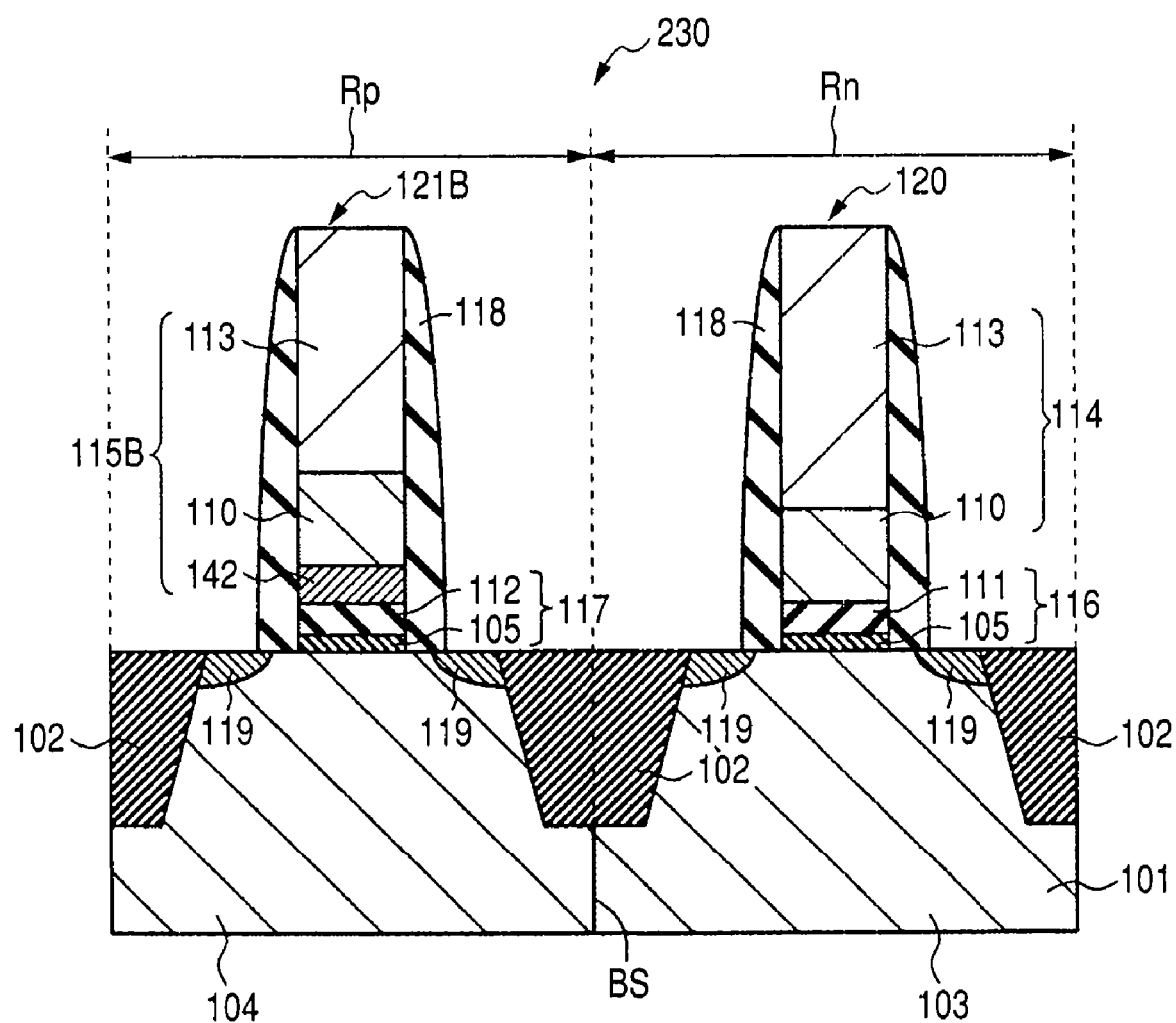
FIG. 41 is a cross-sectional view illustrating the state of each manufacturing step in the method of manufacturing a semiconductor device according to the eighth embodiment of the invention.

FIG. 41 is a cross-sectional view illustrating the state after completion of the formation of the CMOSFET 230. After formation of the poly-Si layer 113 in FIG. 40, dry etching or the like is conducted as in the fifth embodiment to form each gate electrode of the nMOSFET 120 and pMOSFET 121B. Described specifically, in order to leave a portion of the gate electrode and layers therebelow, the poly-Si layer 113, the element-added metal layer 110, the element-free metal layer 142 configuring the gate electrode and the first element-added insulating layer 111, the second element-added insulating layer 112, and the interface layer 105 therebelow are etched.

In the present embodiment, the nMOSFET 120 has a gate stack structure having, as in the fifth embodiment illustrated in FIG. 28, the poly-Si layer 113, the element-added metal layer 110, the interface layer 105, and the p well 103.

In the pMOSFET 121B, a p-side gate electrode 115B is made of the poly-Si layer 113, the element-added metal layer 110, and the element-free metal layer 142, while a p-side gate insulating film 117 is similar to that of the fifth embodiment illustrated in FIG. 28 and composed of the interface layer 105 and the second element-added insulating layer 112. Accordingly, the pMOSFET 121B has a gate stack structure having the poly-Si layer 113, the element-added metal layer 110, the element-free metal layer 142, the second element-added insulating layer 112, the interface layer 105, and the n well 104.

After formation of the n-side gate electrode 114 and the p-side gate electrode 115B, the conventional process flows for CMOSFET formation are conducted successively as in the fifth embodiment to form the nMOSFET 120 and the pMOSFET 121B, thereby forming the CMOSFET 230. Described specifically, in the nMOSFET region Rn, a sidewall spacer 118 made of, for example, $SiO_2$ is formed over both of the side walls of each of the n-side gate electrode 114 and the n-side gate insulating film 116. In the pMOSFET region Rp, a sidewall spacer 118 made of, for example, $SiO_2$ is formed over both of the side walls of each of the p-side gate electrode 115B and the p-side gate insulating film 117. Then, a source/drain region 119 is formed by ion implantation, whereby the CMOSFET 230 is formed.

In the CMOSFET 230 of the present embodiment formed in such a manner, the effective work function of the n-side gate electrode 114 of the nMOSFET 120 is from 4.0 eV to 4.3 eV, while the effective work function of the p-side gate electrode 115B of the pMOSFET 121B is from 4.9 eV to 5.2 eV. The effective work function of the gate electrode can be determined from a flat band voltage deducted from the C-V characteristics, that is, capacitance-gate voltage characteristics of a MOS type capacitor in the nMOSFET 120 and the pMOSFET 121B.

According to the present embodiment, the interface layer 105 and the insulating layer 106 are formed successively over the Si substrate 101 in the nMOSFET region Rn and the pMOSFET region Rp and over this insulating layer 106, the first insulating-film cap layer 107 and the gate-electrode metal film 108 are formed successively. The thickness of the gate-electrode metal film 108 in the pMOSFET region Rp is greater than that in the nMOSFET region Rn. The second insulating-film cap layer 109 is formed over the gate-electrode metal film 108 in both the nMOSFET region Rn and the pMOSFET region Rp. Together with the first insulating-film cap layer 107 and the second insulating-film cap layer 109 thus formed, the insulating layer 106 and the gate-electrode metal film 108 are heat treated. By this heat treatment, the first element, more specifically, Al contained in the first insulating-film cap layer 107 can be diffused into the insulating layer 106 below the first insulating-film cap layer 107. In addition, the second element, more specifically, La contained in the second insulating-film cap layer 109 can be diffused into the gate-electrode metal film 108 below the second insulating-film cap layer 109 and also into the insulating layer 106 below the gate-electrode metal film 108.

The thickness of the gate-electrode metal film 108 in the pMOSFET region Rp is greater than that in the nMOSFET region Rn so that diffusion of La into the gate-electrode metal film 108 and the insulating layer 106 can be suppressed more in the pMOSFET region Rp than in the nMOSFET region Rn. For example, diffusion can be controlled so as to diffuse La into the insulating layer 106 in the pMOSFET region Rp, while preventing diffusion into the insulating layer 106 in the nMOSFET region Rn. As a result, the insulating layer 106 in the nMOSFET region Rn contains Al and La and the insulating layer 106 in the pMOSFET region Rp contains Al. This makes it possible to control the threshold voltage of the nMOSFET 120 and the threshold voltage of the pMOSFET 121B, respectively and thereby widen the control range of the threshold voltage.

The second insulating-film cap layer 109 is formed over the gate-electrode metal film 108. The second insulating-film cap layer 109 and the insulating layer 106 have therebetween the gate-electrode metal film 108 so that deterioration in the insulating layer 106 when the second insulating-film cap layer 109 is formed can be prevented. This enables to prevent reduction in the reliability of the insulating layer 106 due to deterioration. Accordingly, reduction in the reliability of the insulating layer 106 can be prevented and at the same time, the control range of the threshold voltage can be widened.

Thus, the present embodiment facilitates the manufacture of the semiconductor device 230 which is equipped with the nMOSFET 120 and the pMOSFET 121B having desired properties, respectively and at the same time, is highly reliable.

In the nMOSFET 120 of the present embodiment formed in such a manner, the first element-added insulating layer 111 contains Al, the first element, and La, the second element; and the element-added metal layer 110 on the first element-added insulating layer 111 contains La, the second element. In the pMOSFET 121B, the second element-added insulating layer 112 contains Al, the first element; the second element-added insulating layer 112 has thereover the element-free metal layer 142 containing neither Al, the first element, nor La, the second element; and the element-added metal layer 110 over the element-free metal layer 142 contains La, the second element.

This makes it possible to achieve the nMOSFET 120 and the pMOSFET 121B equipped with the gate electrodes 114 and 115B having the effective work functions suited therefor, respectively. Described specifically, the effective work function of the n-side gate electrode 114 of the nMOSFET 120 is from 4.0 eV to 4.3 eV, while the effective work function of the p-side gate electrode 115B of the pMOSFET 121B is from 4.9 eV to 5.2 eV. It is therefore possible to achieve the nMOSFET 120 and the pMOSFET 121B having threshold voltages suited therefor, respectively.

Since the first and second element-added insulating layers 111 and 112 can be formed without etching over the gate-insulating-film insulating layer 106 which will be the first and second element-added insulating layers 111 and 112, deterioration in the manufacturing procedure can be prevented and reduction in the reliability is prevented. Accordingly, the semiconductor device 230 which is equipped with the nMOSFET 120 and the pMOSFET 121B having desired properties respectively and at the same time is highly reliable can be achieved.

Ninth Embodiment

Figure 42:
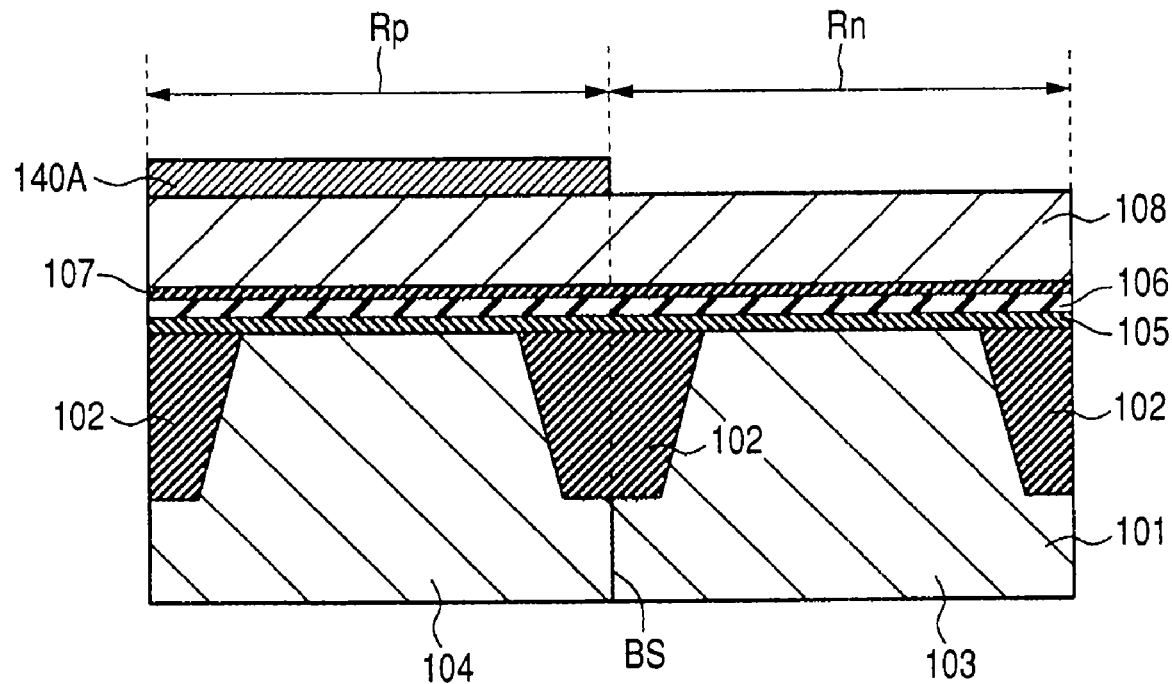
FIG. 42 is a cross-sectional view illustrating the state of each manufacturing step in a method of manufacturing a semiconductor device according to a ninth embodiment of the invention.

A method of manufacturing a semiconductor device according to a ninth embodiment of the invention will next be described. FIGS. 42 to 46 are cross-sectional views illustrating the state of each manufacturing step in the method of manufacturing a semiconductor device according to the ninth embodiment of the invention. In the present embodiment, as in the fifth embodiment, a CMOSFET 240 is manufactured as a semiconductor device. FIG. 42 is a cross-sectional view illustrating the state after completion of the formation of a diffusion preventing layer 140A. FIGS. 42 to 46 omit therefrom the p type semiconductor layer 2 illustrated above in FIGS. 1 to 25 to facilitate understanding.

In the present embodiment, as in the fifth embodiment, an interface layer 105, an insulating layer 106, a first insulating-film cap layer 107, and a gate-electrode metal film 108 are formed successively over the entire upper surface of a Si substrate 101 from the surface side on which an element isolation film 102, a p well 103, and a p well 104 have been formed. Then, the diffusion preventing layer 140A is formed over the entire upper surface of the gate-electrode metal film 108. The diffusion preventing layer 140A has a function of preventing diffusion of the material of a second insulating-film cap layer 109, which will be deposited later, into the gate-electrode metal film 108. The diffusion preventing layer 140A is formed so as to prevent diffusion of the material of the second insulating-film cap layer 109.

In the present embodiment, the material of the diffusion preventing layer 140A is different from that of the gate-electrode metal film 108. Whether or not the diffusion preventing layer 140A permits diffusion of the material of the second insulating-film cap layer 109 varies, depending on not only an element configuring the material of the diffusion preventing layer 140A but also formation conditions of the diffusion preventing layer 140A. Accordingly, the term "the material of the diffusion preventing layer 140A is different from that of the gate-electrode metal film 108" embraces not only the case where the diffusion preventing layer and the gate-electrode metal film 108 are different in the element configuring the material but also the case where film formation conditions are different and therefore properties of the layers are different, though they are the same in the element configuring the material. In the present embodiment, the diffusion preventing layer 140A is made of TiN. After formation of the diffusion preventing layer 140A, etching is performed to remove the diffusion preventing layer 140A in the nMOSFET region Rn while leaving only the diffusion preventing layer 140A in the pMOSFET region Rp.

Figure 43:
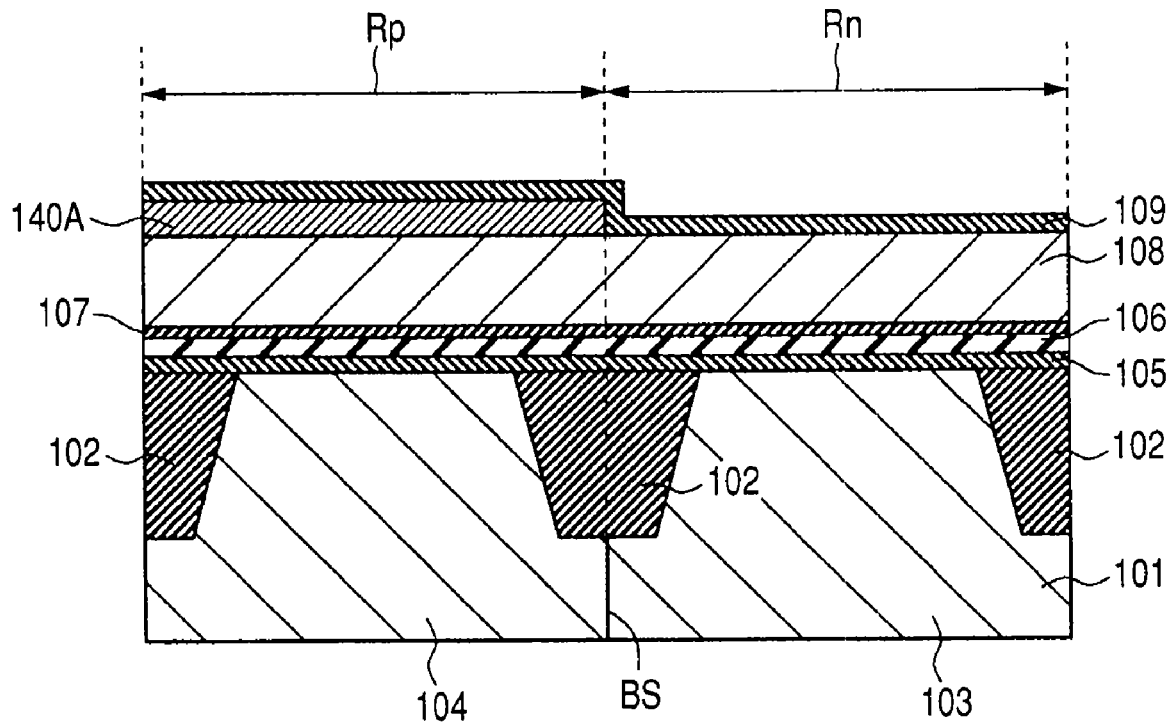
FIG. 43 is a cross-sectional view illustrating the state of each manufacturing step in the manufacturing method of the semiconductor device according to the ninth embodiment of the invention.

FIG. 43 is a cross-sectional view illustrating the state after completion of the formation of the second insulating-film cap layer 109. After removal of the diffusion preventing layer 140A in the nMOSFET region Rn, the second insulating-film cap layer 109 is formed over the gate-electrode metal film 108 in the nMOSFET region Rn and the diffusion preventing layer 140A in the pMOSFET region Rp.

Figure 44:
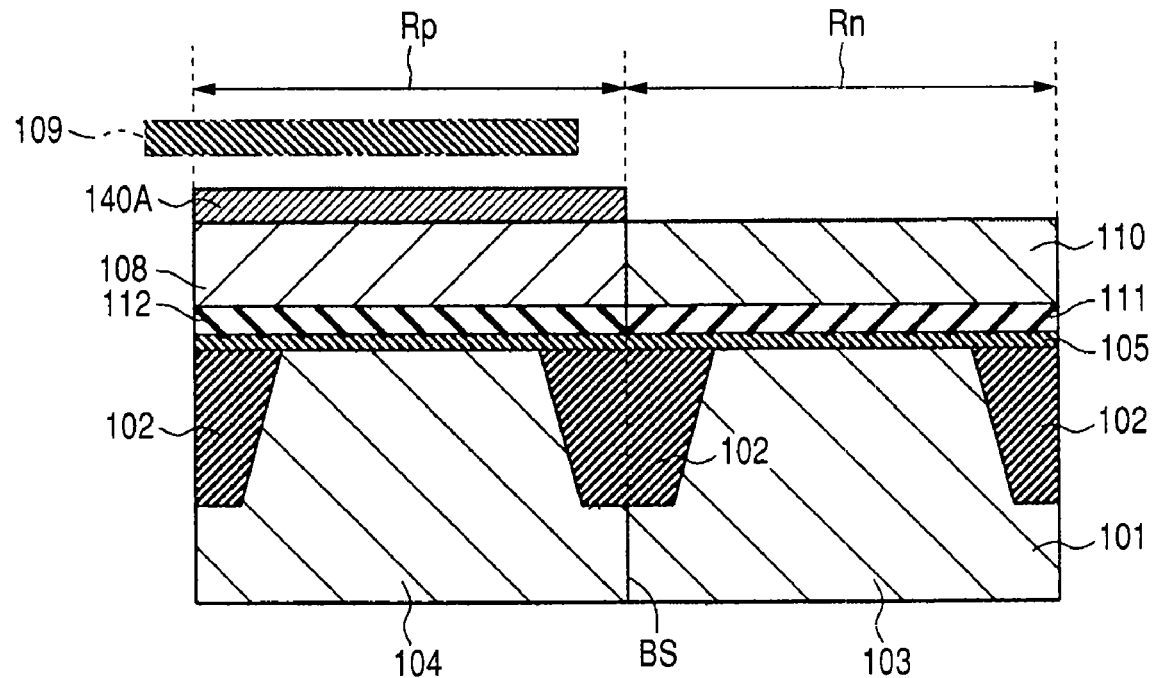
FIG. 44 is a cross-sectional view illustrating the state of each manufacturing step in the method of manufacturing a semiconductor device according to the ninth embodiment of the invention.

FIG. 44 is a cross-sectional view illustrating the state when the second insulating-film cap layer 109 is removed from the pMOSFET region Rp. After formation of the second insulating-film cap layer 109, heat treatment is performed to cause a reaction between the second insulating-film cap layer 109 and the gate-electrode metal film 108 to diffuse the material of the second insulating-film cap layer 109 into the gate-electrode metal film 108 belonging to the nMOSFET region Rn. As a result, an element-added metal layer 110 obtained by adding the material of the second insulating-film cap layer 109 to the gate-electrode metal film 108 is formed in the nMOSFET region Rn as illustrated in FIG. 44. In the present embodiment, La, which is the material of the second insulating-film cap layer 109 is diffused into the gate-electrode metal film 108 and the element metal layer 110 containing La as the element is formed.

The material of the second insulating-film cap layer 109 is diffused, as in the fifth embodiment, into the insulating layer 106 located below the second insulating-film cap layer 109, that is, the insulating layer 106 belonging to the nMOSFET region Rn. The material of the first insulating-film cap layer 107 is diffused into the insulating layer 106 located immediately below the first insulating-film cap layer 107, that is, the insulating layer 106 belonging to the nMOSFET region Rn and the pMOSFET region Rp, whereby the insulating layer 106 belonging to the nMOSFET region Rn becomes a first element-added insulating layer 111 by the addition of the materials of the first and second insulating-film cap layers 107 and 109. In the present embodiment, since the insulating layer 106 is a HfSiON layer, a HfSiON layer containing Al and La, the materials of the first insulating-film cap layer 107 and the second insulating-film cap layer 109, respectively, are formed as the first element-added insulating layer 111.

In the pMOSFET region Rp, on the other hand, no reaction occurs between the material of the second insulating-film cap layer 109 and the diffusion preventing layer 140A so that the material of the second insulating-film cap layer 109 is not diffused into the diffusion preventing layer 140A belonging to the pMOSFET region Rp. As a result, the material of the second insulating-film cap layer 109 is not diffused into the gate-electrode metal film 108 in the pMOSFET region Rp. In the pMOSFET region Rp, the diffusion preventing layer 140A and the gate-electrode metal film 108 remain as are even after heat treatment as illustrated in FIG. 44. The remaining gate-electrode metal film 108 corresponds to an electrode conductive layer. The diffusion preventing layer 140A is made of a material different from that of the gate-electrode metal film 108 and corresponds to an upper conductive layer.

The insulating layer 106 belonging to the pMOSFET region Rp becomes, as in the fifth embodiment, a second element-added insulating layer 112 by the addition of the material of the first insulating-film cap layer 107. In the present embodiment, the insulating layer 106 is a HfSiON layer so that a HfSiON layer containing Al which is the material of the first insulating-film cap layer 107 is formed as the second element-added insulating layer 112.

In the present embodiment, as in the fifth embodiment, the first and second insulating-film cap layers 107 and 109 are formed of materials added in an amount to be diffused so that the first insulating-film cap layer 107 disappears by heat treatment. The second insulating-film cap layer 109 also disappears from the nMOSFET region Rn. In the pMOSFET region Rp, on the other hand, the second insulating-film cap layer 109 is formed over the diffusion preventing layer 140A and in the present embodiment, the diffusion preventing layer 140A is designed to prevent the diffusion of the material of the second insulating-film cap layer 109. In the pMOSFET region Rp, therefore, the second insulating-film cap layer 109 remains. After formation of the element-added metal layer 110, and the first and second element-added insulating layers 111 and 112, the second insulating-film cap layer 109 in the pMOSFET region Rp is removed by wet etching.

Figure 45:
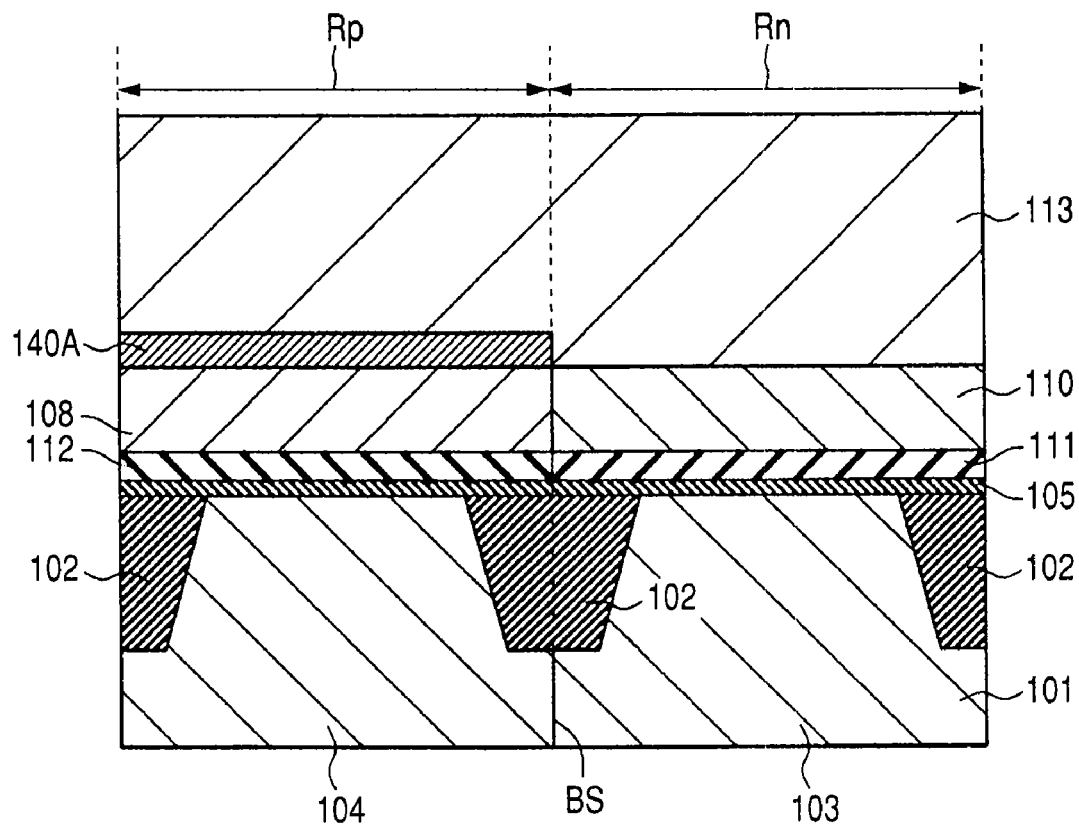
FIG. 45 is a cross-sectional view illustrating the state of each manufacturing step in the method of manufacturing a semiconductor device according to the ninth embodiment of the invention.

FIG. 45 is a cross-sectional view illustrating the state after completion of the formation of a poly-Si layer 113 over the diffusion preventing layer 140A and the element-added metal layer 110. After removal of the second insulating-film cap layer 109 from the pMOSFET region Rp, a poly-Si layer 113 is deposited to give a thickness within a range of from 30 to 120 nm over the diffusion preventing layer 140A and the element-added metal layer 110 as illustrated in FIG. 45. In the present embodiment, as in the fifth embodiment, a heat treatment step is performed preferably prior to the formation of the poly-Si layer 113.

Figure 46:
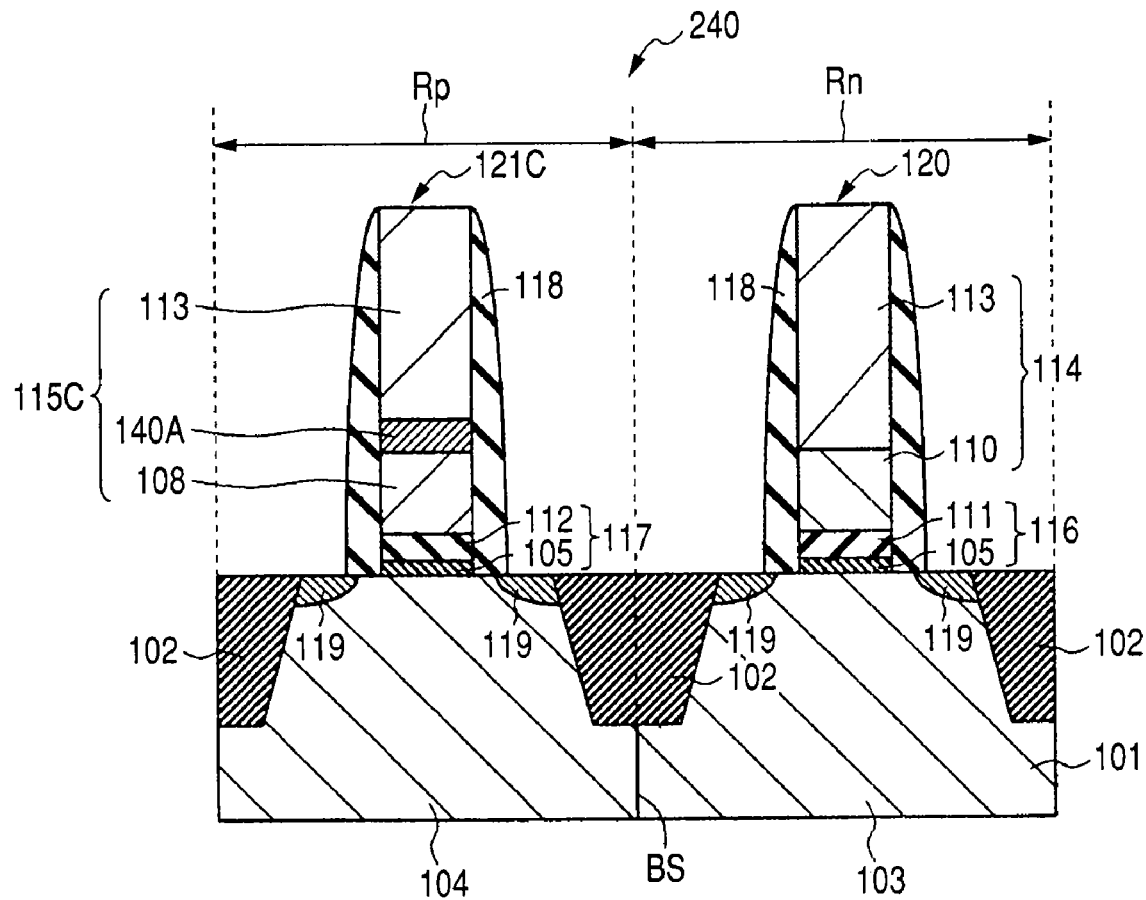
FIG. 46 is a cross-sectional view illustrating the state of each manufacturing step in the method of manufacturing a semiconductor device according to the ninth embodiment of the invention.

FIG. 46 is a cross-sectional view illustrating the state after completion of the formation of the CMOSFET 240. After formation of the poly-Si layer 113 in FIG. 45, dry etching is performed as in the fifth embodiment to form each gate electrode of the nMOSFET 120 and pMOSFET 121C. Described specifically, in order to leave a portion of the gate electrode and layers therebelow, the poly-Si layer 113, the element-added metal layer 110, the diffusion preventing layer 140A, and the gate-electrode metal film 108 which will be a gate electrode, and the first element-added insulating layer 111, the second element-added insulating layer 112, and the interface layer 105 which will be layers below the gate electrode are etched.

In the present embodiment, the nMOSFET 120 has, as in the fifth embodiment illustrated in FIG. 28, a gate stack structure having the poly-Si layer 113, the element-added metal layer 110, the first element-added insulating layer 111, the interface layer 105, and the p well 103.

A p-side gate electrode 115C of the pMOSFET 121C is composed of the poly-Si layer 113, the diffusion preventing layer 140A, and the gate-electrode metal film 108 and the p-side gate insulating film 117 is, as in the fifth embodiment illustrated in FIG. 28, composed of the interface layer 105 and the second element-added insulating layer 112. Accordingly, the pMOSFET 121C has a gate stack structure having the poly-Si layer 113, the diffusion preventing layer 140A, the gate-electrode metal film 108, the second element-added insulating layer 112, the interface layer 105, and the n well 104.

After formation of the n-side gate electrode 114 and the p-side gate electrode 115C, the conventional process flows for CMOSFET formation are conducted successively as in the fifth embodiment to form the nMOSFET 120 and the pMOSFET 121C, thereby forming the CMOSFET 240. Described specifically, in the nMOSFET region Rn, a sidewall spacer 118 made of, for example, $SiO_2$ is formed over both of the side walls of each of the n-side gate electrode 114 and the n-side gate insulating film 116. In the pMOSFET region Rp, a sidewall spacer 118 made of, for example, $SiO_2$ is formed over both of the side walls of each of the p-side gate electrode 115C and the p-side gate insulating film 117. Then, ion implantation is performed to form a source/drain region 119, thereby forming the CMOSFET 240.

In the CMOSFET 240 of the present embodiment formed in such a manner, the effective work function of the n-side gate electrode 114 of the nMOSFET 120 is from 4.0 eV to 4.3 eV, while the effective work function of the p-side gate electrode 115C of the pMOSFET 121C is from 4.9 eV to 5.2 eV. The effective work function of the gate electrode can be determined from a flat band voltage deducted from the C-V characteristics, that is, capacitance-gate voltage characteristics of a MOS type capacitor in the nMOSFET 120 and the pMOSFET 121C.

In the present embodiment, the diffusion preventing layer 140A is designed to prevent diffusion of the material of the second insulating-film cap layer 109. When the second insulating-film cap layer 109 is made of a rare earth material such as La oxide as in the present embodiment, it is difficult to form the second insulating-film cap layer 109 having a deliquescent property in one of the nMOSFET region Rn and the pMOSFET region Rp by the method of forming it over both of these regions and then removing it from the region on one side.

In the present embodiment, by forming the diffusion preventing layer 140A, the diffusion of the material of the second insulating-film cap layer 109 in the pMOSFET region Rp can be prevented without removing the second insulating-film cap layer 109 from the pMOSFET region Rp. A step of removing the second insulating-film cap layer 109 from one of the regions can be omitted and therefore the production flow can be simplified. In addition, deterioration of the second insulating-film cap layer 109 does not occur because of the omission of the removing step from one of the regions so that during heat treatment conducted subsequent to the diffusion, the material of the second insulating-film cap layer 109 can be diffused more completely into the gate-electrode metal film 108 and the insulating layer 106 in the nMOSFET region Rn. This makes it possible to control the threshold voltage of the nMOSFET 120 to bring it close to a desired value.

In the nMOSFET 120 of the present embodiment thus formed, the first element-added insulating layer 111 contains Al and La, the first element and the second element, respectively, and the gate-electrode metal film 108 of the nMOSFET region Rn over the first element-added insulating layer 111 contains La, the second element. The pMOSFET 121C, on the other hand, contains Al, the first element, in the second element-added insulating layer 112 and is equipped with the gate-electrode metal film 108 free of Al and La, the first element and the second element, respectively, over the second element-added insulating layer 112. The gate-electrode metal film 108 has, thereover, the diffusion preventing layer 140A made of a material different from that of the gate-electrode metal film 108.

Such a structure enables to achieve the nMOSFET 120 and the pMOSFET 121C equipped with the gate electrodes 114 and 115C having an effective work function suited therefor, respectively. Described specifically, the effective work function of the n-side gate electrode 114 in the nMOSFET 120 can be adjusted to from 4.0 eV to 4.3 eV, while the effective work function of the p-side gate electrode 115C in the pMOSFET 121C can be adjusted to from 4.9 eV to 5.2 eV. Accordingly, the nMOSFET 120 and the pMOSFET 121C having threshold voltages suited thereto, respectively, can be achieved.

The first and second element-added insulating layers 111 and 112 can be formed without etching over the gate-insulating-film insulating layer 106 which will be the first and second element-added insulating layers 111 and 112 so that deterioration in the manufacturing procedure can be prevented and reduction in the reliability can be prevented. As a result, the semiconductor device 240 which is equipped with the nMOSFET 120 and the pMOSFET 121C having desired properties, respectively, and at the same time is highly reliable can therefore be achieved.

Tenth Embodiment

Figure 47:
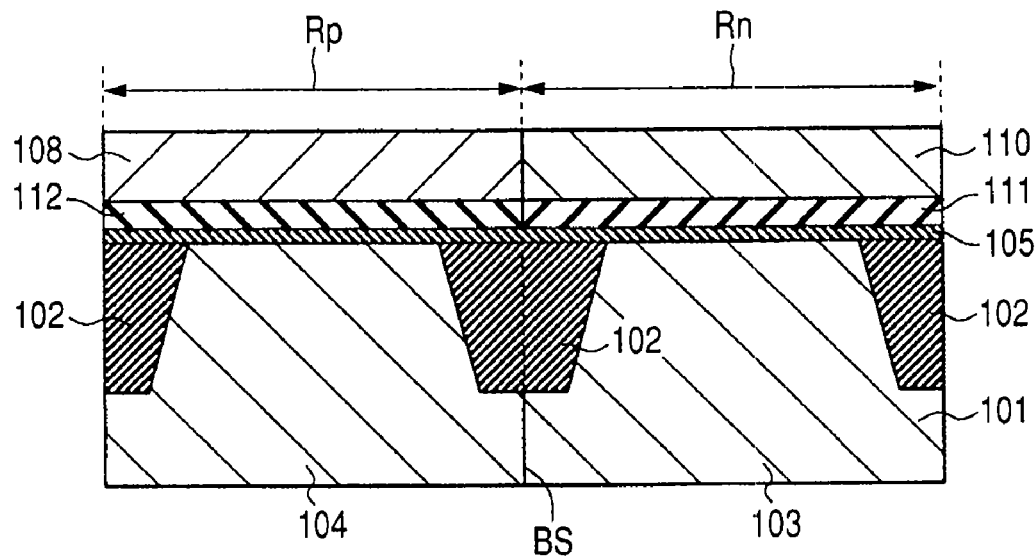
FIG. 47 is a cross-sectional view illustrating the state of each manufacturing step in a method of manufacturing a semiconductor device according to a tenth embodiment of the invention.
Figure 48:
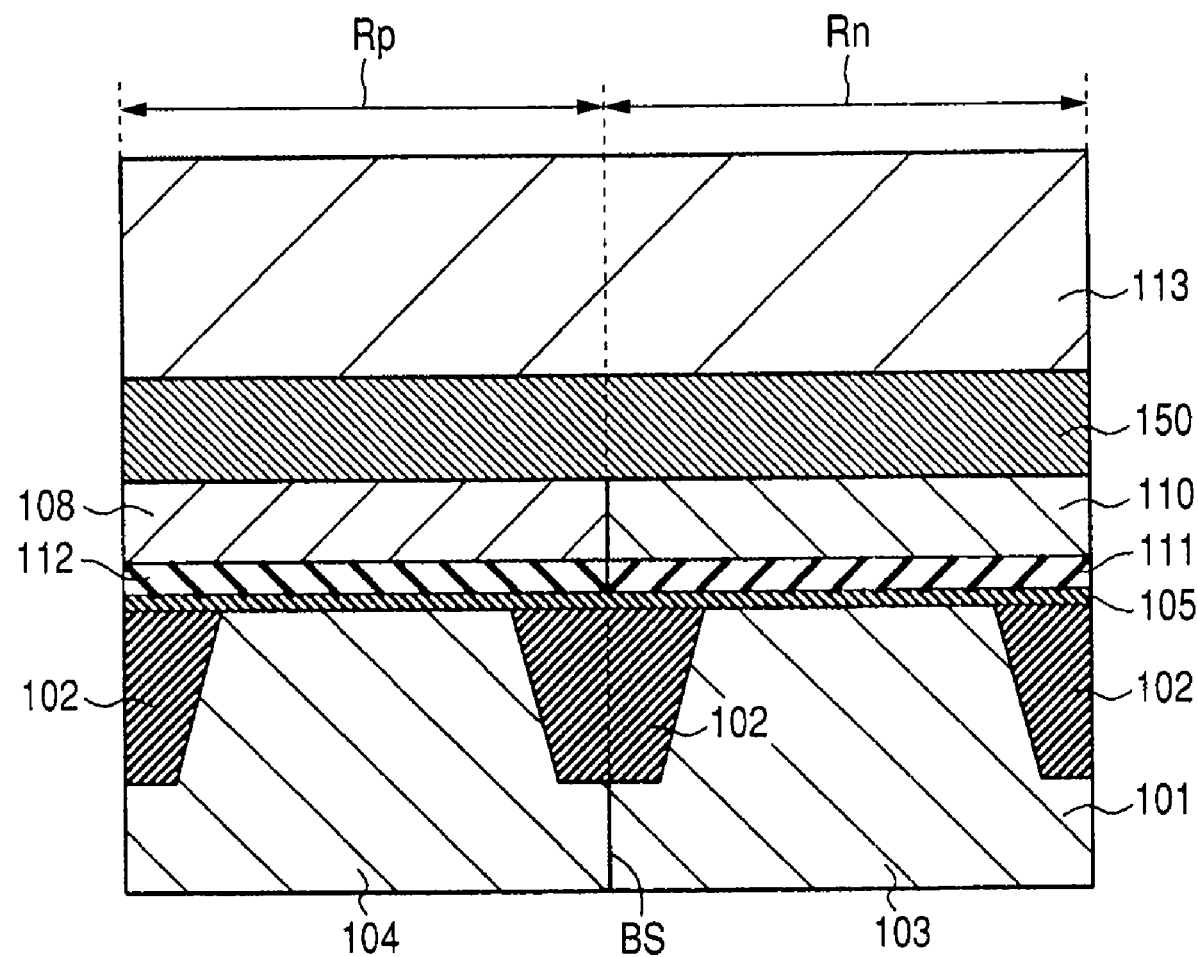
FIG. 48 is a cross-sectional view illustrating the state of each manufacturing step in the method of manufacturing a semiconductor device according to the tenth embodiment of the invention.
Figure 49:
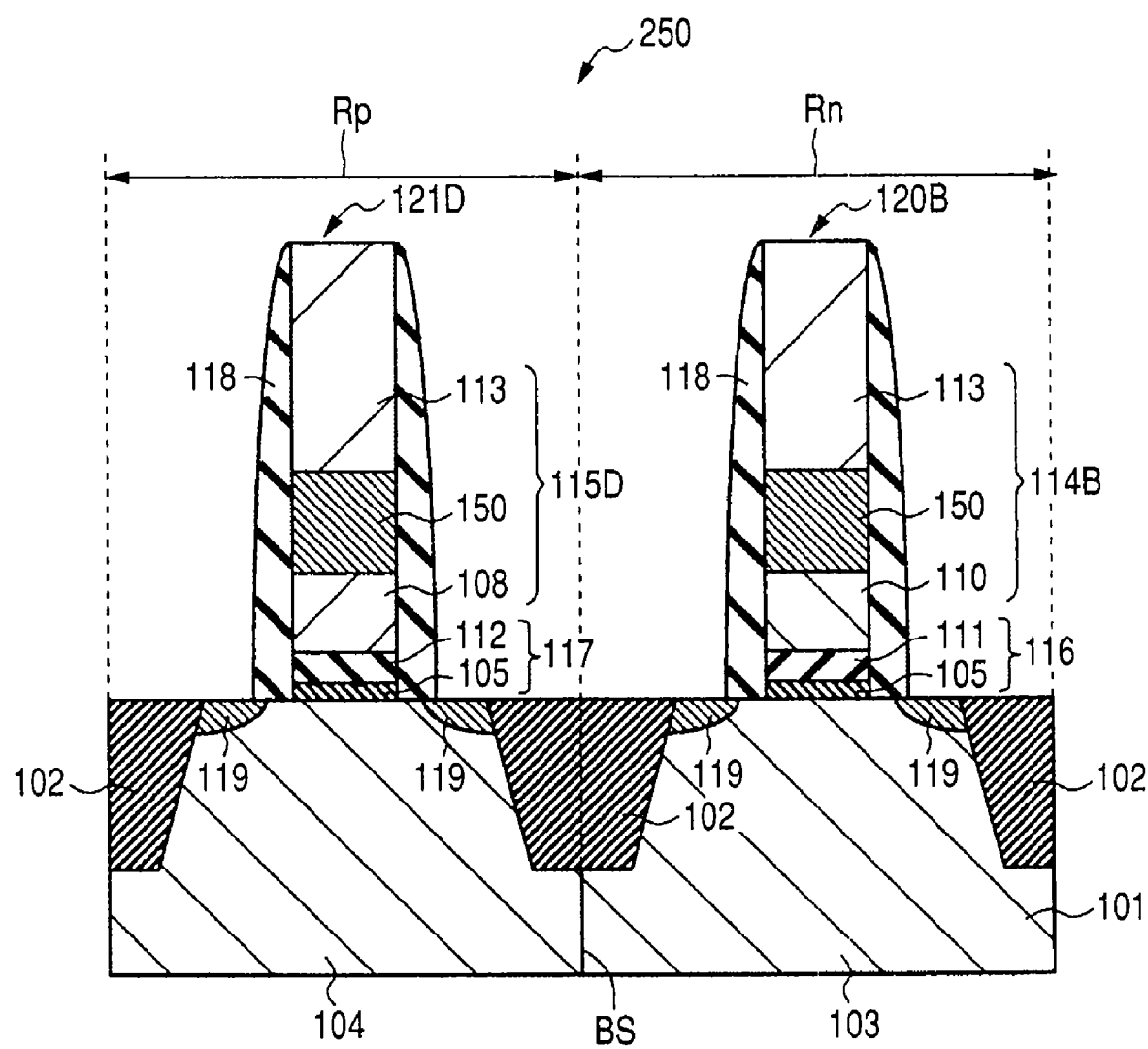
FIG. 49 is a cross-sectional view illustrating the state of each manufacturing step in the method of manufacturing a semiconductor device according to the tenth embodiment of the invention.

A method of manufacturing a semiconductor device according to a tenth embodiment of the invention will next be described. FIGS. 47 to 49 are cross-sectional views illustrating each manufacturing step in the method of manufacturing a semiconductor device according to the tenth embodiment of the invention. In this embodiment, as in the fifth embodiment, a CMOSFET 250 is manufactured as the semiconductor device. FIGS. 47 to 49 omit therefrom the p type semiconductor layer 2 illustrated above in FIGS. 1 to 25 to facilitate understanding.

FIG. 47 is a cross-sectional view illustrating the state after completion of heat treatment. First, as in the fifth embodiment, after formation of an element isolation film 102, a p well 103, and a p well 104 in a Si substrate 101 and successive formation of an interface layer 105, an insulating layer 106, a first insulating-film cap layer 107, a gate-electrode metal film 108, and a second insulating-film cap layer 109 over the Si substrate 101, heat treatment is performed. As a result, in the nMOSFET region Rn, an element contained in the second insulating-film cap layer 109 is added to the gate-electrode metal film 108 to form a element-added metal layer 110 and at the same time, an element contained in the first insulating-film cap layer 107 and another element contained in the second insulating-film cap layer 109 are added to the insulating layer 106 to form a first element-added insulating layer 111, as illustrated in FIG. 47. In the pMOSFET region Rp, the element contained in the first insulating-film cap layer 107 is added to the insulating layer 106 to form a second element-added insulating layer 112.

FIG. 48 is a cross-sectional view illustrating the state after completion of the formation of a second gate-electrode metal film 150 and a poly-Si layer 113 over the gate-electrode metal film 108 and the element-added metal layer 110. In the present embodiment, after heat treatment but prior to the formation of the poly-Si layer 113, a second gate-electrode metal film 150 is deposited over the gate-electrode metal film 108 and the element-added metal layer 110. The second gate-electrode metal film 150 corresponds to a second metal film and corresponds to the second gate-electrode metal film N in the fourth embodiment. The thickness of the second gate-electrode metal film 150 is preferably 3 nm or greater but not greater than 20 nm.

The second gate-electrode metal film 150 is made of a conductive material. The material of the second gate-electrode metal film 150 may be the same or different from that of the gate-electrode metal film 108. In the present embodiment, the second gate-electrode metal film 150 and the gate-electrode metal film 108 are made of the same material, more specifically, TiN. The conductive material configuring the second gate-electrode metal film 150 is not limited to TiN and conductive materials similar to those configuring the gate-electrode metal film 108 are usable. After formation of the second gate-electrode metal film 150, a poly-Si layer 113 is deposited over the second gate-electrode metal film 150 to give a thickness within a range of from 30 to 120 nm.

FIG. 49 is a cross-sectional view illustrating the state after completion of the formation of the CMOSFET 250. After formation of the poly-Si layer 113 in FIG. 48, dry etching or the like is conducted, as in the fifth embodiment, to form each gate electrode of the nMOSFET 120B and pMOSFET 121D. Described specifically, in order to leave a portion of the gate electrode and layers therebelow, the poly-Si layer 113, the second gate-electrode metal film 150, the element-added metal layer 110 and the gate-electrode metal film 108 which will be the gate electrode, and the first element-added insulating layer 111, the second element-added insulating layer 112 and the interface layer 105 therebelow are etched.

In the present embodiment, an n-side gate electrode 114B of the nMOSFET 120B is composed of the poly-Si layer 113, the second gate-electrode metal film 150, and the element-added metal layer 110, while the n-side gate insulating film 116 is, as in the fifth embodiment illustrated in FIG. 28, made of the interface layer 105 and the first element-added insulating layer 111. Accordingly, the nMOSFET 120B has a gate stack structure composed of the poly-Si layer 113, the second gate-electrode metal film 150, the element-added metal layer 110, the first element-added insulating layer 111, the interface layer 105, and the p well 103.

In the pMOSFET 121D, a p-side gate electrode 115 is composed of the poly-Si layer 113, the second gate-electrode metal film 150, and the gate-electrode metal film 108, while the p-side gate insulating film 117 is, as in the fifth embodiment illustrated in FIG. 28, composed of the interface layer 105 and the second element-added insulating layer 112. Accordingly, the pMOSFET 121D has a gate stack structure composed of the poly-Si layer 113, the second gate-electrode metal film 150, the gate-electrode metal film 108, the second element-added insulating layer 112, the interface layer 105, and the n well 104.

After formation of the n-side gate electrode 114B and the p-side gate electrode 115D, the conventional process flows for CMOSFET formation are conducted successively to form the nMOSFET 120B and the pMOSFET 121D, thereby forming the CMOSFET 250.

In the CMOSFET 250 of the present embodiment thus formed, the effective work function of the n-side gate electrode 114B of the nMOSFET 120B is from 4.0 eV to 4.3 eV and the effective work function of the p-side gate electrode 115D of the pMOSFET 121D is from 4.9 eV to 5.2 eV. The effective work function of the gate electrode can be determined from a flat band voltage deducted from the C-V characteristics, that is, the capacitance-gate electrode characteristics of a MOS type capacitor in the nMOSFET 120B and the pMOSFET 121D thus obtained.

According to the present embodiment, as described above, the second gate-electrode metal film 150 is formed over the gate-electrode metal film 108 and the element-added metal layer 110 prior to the formation of the poly-Si layer 113. Then, the poly-Si layer 113 is formed over the second gate-electrode metal film 150. In other words, the second gate-electrode metal film 150 is disposed between the gate-electrode metal film 108 and the poly-Si layer 113 and between the element-added metal layer 110 and the poly-Si layer 113 in the present embodiment.

When the gate-electrode metal film 108 and the element-added metal layer 110 are each as thin as 10 nm or less, stacking of the poly-Si layer 113 may cause reduction in the effective work function of the gate electrodes 114B and 115D.

As in the present embodiment, by inserting the second gate-electrode metal film 150 between the gate-electrode metal film 108 and the poly-Si layer 113 and between the element-added metal layer 110 and the poly-Si layer 113, the adverse effect caused by stacking of the poly-Si layer can be suppressed and reduction in the effective work function of the gate electrodes 114B and 115D can be prevented even if the gate-electrode metal film 108 and the element-added metal layer 110 are thin.

Thus, in the present embodiment, the nMOSFET 120B and the pMOSFET 121D equipped with the gate electrodes 114B and 115D having the effective work functions suited thereto, respectively, can be achieved. Described specifically, the effective work function of the n-side gate electrode 114B in the nMOSFET 120B can be adjusted to from 4.0 eV to 4.3 eV, while the effective work function of the p-side gate electrode 115D in the pMOSFET 121D can be adjusted to from 4.9 eV to 5.2 eV. Accordingly, the nMOSFET 120B and the pMOSFET 121D having threshold voltages suited thereto, respectively, can be achieved.

When the second gate-electrode metal film 150 is formed as in the present embodiment, heat treatment for thermally diffusing the elements contained in the first and second insulating-film cap layers 107 and 109 is preferably performed prior to the formation of the second gate-electrode metal film 150 and the poly-Si layer 113 as in the present embodiment. When the second gate-electrode metal film 150 or both the second gate electrode metal film and the poly-Si layer 113 are formed prior to the heat treatment as in the formation of the poly-Si layer 113 prior to heat treatment in the fifth embodiment, the material of the second insulating-film cap layer 109 may be diffused extremely into the second gate-electrode metal film 150 and the poly-Si layer 113 and not diffused into the gate-electrode metal film 108, though it depends on the material of the second insulating-film cap layer 109. It is therefore preferred to carry out the heat treatment step prior to the formation of the second gate-electrode metal film 150 and the poly-Si layer 113, as in the present embodiment.

In the present embodiment, as described above, the second gate-electrode metal film 150 is formed prior to the formation, as in the fifth embodiment, of the poly-Si layer 113. In the sixth to ninth embodiments, as in the present embodiment, the second gate-electrode metal film 150 may be formed prior to the formation of the poly-Si layer 113. More specifically, in the sixth embodiment, after formation of the second gate-electrode metal film 150 over the gate-electrode metal film 108 and the element-added protective layer 131, the poly-Si layer 113 may be formed over the second gate-electrode metal film 150.

In the seventh embodiment, after formation of the second gate-electrode metal film 150 over the element-added metal layer 110 and the another element-added metal layer 141, the poly-Si layer 113 may be formed over the second gate-electrode metal film 150.

In the eighth embodiment, after formation of the second gate-electrode metal film 150 over the element-added metal layer 110 in the nMOSFET region Rn and the pMOSFET region Rp, the poly-Si layer 113 may be formed over the second gate-electrode metal film 150.

In the ninth embodiment, after formation of the second gate-electrode metal film 150 over the diffusion preventing layer 140A and the element-added metal layer 110, the poly-Si layer 113 may be formed over the second gate-electrode metal film 150.

In the first to fourth embodiments, as in the fifth to tenth embodiments, an interface layer made of an insulating material may be formed over the entire surface of the Si 1 from the surface side on which the element isolation insulating film 5, the p well 3 and the n well 4 have been formed.

In the fifth to tenth embodiments, as in the third embodiment, before or after diffusion of the second insulating-film cap layer 109 functioning as a first cap layer, a second cap layer may be formed to diffuse it into the gate-electrode metal films 108 and 108A.

In each of the above-described embodiments, the first conductivity type is designated as n type, while the second conductivity type is designated as p type. It is also possible to designate the first conductivity type as p type and the second conductivity type as n type.

The invention claimed is:

1. A method of manufacturing a semiconductor device comprising a first conductivity type semiconductor element and a second conductivity type semiconductor element different from each other in conductivity type and aligned with each other, comprising the steps of:

forming, in a semiconductor substrate, an element isolation film for isolating a first conductivity type element region in which the first conductivity type semiconductor element is to be formed from a second conductivity type element region in which the second conductivity type semiconductor element is to be formed;

forming a first metal film over the surface of a gate insulating film placed over the main surface of the semiconductor substrate;

forming a first cap layer containing a material different from that of the first metal film, over the upper surface of the first metal film formed in the first conductivity type element region;

carrying out first heat treatment to cause a reaction between the first cap layer and the first metal film in the first conductivity type element region;

forming a dual gate electrode structure different in composition between the first conductivity type element region and the second conductivity type element region, and wherein the first metal film contains any of first materials containing at least one element selected from the group comprised of titanium (Ti), tantalum (Ta), hafnium (Hf), nitrides of the first materials, carbides of the first materials, silicides of the first materials, nitride silicides of the first materials, and carbonitrides of the first materials, the first cap layer contains any of second materials containing at least one element selected from the group comprised of hafnium (Hf), tantalum (Ta), lanthanum (La), magnesium (Mg), ytterbium (Yb), oxides of the second materials, nitrides of the second materials, carbides of the second materials, silicides of the second materials, nitride silicides of the second materials, and carbonitrides of the second materials.

2. The method of manufacturing a semiconductor device according to claim 1, further comprising, after the reaction step of the first cap layer, the steps of:
forming a second cap layer containing a material different from that of the first metal film and the first cap layer, over the upper surface of the first metal film formed in the second conductivity element region; and
carrying out second heat treatment to cause a reaction between the second cap layer and the first metal film in the second conductivity type element region.

3. The method of manufacturing a semiconductor device according to claim 1,
wherein the first cap layer formation step comprises the steps of:
forming the first cap layer; and
forming a second cap layer containing a material different from that of the first metal film and the first cap layer, over the upper surface of the first metal film formed in the second conductivity type element region, and
wherein the reaction step is a step of diffusing the first cap layer into the first metal film located below the first cap layer by the first heat treatment and at the same time diffusing the second cap layer into the first metal film located below the second cap layer.

4. The method of manufacturing a semiconductor device according to claim 1, further comprising a step of:
forming a second metal film over the upper surface of a metal film formed by a reaction between the first metal film and the first cap layer as a result of the reaction of the first cap layer and over the upper surface of the first metal film remaining in the second conductivity type element region after the reaction step of the first cap layer, wherein the formation of the second metal film is followed by the formation step of the dual gate electrode structure.

5. The method of manufacturing a semiconductor device according to claim 1, further comprising, between the first cap layer formation step and the reaction step, a step of:
forming, over the upper surface of the first metal film, a second metal film for covering therewith the first cap layer.

6. The method of manufacturing a semiconductor device according to claim 2 or 3, further comprising a step of:
forming a second metal film over the upper surface of a metal film formed by the reaction between the first metal film and the first cap layer as a result of the reaction of the first cap layer and over the upper surface of another metal film formed by the reaction between the first metal film and the second cap layer as a result of the reaction of the second cap layer,
wherein the formation of the second metal film is followed by the formation step of the dual gate electrode structure.

7. The method of manufacturing a semiconductor device according to claim 3, further comprising, between the first cap layer formation step and the reaction step, a step of:
forming a second metal film over the upper surface of the first cap layer and the upper surface of the second cap layer.

8. The method of manufacturing a semiconductor device according to claim wherein the first conductivity type semiconductor element is a p type MOS transistor, and wherein the first cap layer contains any of third materials containing at least one element selected from the group comprised of platinum (Pt), iridium (Ir), nickel (Ni), aluminum (Al) and ruthenium (Ru), oxides of the third materials, nitrides of the third materials, carbides of the third materials, silicides of the third materials, nitride silicides of the third materials, and carbonitrides of the third materials.

9. The method of manufacturing a semiconductor device according to claim 2,
wherein the first conductivity type semiconductor element is an n type MOS transistor,
wherein the second conductivity type semiconductor element is a p type MOS transistor,
wherein the second cap layer contains any of third materials containing at least one element selected from the group comprised of platinum (Pt), iridium (Ir), nickel (Ni), aluminum (Al) and ruthenium (Ru), oxides of the third materials, nitrides of the third materials, carbides of the third materials, silicides of the third materials, nitride silicides of the third materials, and carbonitrides of the third materials.

10. The method of manufacturing a semiconductor device according to claim 4, wherein the second metal film contains a material similar to that of the first metal film and contains any of fourth materials containing at least one element selected from titanium (Ti), tantalum (Ta), hafnium (Hf), and tungsten (W), nitrides of the fourth materials, carbides of the fourth materials, silicides of the fourth materials, nitride silicides of the fourth materials, and carbonitrides of the fourth materials.

11. A method of manufacturing a semiconductor device comprising a first conductivity type semiconductor element and a second conductivity type semiconductor element different from each other in conductivity type and aligned with each other, comprising the steps of:
forming an insulating layer containing an insulating material over a semiconductor substrate in a first conductivity type element region in which the first conductivity type semiconductor element is to be formed and a second conductivity type element region in which the second conductivity type semiconductor element is to be formed;
forming a first cap layer containing a first element between the semiconductor substrate and the insulating layer in the first conductivity type element region and the second conductivity type element region or over the insulating layer in the first conductivity type element region and the second conductivity type element region;
forming an electrode conductive layer containing a conductive material over the first cap layer in the first conductivity type element region and the second conductivity type element region;
forming a second cap layer containing a second element different from the first element over the electrode conductive layer in the first conductivity type element region;
heat treating the insulating layer and the electrode conductive layer together with the first cap layer and the second cap layer, and
wherein the conductive material is any of first materials containing at least one element selected from the group comprised of titanium (Ti), tantalum (Ta), hafnium (Hf), nitrides of the first materials, carbides of the first materials, silicides of the first materials, nitride silicides of the first materials, and carbonitrides of the first materials.

12. The method of manufacturing a semiconductor device according to claim 11, further comprising between the step of forming the second cap layer and the heat treatment step, a step of:
forming, over the second cap layer, a protective layer for protecting therewith the second cap layer.

13. A method of manufacturing a semiconductor device comprising a first conductivity type semiconductor element and a second conductivity type semiconductor element different from each other in conductivity type and aligned with each other, comprising the steps of:
forming an insulating layer containing an insulating material over a semiconductor substrate in a first conductivity type element region in which the first conductivity type semiconductor element is to be formed and a second conductivity type element region in which the second conductivity type semiconductor element is to be formed;
forming a first cap layer containing a first element between the semiconductor substrate and the insulating layer in the first conductivity type element region and the second conductivity type element region or over the insulating layer in the first conductivity type element region and the second conductivity type element region;
forming an electrode conductive layer containing a conductive material over the first cap layer in the first conductivity type element region and the second conductivity type element region;
forming, over the electrode conductive layer in the second conductivity type element region, a diffusion preventing layer for suppressing or preventing diffusion of a second element different from the first element;
forming a second cap layer containing the second element over the diffusion preventing layer and the electrode conductive layer in the first conductivity type element region;
heat treating the insulating layer, the electrode conductive layer, and the diffusion preventing layer together with the first cap layer and the second cap layer, and
wherein the conductive material is any of first materials containing at least one element selected from the group comprised of titanium (Ti), tantalum (Ta), hafnium (Hf), nitrides of the first materials, carbides of the first materials, silicides of the first materials, nitride silicides of the first materials, and carbonitrides of the first materials.

14. The method of manufacturing a semiconductor device according to claim 13,
wherein in the step of forming the diffusion preventing layer, the diffusion preventing layer is formed to prevent diffusion of the second element, and
wherein the method further comprises, after the heat treatment step, a step of removing the second cap layer formed over the diffusion preventing layer.

15. A method of manufacturing a semiconductor device having a first conductivity type semiconductor element and a second conductivity type semiconductor element different from each other in conductivity type and aligned with each other, comprising the steps of:
forming an insulating layer containing an insulating material over a semiconductor substrate in a first conductivity type element region in which the first conductivity type semiconductor element is to be formed and a second conductivity type element region in which the second conductivity type semiconductor element is to be formed;
forming a first cap layer containing a first element between the semiconductor substrate and the insulating layer in the first conductivity type element region and the second conductivity type element region or over the insulating layer in the first conductivity type element region and the second conductivity type element region;
forming an electrode conductive layer containing a conductive material over the first cap layer in the first conductivity type element region and the second conductivity type element region to give a thickness of the electrode conductive layer in the second conductivity type element region greater than a thickness of the electrode conductive layer in the first conductivity type element region;
forming a second cap layer containing a second element different from the first element over the electrode conductive layer in the first conductivity type element region and the second conductivity type element region;
heat treating the insulating layer and the electrode conductive layer together with the first cap layer and the second cap layer, and
wherein the conductive material is any of first materials containing at least one element selected from the group comprised of titanium (Ti), tantalum (Ta), hafnium (Hf), nitrides of the first materials, carbides of the first materials, silicides of the first materials, nitride silicides of the first materials, and carbonitrides of the first materials.

16. The method of manufacturing a semiconductor device according to claim 11,
wherein the first conductivity type semiconductor element is an n type MOS transistor,
wherein the second conductivity type semiconductor element is a p type MOS transistor, and
wherein the first element is aluminum (Al).

17. The method of manufacturing a semiconductor device according to claim 11,
wherein the first conductivity type semiconductor element is an n type MOS transistor,
wherein the second conductivity type semiconductor element is a p type MOS transistor, and
wherein the second element is at least one of Group II elements and Group III elements in the periodic table.

18. The method of manufacturing a semiconductor device according to claim 11, further comprising, between the step of forming the second cap layer and the heat treatment step or after the heat treatment step, a step of:
forming a polycrystalline silicon layer over the electrode conductive layer in the first conductivity type element region and the second conductivity type element region.

19. The method of manufacturing a semiconductor device according to claim 11, wherein the first cap layer has a thickness of 0.1 nm or greater but not greater than 2 nm.

20. The method of manufacturing a semiconductor device according to claim 11, wherein the second cap layer has a thickness of 0.1 nm or greater but not greater than 10 nm.

* * * * *